US009509978B2

(12) United States Patent
Ishiga

(10) Patent No.: US 9,509,978 B2
(45) Date of Patent: Nov. 29, 2016

(54) IMAGE PROCESSING METHOD, IMAGE PROCESSING APPARATUS, IMAGE-CAPTURING APPARATUS, AND IMAGE PROCESSING PROGRAM

(71) Applicant: NIKON CORPORATION, Chiyoda-ku, Tokyo (JP)

(72) Inventor: Kenichi Ishiga, Yokohama (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 14/618,247

(22) Filed: Feb. 10, 2015

(65) Prior Publication Data

US 2015/0264333 A1 Sep. 17, 2015

Related U.S. Application Data

(63) Continuation of application No. PCT/JP2013/004798, filed on Aug. 8, 2013.

(30) Foreign Application Priority Data

Aug. 10, 2012 (JP) ................................ 2012-179038

(51) Int. Cl.
*G06K 9/00* (2006.01)
*H04N 13/02* (2006.01)
(Continued)

(52) U.S. Cl.
CPC .......... *H04N 13/0217* (2013.01); *G03B 35/08* (2013.01); *G06T 7/0028* (2013.01); (Continued)

(58) Field of Classification Search
CPC ..................... H04N 13/0217; H04N 13/0018; H04N 13/0239; H04N 13/0022; H04N 13/0225; H04N 13/0207; H04N 13/025; H04N 13/0007; H04N 13/0003; H04N 13/0025; H04N 13/0029; H04N 13/0282; H04N 13/0011; H04N 13/0014; H04N 13/0221; G06T 7/0028; G06T 2207/10028
USPC .......................................................... 382/154
See application file for complete search history.

(56) References Cited

U.S. PATENT DOCUMENTS 6,836,572 B2 12/2004 Ishiga et al.
7,236,628 B2 6/2007 Chen et al.
(Continued)

FOREIGN PATENT DOCUMENTS

JP 2001-177731 A 6/2001
JP 2001-186366 A 7/2001
(Continued)

OTHER PUBLICATIONS

English Translation of Written Opinion and International Preliminary Report on Patentability for PCT/JP2013/004798, dated Feb. 19, 2015, 6 pages.

*Primary Examiner* — Ali Bayat
(74) *Attorney, Agent, or Firm* — Foley & Lardner LLP

(57) ABSTRACT

The present invention includes the steps of: generating a temporary left parallax image using the pixel value of the left parallax pixels of the first image for each pixel; generating a temporary right parallax image using the pixel value of the right parallax pixels of the first image for each pixel; generating a standard view point image using the pixel values of at least the non-parallax pixels of the first image for each pixel; generating an edge enhanced standard view point image, by carrying out an edge enhancement process on the standard view point image; and generating a left direction view point image and a right direction view point image based on the edge enhanced standard view point image and the temporary left parallax image and the temporary right parallax image for each pixel.

17 Claims, 19 Drawing Sheets

(51) Int. Cl.

| | |
|---|---|
| ***G03B 35/08*** | (2006.01) |
| ***H04N 5/225*** | (2006.01) |
| ***H04N 5/369*** | (2011.01) |
| ***H04N 9/04*** | (2006.01) |
| ***H04N 13/00*** | (2006.01) |
| ***H01L 27/146*** | (2006.01) |
| ***G06T 7/00*** | (2006.01) |

(52) U.S. Cl.

CPC ... *H01L27/14605* (2013.01); *H01L 27/14623* (2013.01); *H04N 5/2254* (2013.01); *H04N 5/3696* (2013.01); *H04N 9/045* (2013.01); *H04N 13/0007* (2013.01); *H04N 13/0289* (2013.01); *G06T 2207/10028* (2013.01)

(56) References Cited

U.S. PATENT DOCUMENTS

| | | | | |
|---|---|---|---|---|
| 7,391,903 | B2 | 6/2008 | Ishiga | |
| 7,565,007 | B2 | 7/2009 | Ishiga | |
| 7,945,111 | B2 | 5/2011 | Ishiga | |
| 7,957,588 | B2 | 6/2011 | Ishiga | |
| 8,244,034 | B2 | 8/2012 | Ishiga | |
| 8,259,213 | B2 | 9/2012 | Ishiga | |
| 8,520,059 | B2 | 8/2013 | Aoki | |
| 2001/0052971 | A1 | 12/2001 | Tsuchiya et al. | |
| 2008/0089601 | A1 | 4/2008 | Ishiga | |
| 2008/0123999 | A1 | 5/2008 | Ishiga | |
| 2010/0201853 | A1 | 8/2010 | Ishiga | |
| 2011/0122232 | A1* | 5/2011 | Hoshino | H04N 13/0029 348/47 |
| 2011/0234765 | A1* | 9/2011 | Tanaka | H04N 13/0018 348/47 |
| 2011/0234853 | A1* | 9/2011 | Hayashi | G03B 13/02 348/231.99 |
| 2011/0234881 | A1* | 9/2011 | Wakabayashi | H04N 5/2251 348/333.05 |
| 2012/0105597 | A1* | 5/2012 | Tajiri | G03B 35/02 348/49 |
| 2012/0140100 | A1 | 6/2012 | Shibazaki et al. | |
| 2012/0162393 | A1* | 6/2012 | Okegawa | H04N 5/23209 348/50 |
| 2012/0193515 | A1 | 8/2012 | Agranov et al. | |
| 2013/0010078 | A1 | 1/2013 | Aoki | |
| 2013/0113892 | A1* | 5/2013 | Nakamaru | G03B 35/18 348/47 |
| 2013/0230232 | A1* | 9/2013 | Ichikawa | H04N 13/0018 382/154 |
| 2014/0198188 | A1* | 7/2014 | Izawa | H04N 13/0022 348/49 |
| 2014/0375673 | A1 | 12/2014 | Ishiga et al. | |
| 2015/0002634 | A1 | 1/2015 | Ishiga et al. | |
| 2015/0062307 | A1 | 3/2015 | Ishiga et al. | |
| 2015/0103144 | A1 | 4/2015 | Shibazaki et al. | |

FOREIGN PATENT DOCUMENTS

| | | | |
|---|---|---|---|
| JP | 2003-007994 | A | 1/2003 |
| JP | 2006-309749 | A | 11/2006 |
| JP | 2011-259211 | A | 12/2011 |
| WO | WO 2006/006373 | A1 | 1/2006 |
| WO | WO 2006/068025 | A1 | 6/2006 |
| WO | WO 2011/118089 | A1 | 9/2011 |
| WO | WO 2012/073491 | A1 | 6/2012 |

* cited by examiner

IMAGE PROCESSING METHOD, IMAGE PROCESSING APPARATUS, IMAGE-CAPTURING APPARATUS, AND IMAGE PROCESSING PROGRAM

The Contents of the following Japanese patent applications are incorporated herein by reference:

No. 2012-179038 filed in JP on Aug. 10, 2012, and PCT/JP2013/004798 filed on Aug. 8, 2013.

TECHNICAL FIELD

The present invention relates to an image processing method, an image processing apparatus, an image-capturing apparatus, and an image processing program.

BACKGROUND ART

An image-capturing apparatus that generates with a single image-capturing a plurality of parallax images each having a parallax using a single image-capturing optical system is known.

Patent Document 1: Japanese Patent Application Publication No. 2003-7994

SUMMARY OF INVENTION

Patent Document 1 does not disclose a specific method of generating a high definition stereoscopic color image from actual captured data, when other stereoscopic image-capturing method is adopted in a single camera. Normally, when generating a 2D color image by 2D capture with a single camera, the method of interpolating colors, then carrying out noise elimination, edge enhancement, and the like to obtain a high definition 2D image is known. However, in a new 3D image-capturing system, it is not known what procedure to carry out in order to enable a high definition stereoscopic image to be finally obtained. For example, in this type of image-capturing apparatus, in some cases, a higher resolution parallax image is generated using the generated parallax image. In these cases, if a filtering process is carried out such as edge enhancement, noise elimination, or the like individually on the generated plurality of parallax images, there is a possibility of occurring Moire fringes and spurious resolution associated with insufficient density of sampling of each of the parallax pixels.

A first aspect of the present invention is an image processing method for inputting a first image in which a subject image is taken into mutually different pixels simultaneously through a single optical system in a standard direction view point, a left direction view point, and a right direction view point by using an image sensor that includes a pixel array including a plurality of pixels having one aperture mask per one pixel, and in which at least three types of pixels: non-parallax pixels that include an aperture mask that produces a view point in a standard direction; left parallax pixels that include an aperture mask that produces parallax in a left direction with respect to the standard direction; and right parallax pixels that include an aperture mask that produce parallax in a right direction with respect to the standard direction are arranged, and converting the first image into an image from the left direction view point and an image from the right direction view point, the method comprising the steps of: generating a temporary left parallax image using a pixel value of the left parallax pixels of the first image for each pixel; generating a temporary right parallax image using a pixel value of the right parallax pixels of the first image for each pixel; generating a standard view point image using a pixel value of at least the non-parallax pixels of the first image for each pixel; generating an edge enhanced standard view point image by carrying out an edge enhancement process on the standard view point image; and generating a left direction view point image and a right direction view point image based on the edge enhanced standard view point image, the temporary left parallax image, and the temporary right parallax image for each pixel.

A second aspect of the present invention is an image processing method for inputting a first image in which a subject image is taken into mutually different pixels simultaneously through a single optical system in a standard direction view point, a left direction view point, and a right direction view point by using an image sensor that includes a pixel array including a plurality of pixels having one aperture mask per one pixel, and in which at least three types of pixels: non-parallax pixels that include an aperture mask that produce a view point in a standard direction; left parallax pixels that include an aperture mask that produce parallax in a left direction with respect to the standard direction; and right parallax pixels that include an aperture mask that produce parallax in a right direction with respect to the standard direction are arranged, and converting the first image into an image from the left direction view point and an image from the right direction view point, the method comprising the steps of: generating a temporary left parallax image using the pixel value of the left parallax pixels of the first image for each pixel; generating a temporary right parallax image using the pixel value of the right parallax pixels of the first image for each pixel; generating a standard view point image using the pixel values of the non-parallax pixels of the first image for each pixel; generating a noise eliminated standard view point image by carrying out a noise elimination process on the standard view point image; and generating a left direction view point image and a right direction view point image based on the noise eliminated standard view point image, the temporary left parallax image, and the temporary right parallax image for each pixel.

A third aspect of the present invention is an image processing apparatus that includes: a parallax image data acquisition unit that acquires first parallax image data corresponding to view point that is shifted in a first direction with respect to a standard direction, and second parallax image data corresponding to a view point that is shifted in a second direction that is opposite to the first direction with respect to the standard direction; a standard image data acquisition unit that acquires standard image data corresponding to the standard direction and having a higher resolution than the spatial frequency resolution of the first parallax image data and the second parallax image data; a filter processing unit that carries out a filtering process on the standard image data that is at least one of edge adjustment and noise elimination; and a parallax image data generating unit that generates third parallax image data corresponding to a view point that is shifted in the first direction, and fourth parallax image data corresponding to a view point that is shifted in the second direction, using the standard image data resulting from the filtering process, the first parallax image data, and the second parallax image data.

A fourth aspect of the present invention is an image-capturing apparatus that includes: an image sensor that outputs at least one of the first parallax image data and the second parallax image data; and an image processing apparatus as described above.

A fifth aspect of the present invention is non-transitory computer readable medium having an image processing program stored thereon, the image processing program causing a computer to perform procedures of: a parallax image data step of acquiring first parallax image data corresponding to a view point that is shifted in a first direction with respect to a standard direction, and second parallax image data corresponding to a view point that is shifted in a second direction that is opposite to the first direction with respect to the standard direction; a standard image data step of acquiring standard image data corresponding to the standard direction and having a higher resolution than the spatial frequency resolution of the first parallax image data and the second parallax image data; a filter processing step of carrying out a filtering process on the standard image data that is at least one of edge adjustment and noise elimination; and a parallax image data generating step of generating third parallax image data corresponding to a view point that is shifted in the first direction, and fourth parallax image data corresponding to a view point that is shifted in the second direction, using the standard image data resulting from the filtering process, the first parallax image data, and the second parallax image data.

The summary of the invention is not intended to define the scope of the invention and does not necessarily constitute a list of features that are necessary or sufficient to define the present invention. Sub-combinations of the listed features should also be regarded as entire embodiments of the invention within the scope of this disclosure.

DESCRIPTION OF EMBODIMENTS

The following is a description of the present invention through embodiments of the present invention, but the following embodiments are not intended to limit the scope of the invention, which is defined by the claims. The characteristics described with respect to the embodiments are not necessarily essential to the invention.

Figure 1:
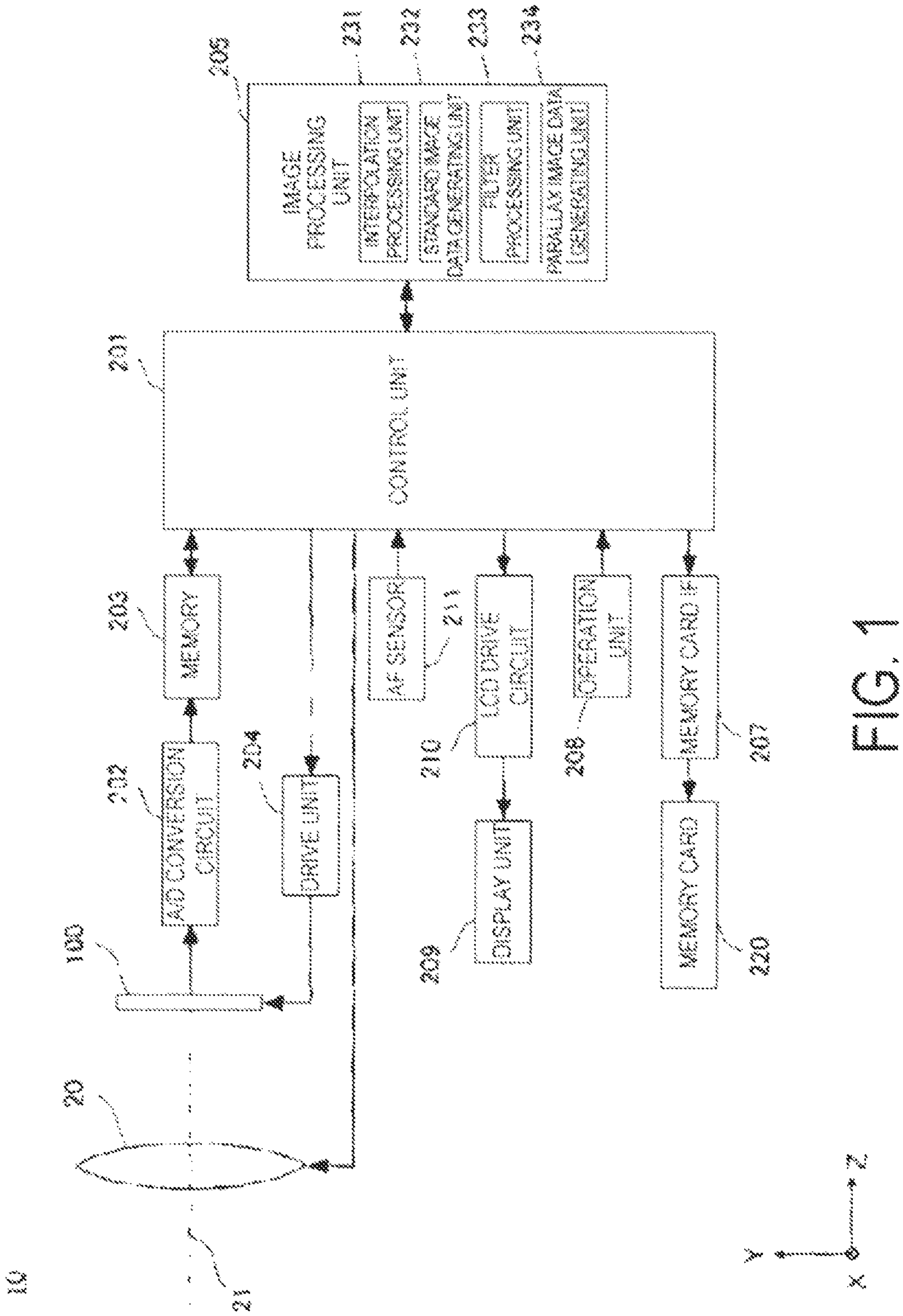
FIG. 1 is an explanatory view of the configuration of a digital camera 10.

FIG. 1 shows a configuration of a digital camera 10, which is one aspect of an image processing apparatus and an image-capturing apparatus and is configured so that it is capable of generating in one scene a left view point image and a right view point image with a single image-capturing. Each image having different viewpoints is referred to as a parallax image.

The digital camera 10 includes an image-capturing lens 20 as an image-capturing optical system, and guides the subject light flux that is incident along an optical axis 21 thereof to an image sensor 100. The image-capturing lens 20 may be an exchangeable lens that can be attached to the digital camera 10. The digital camera 10 includes the image sensor 100, a controller 201, an A/D conversion circuit 202, a memory 203, a driving unit 204, an image processor 205, a memory card IF 207, an operation unit 208, a display 209, an LCD drive circuit 210, and an AF sensor 211.

As shown in FIG. 1, a direction parallel to the optical axis 21 that extends toward the image sensor 100 is defined as the Z-axis positive direction, a direction orthogonal to the plane of the Z-axis and moving upward from the plane of the drawing is defined as the X-axis positive direction, and a direction upward within the plane of the drawing is defined as the Y-axis positive direction. In relation to composition when capturing images, the X-axis is the horizontal direction and the Y-axis is the vertical direction. In several of the following drawings, the coordinate axes of FIG. 1 are used as a reference to display the orientation of the drawings on coordinate axes.

The image-capturing lens 20 is configured by a plurality of optical lens groups, and focuses the subject light flux from a scene near the focal plane of the image-capturing lens 20. In FIG. 1, for ease of explanation, the image-capturing lens 20 is represented by a single virtual lens arranged near the pupil. The image sensor 100 is arranged near the focal plane of the image-capturing lens 20. The image sensor 100 is an image sensor, such as a CCD or CMOS sensor, in which a plurality of photoelectric converting elements is arranged two-dimensionally. The timing of the image sensor 100 is controlled by the driving unit 204, and the image sensor 100 converts a subject image focused on a light receiving surface into an image signal and outputs the image signal to the A/D conversion circuit 202.

The A/D conversion circuit 202 converts the image signal output from the image sensor 100 into a digital image signal and outputs it to the memory 203. The image processor 205 performs various types of image processing using the memory 203 as a work space to generate image data. In particular, the image processor 205 includes an interpolation processing unit 231, a standard image data generating unit 232, a filter processing unit 233, and a parallax image data generating unit 234.

The interpolation processing unit 231 generates left parallax image data of a left view point and right parallax image data of a right view point based on the output of the image sensor 100. The left parallax image data and the right parallax image data generated by the interpolation processing unit 231 are data used for processing by the standard image data generating unit 232 and the parallax image data generating unit 234. The left parallax image data and the right parallax image data themselves generated by the interpolation processing unit 231 are not output as final left parallax image data and right parallax image data, so the left parallax image data and the right parallax image data are referred to as temporary parallax image data for generating the final parallax image data. The spatial frequency resolution of the left parallax image data and the right parallax image data generated by the interpolation processing unit 231 is lower than the spatial frequency resolution of the left parallax image data and the right parallax image data generated by the parallax image data generating unit 234.

The standard image data generating unit 232 generates standard image data using the pixel values of the left parallax image data and the right parallax image data generated by the interpolation processing unit 231. The standard image data is described in detail later. The spatial frequency resolution of the standard image data is higher than the spatial frequency resolution of the left parallax image data and the right parallax image data generated by the interpolation processing unit 231.

The filter processing unit 233 carries out filtering processes to carry out edge adjustment and/or noise elimination on the standard image data generated by the standard image data generating unit 232. In the following description, as an example, edge enhancement is described mainly as edge adjustment.

The parallax image data generating unit 234 uses the left parallax image data and the right parallax image data generated by the interpolation processing unit 231 and the standard image data resulting from filter processing by the filter processing unit 233, and generates left parallax image data and right parallax image data with a higher resolution than the left parallax image data and the right parallax image data generated by the parallax image data generating unit 234.

The image processor 205 also undertakes general image processing such as adjusting image data in accordance with selected image formats, and the like. The generated image data is converted into display signals by the LCD drive circuit 210, to be displayed on the display 209. Also, the data is recorded on a memory card 220 provided in the memory card IF 207.

The AF sensor 211 is a phase difference sensor with a plurality of distance measurement points set with respect to the subject space, that detects the amount of defocus of the subject image at each of the distance measurement points. A series of image-capturing sequences is begun as a result of the operation unit 208 receiving user's manipulation to output a manipulation signal to the controller 201. Execution of the various operations associated with the image-capturing sequence, such as AF, AE, and the like, are controlled by the controller 201. For example, the controller 201 analyzes the signal detected by the AF sensor 211, and executes a focusing control to move a focusing lens that constitutes a portion of the image-capturing lens 20.

Figure 2:
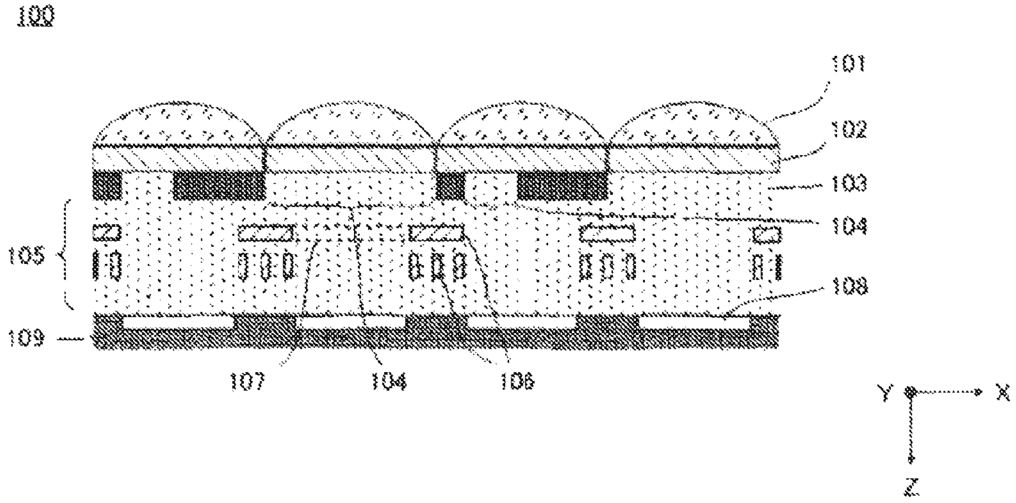
FIG. 2 is an explanatory view of the configuration of a cross-section of an image sensor 100.

Next, the configuration of the image sensor 100 is described in detail. FIG. 2 is a schematic view illustrating a cross-section of the image sensor 100.

The image sensor 100 is formed by arranging microlenses 101, color filters 102, aperture masks 103, a wiring layer 105, and photoelectric converting elements 108 in the stated order from the subject side. The photoelectric converting elements 108 are each formed by a photodiode that converts the incident light into an electrical signal. A plurality of photoelectric converting elements 108 is arranged two-dimensionally on the surface of a substrate 109.

The image signal resulting from the conversion by the photoelectric converting elements 108 and the control signals for controlling the photoelectric converting elements 108, for example, are transmitted and received by wiring 106 provided in the wiring layer 105. Also, the aperture masks 103, provided corresponding one-to-one with each of the photoelectric converting elements 108, include aperture portions 104 arranged repetitively in a two-dimensional array and are provided in contact with the wiring layer. As described later, the aperture portions 104 are shifted in accordance with a corresponding one of the photoelectric converter elements 108 and are strictly positioned at locations relative to the corresponding photoelectric converting element 108. The specifics are described further below, but the aperture masks 103 having aperture portions 104 function to create parallaxes in the subject light flux received by the photoelectric converting elements 108.

On the other hand, there is no aperture mask 103 positioned above the photoelectric converting elements 108 that do not cause a parallax. In other words, it can also be said that aperture masks 103 are provided including aperture portions 104 that pass all effective light, i.e. that do not limit the subject light flux incident to the corresponding photoelectric converting elements 108. Although no parallax is caused, the aperture 107 formed by the wiring 106 substantially defines the incident subject light flux, and therefore the wiring 106 can be thought of as an aperture mask that passes all the incident light flux and does not cause a parallax. Each aperture mask 103 may be arranged independently in correspondence with a photoelectric converting element 108, or the aperture masks 103 may be formed en bloc for a plurality of photoelectric converting elements 108 using the same manufacturing process as used for the color filters 102.

The color filters 102 are provided on the aperture masks 103. The color filters 102 correspond one-to-one with the photoelectric converting elements 108, and each color filter 102 is colorized to pass a specified wavelength band to the corresponding photoelectric converting element 108. In order to output a color image, it is only necessary to arrange two different types of color filters, but a higher quality color image can be obtained if three or more types of color filters are provided. For example, red filters (R filters) that pass a red wavelength band, green filters (G filters) that pass a green wavelength band, and blue filters (B filters) that pass a blue wavelength band may be arranged in a grid. The color filters are not limited to the combination of primary colors RGB, but may be the combination of complementary color filters YCM.

The microlenses 101 are provided on the color filters 102. Each microlens 101 is a converging lens that guides a majority of the subject light flux incident thereto to the corresponding photoelectric converting element 108. The microlenses 101 correspond one-to-one with the photoelectric converting elements 108. Each microlens 101 preferably has the optical axis thereof shifted to guide more subject light flux to the corresponding photoelectric converting element 108, with consideration to the relative positions of the center of the pupil of the image-capturing lens 20 and the corresponding photoelectric converting element 108. Furthermore, in addition to adjusting the positioning of the aperture portions 104 of the aperture masks 103, the positioning of the microlenses 101 may be adjusted such that more of the specified subject light flux that is described later is incident.

In this way, the single unit of an aperture mask 103, a color filter 102, and a microlens 101 provided one-to-one with each photoelectric converting element 108 is referred to as a pixel. More specifically, a pixel including an aperture mask 103 that causes a parallax is referred to as a parallax pixel, and a pixel including an aperture mask 103 that does not cause a parallax is referred to as a non-parallax pixel. For example, if the effective pixel region of the image sensor 100 is approximately 24 mm by 16 mm, there may be approximately 12 million pixels.

If the image sensor has good collection efficiency and photoelectric conversion efficiency, the microlenses 101 need not be provided. If a back-illuminated image sensor is used, the wiring layer 105 is provided on the opposite side of the photoelectric converting elements 108. If the aperture portions 104 of the aperture masks 103 have a color component, the color filters 102 and the aperture masks 103 can be formed integrally. If only a black and white image signal is to be output, the color filters 102 are not provided.

Also, in this embodiment, the aperture mask 103 and the wiring 106 are provided separately, but the wiring 106 may undertake the function of the aperture mask 103 in the parallax pixel. In other words, the prescribed aperture shape is formed by the wiring 106, and the incident light is restricted by the aperture shape and only a specific partial luminous flux is guided to the photoelectric converting element 108. In this case, preferably, the wiring 106 that forms the aperture shape is on the side of the wiring layer 105 closest to the photoelectric converting element 108.

Also, the aperture mask 103 may be formed by a transmission prevention film provided superimposed on the photoelectric converting element 108. In this case, the aperture mask 103 is a transmission prevention film formed by, for example, stacking a SiN film and a $SiO_2$ film in that order, and removing the region corresponding to the aperture portion 104 by etching.

Figure 3A:
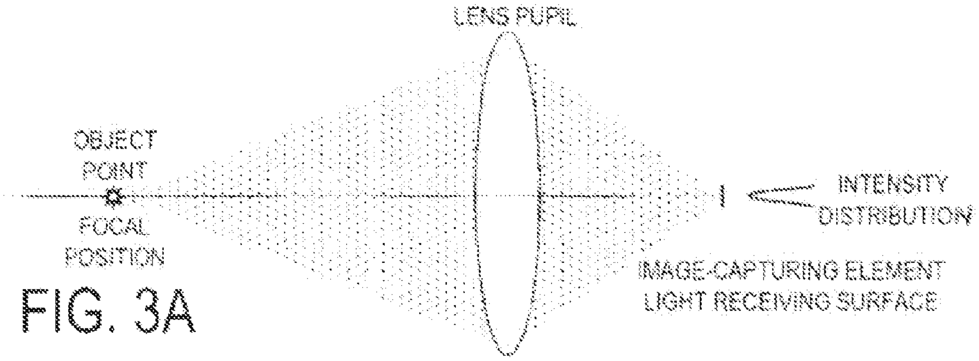
FIGS. 3A, 3B and 3C are explanatory views of the concept of defocus in a non-parallax pixel.
Figure 3B:
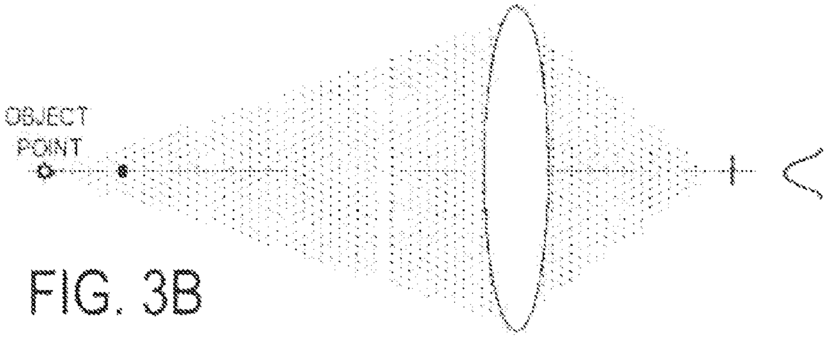
Figure 3C:
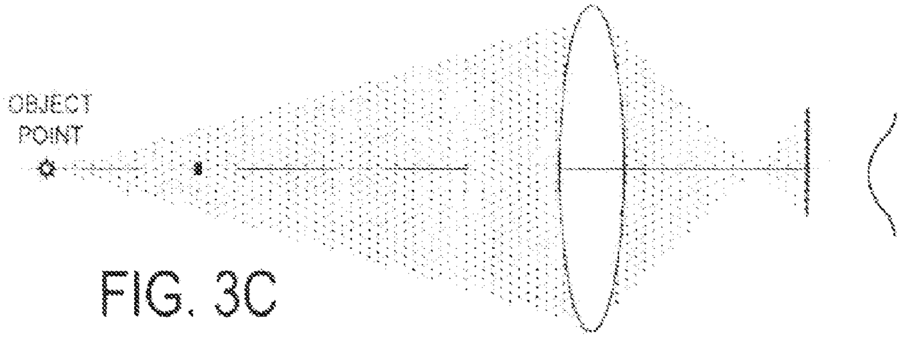

Next, the concept of defocus when a parallax Lt pixel and a parallax Rt pixel receive light is described. First, the concept of defocus in a non-parallax pixel is simply described. FIGS. 3A to 3C are explanatory views of the concept of defocus in a non-parallax pixel. As shown in FIG. 3A, if an object point, which is a subject, is at the focal position, the subject light flux that arrives at the image sensor light receiving surface through the lens pupil exhibits a steep light intensity distribution with the pixel at the corresponding image point as center. In other words, if a non-parallax pixel that receives all the effective light flux that passes through the lens pupil is arranged near the image point, the output value of the pixel corresponding to the image point will be largest, and the output values of the pixels arranged at the periphery thereof will be greatly reduced.

On the other hand, as shown in FIG. 3B, if the object point is shifted from the focal position, the subject light flux exhibits a gentler light intensity distribution on the image sensor light receiving surface compared with the case where the object point is at the focal position. In other words, a distribution is shown in which the pixel of the corresponding image point has a lowered output value, and more surrounding pixels have output values.

Also, as shown in FIG. 3C, if the object point is shifted further from the focal position, the subject light flux exhibits a gentler light intensity distribution on the image sensor light receiving surface. In other words, a distribution is exhibited in which the pixel of the corresponding image point has a further lowered output value, and further more surrounding pixels have output values.

Figure 4A:
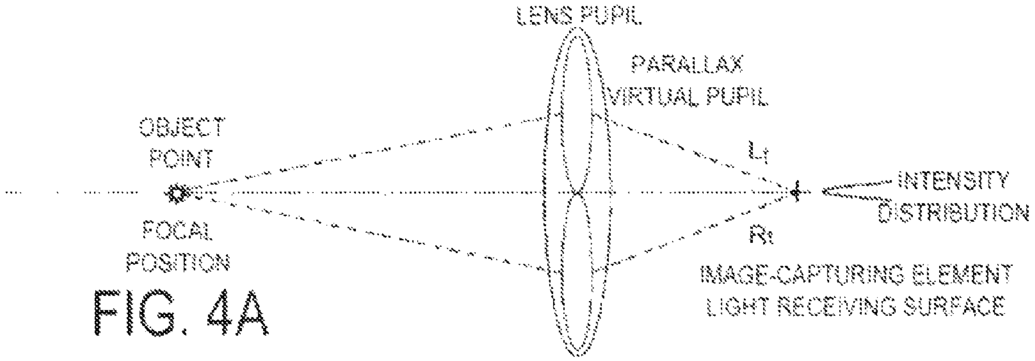
FIGS. 4A, 4B and 4C are explanatory views of the concept of defocus in a parallax pixel.
Figure 4B:
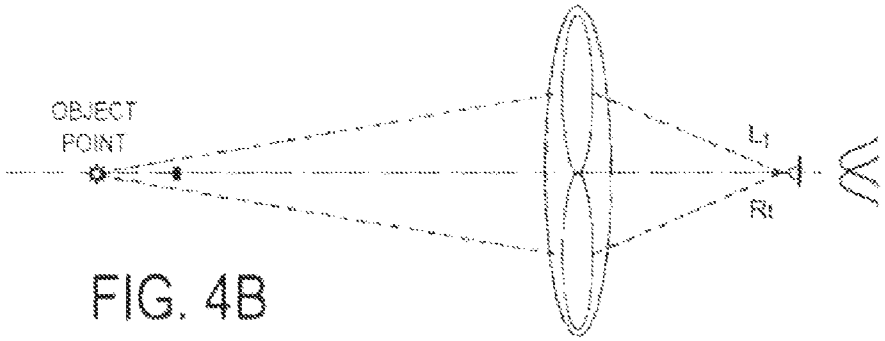
Figure 4C:
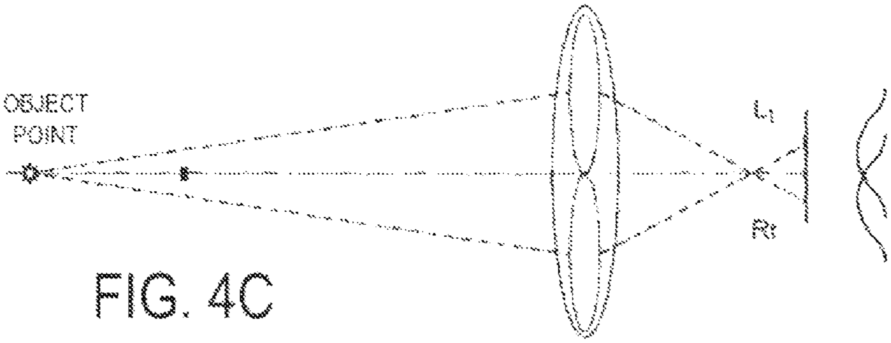

FIGS. 4A to 4C are explanatory views of the concept of defocus in a parallax pixel. The parallax Lt pixel and the parallax Rt pixel receive subject light flux arriving from one of two parallax virtual pupils set symmetrically on the optical axis as a lens pupil partial region. In this specification, the system of capturing a parallax image by receiving subject light flux arriving from different virtual pupils in a single lens pupil is referred to as the single pupil divided image-capturing system.

As shown in FIG. 4A, if an object point, which is a subject, is at the focal position, the subject light flux that has passed through either of the parallax virtual pupils exhibits a steep light intensity distribution with the pixel at the corresponding image point as center. If the parallax Lt pixel is arranged near the image point, the output value corresponding to the image point will be largest, and the output values of the surrounding pixels will be greatly reduced. Also, if the parallax Rt pixel is arranged near the image point, the output value of the pixel corresponding to the image point will be largest, and the output values of the surrounding pixels will be greatly reduced. In other words, a distribution is exhibited in which even though the subject light flux passes through either of parallax virtual pupils, the output value of the pixel corresponding to the image point will be largest, and the output values of the surrounding pixels will be greatly reduced, and the respective distributions coincide with each other.

On the other hand, as shown in FIG. 4B, if the object point is shifted from the focal position, compared with the case in which the object point is at the focal position, the peak of the light intensity distribution exhibited by the parallax Lt pixel will appear at a position separated in one direction from the pixel corresponding to the image point, and the output value will be reduced. Also, the width of the pixel having that output value will be increased. The peak of the light intensity distribution exhibited by the parallax Rt pixel will appear at a position shifted in the opposite direction and an equal distance to that of the parallax Lt pixel from the pixel corresponding to the image point, and the output value will likewise be reduced. Also, likewise the width of the pixel having that output value will be increased. In other words, equivalent light intensity distributions, gentler compared with that of the case in which the object point is at the focal position, appear separated by an equal distance. Also, as shown in FIG. 4C, if the object point is shifted even further from the focal position, equivalent light intensity distributions, gentler compared with that of the state shown in FIG. 4B, appear further separated. In other words, the greater the deviation of the object point from the focal position, the greater the amount of blur and the amount of parallax.

Figure 5A:
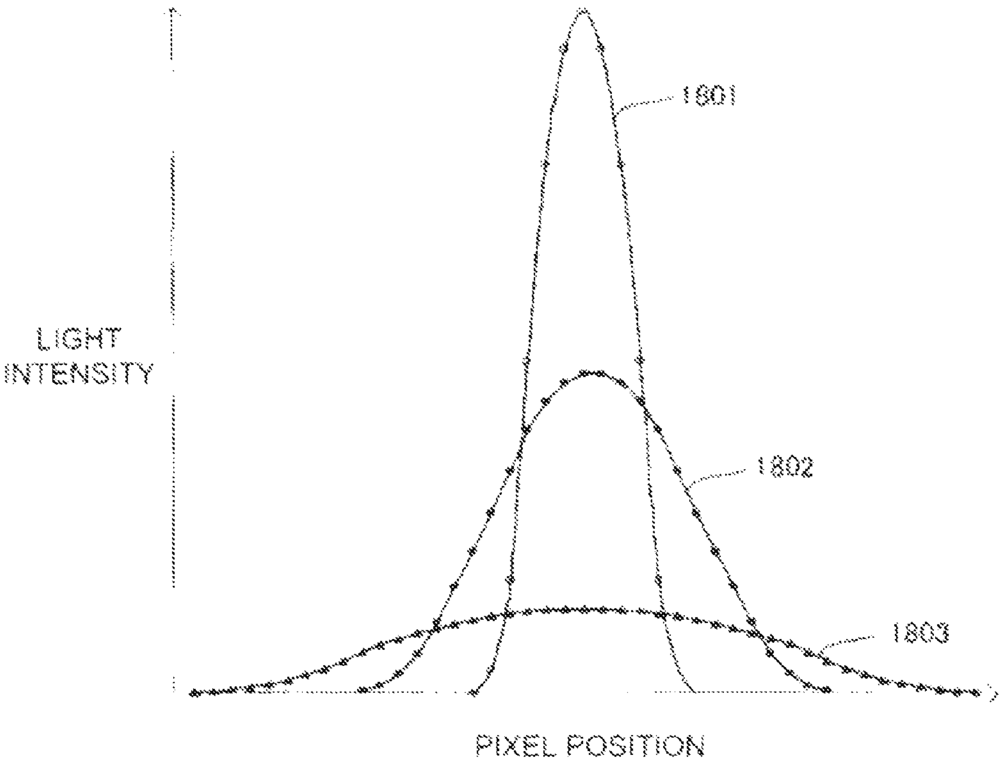
FIGS. 5A and 5B show the light intensity distribution of a non-parallax pixel and a parallax pixel.
Figure 5B:
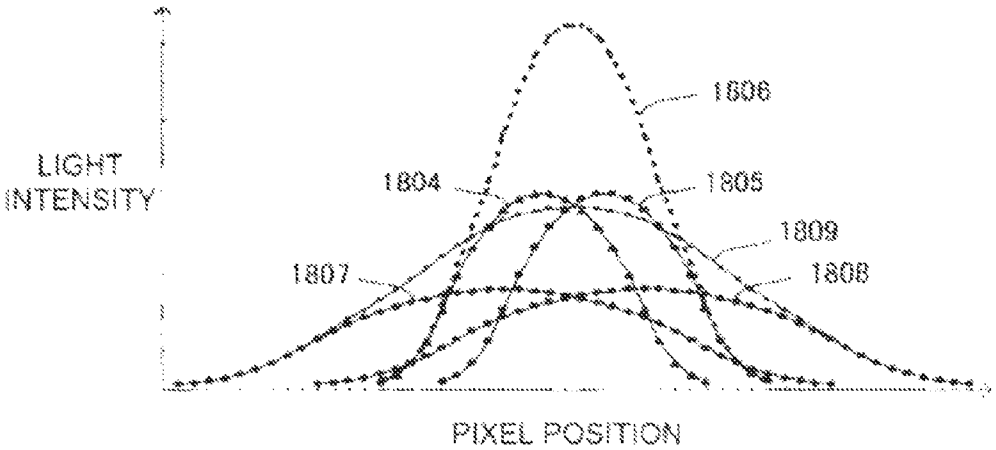

The variations in the light intensity distributions described in FIGS. 3A to 3C and the variations in the light intensity distributions described in FIGS. 4A to 4C are respectively represented by graphs in FIGS. 5A and 5B. In these drawings, the horizontal axis represents the pixel position, and the center position is the position of the pixel corresponding to the image point. The vertical axis represents the output value of each pixel. These output values are substantially proportional to the light intensity, so in this drawing, the vertical axis is labeled as the light intensity.

FIG. 5A is a graph showing the variation in the light intensity as described in FIGS. 3A to 3C. The distribution curve 1801 represents the light intensity distribution corresponding to FIG. 3A, and exhibits the steepest form.

The distribution curve 1802 represents the light intensity distribution corresponding to FIG. 3B, and the distribution curve 1803 represents the light intensity distribution corresponding to FIG. 3C. It can be seen that compared with the distribution curve 1801, the peak values are gradually reduced, and the form becomes broader.

FIG. 5B is a graph showing the variation in the light intensity as described in FIGS. 4A to 4C. The distribution curve 1804 and distribution curve 1805 represent the light intensity distribution of the parallax Lt pixel and the light intensity distribution of the parallax Rt pixel respectively of FIG. 4B. As can be seen from these graphs, these distributions have a line symmetric shape about the center position. Also, the composite distribution curve 1806 obtained by adding these has a similar shape to the distribution curve 1802 of FIG. 3B which has the same state of defocus as FIG. 4B.

The distribution curve 1807 and distribution curve 1808 represent the light intensity distribution of the parallax Lt pixel and the light intensity distribution of the parallax Rt pixel respectively of FIG. 4C. As can be seen from these graphs, these distributions also have a line symmetric shape about the center position. Also, the composite distribution curve 1809 obtained by adding these has a similar shape to the distribution curve 1803 of FIG. 3C which has the same state of defocus as FIG. 4C.

Figure 6A:
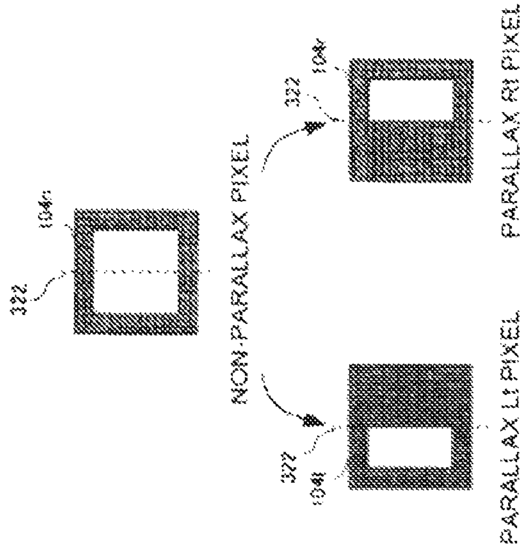
FIGS. 6A, 6B, 6C and 6D are explanatory views of the aperture shape of an aperture portion 104 in a case where there are two types of parallax pixels.

FIGS. 6A to 6D are explanatory views of the aperture shape of the aperture portion 104 in a case where there are two types of parallax pixels. FIG. 6A shows an example in which the shape of the aperture portion **104*l* of the parallax Lt pixel and the shape of the aperture portion 104*r* of the parallax Rt pixel each have the same shape as the shape of an aperture portion 104*n* of a non-parallax pixel divided at the center line 322. In other words, in FIG. 6A, the area of the aperture portion 104*n* of the non-parallax pixel is equal to the sum of the areas of the aperture portion 104*l* of the parallax Lt pixel and the aperture portion 104*r* of the parallax Rt pixel. In this embodiment, the aperture portion 104*n* of the non-parallax pixel is referred to as a fully open aperture, and the aperture portion 104*l* and the aperture portion 104*r* are referred to as half open apertures. Also, if the aperture is positioned in the center of the photoelectric converting element, the aperture is said to be facing the standard direction. The aperture portion 104*l* of the parallax Lt pixel and the aperture portion 104*r* of the parallax Rt pixel are displaced in opposite directions about a virtual center line 322 passing through the center (pixel center) of their corresponding photoelectric converting elements 108. Therefore, the aperture portion 104*l* of the parallax Lt pixel and the aperture portion 104*r*** of the parallax Rt pixel produce parallax with respect to the standard direction in one direction, and the other direction that is opposite to the one direction, respectively.

Figure 6B:
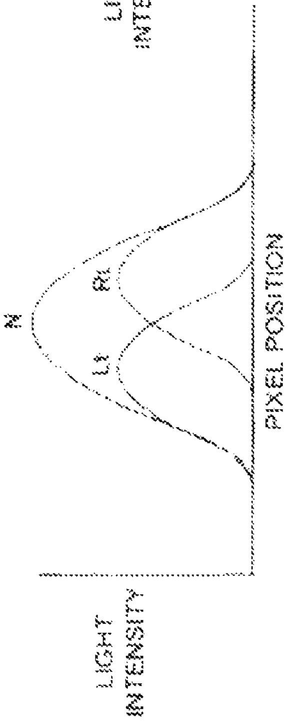

FIG. 6B shows the light intensity distribution for a case in which an object point is shifted from the focal position, when each of the pixels has the apertures shown in FIG. 6A. In this drawing, the curve Lt corresponds to the distribution curve 1804 of FIG. 5B, and the curve Rt corresponds to the distribution curve 1805 of FIG. 5B. The curve N corresponds to a non-parallax pixel, and it has a similar shape to the composite distribution curve 1806 of FIG. 5B. Also, each of the aperture portions **104*n*, aperture portions 104*l*, and aperture portions 104*r* has a function of the aperture diaphragm. Therefore, the width of blurring of the non-parallax pixel having the aperture portion 104*n* whose area is double of the aperture portion 104*l* (aperture portion 104*r*) is about the same as the width of the blurring of the curve that is the sum of the parallax Lt pixel and the parallax Rt pixel and is indicated by the composite distribution curve 1806 of FIG. 5**B.

Figure 6C:
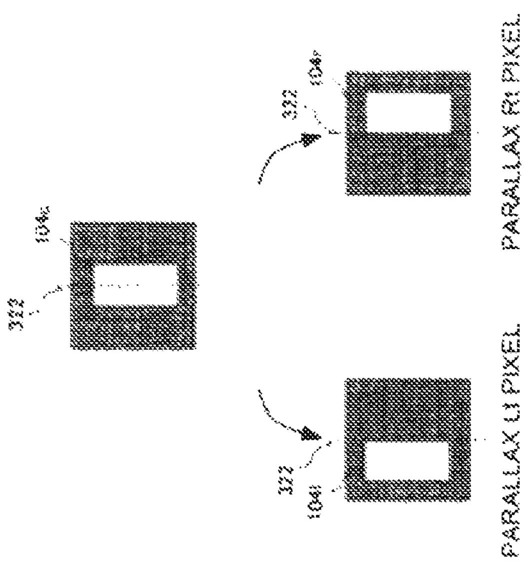

FIG. 6C shows an example in which the shape of the aperture portion **104*l* of the parallax Lt pixel, the shape of the aperture portion 104*r* of the parallax Rt pixel, and the shape of the aperture portion 104*c* of the parallax C pixel are each the same shape. Here, the parallax C pixel is referred to as a pixel with no eccentricity. The parallax C pixel is strictly a parallax pixel that outputs a parallax image in that it guides only the subject light flux from the partial region at the center portion of the pupil to the photoelectric converting element 108. However, here, a pixel having an aperture corresponding to the standard direction is defined as a non-parallax pixel. Therefore, the parallax C pixel of FIG. 6C having its aperture in the center of the photoelectric converting element similar to the non-parallax pixel of FIG. 6A as the standard direction is a non-parallax pixel. Also, the aperture portion 104*l*, the aperture portion 104*r*, and the aperture portion 104*c* have half the area of the aperture portion 104*n* shown in FIG. 6A. Both the aperture portion 104*l* and the aperture portion 104*r* touch the virtual center line 322 that passes through the center (pixel center) of the photoelectric converting element 108, the same as in FIG. 6**A.

Figure 6D:
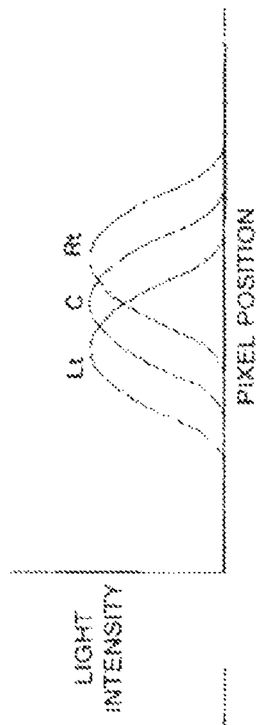

FIG. 6D shows the light intensity distribution for a case in which an object point is shifted from the focal position, when each of the pixels has the apertures shown in FIG. 6C. In this drawing, the curve Lt corresponds to the distribution curve 1804 of FIG. 5B, and the curve Rt corresponds to the distribution curve 1805 of FIG. 5B. Also, each of the aperture portions **104*c*, aperture portions 104*l*, and aperture portions 104*r* has a function of the aperture diaphragm. Therefore, the width of blurring of the parallax C pixel, which has the aperture portion 104*c* with the same shape and same area as the aperture portion 104*l* and the aperture portion 104*r***, is about the same as the width of blurring of the parallax Lt pixel and the parallax Rt pixel. As described above, in the single pupil divided image-capturing system, compared with the normal two pupil system of stereoscopic image-capturing, the parallax is included in the blurring, and an optical image is obtained at the focal position that is the same as 2D image-capturing.

In Patent Document 1, a color and parallax array including a combination of an array of color filters and left and right parallax pixels only is disclosed. There is no limitation to the color and parallax array disclosed in Patent Document 1. For example, besides the left and right parallax pixels, color and parallax arrays in which non-parallax pixels are arranged can also be used. In each case, image-capturing by these color and parallax arrays is referred to as stereoscopic image-capturing by the single pupil divided image-capturing system.

As a method of generating a stereoscopic image, generating a left parallax image by gathering the sampling points (lattice points) of the left parallax pixels only and interpolating the empty lattice points, and generating a right parallax image by collecting the sampling points of the right parallax pixels and interpolating the empty lattice points, by the image processor 205 can be considered. However, in the method of independently interpolation processing the left and right parallax pixels, the problem that it is not possible to obtain a resolution that exceeds the sampling resolution limit of the respective parallax pixels inevitably remains.

On the other hand, in the case of an array in which fully open non-parallax pixels coexist, by first generating a 2D image with no parallax as an intermediate image (hereinafter, also referred to as “2D intermediate image”), this 2D intermediate image can have a resolution capability up to the Nyquist frequency, which is equal to the resolution limit when all pixels are sampled under constant conditions. In other words, as described above, an inherent characteristic of the single pupil divided image-capturing system is that the point spread function of the subject image at the focus position is the same point spread function for non-parallax pixels, left parallax pixels, and right parallax pixels. Therefore, near the focus position, a subject image is taken that is the same as that of a 2D dedicated sensor, and its resolution can be derived to the maximum extent.

Using the 2D intermediate images obtained in this way, if the high-frequency component of the 2D intermediate images obtained by parallax modulation, which is described later, is superimposed on the low resolution left parallax image and the low resolution right parallax image obtained by independently temporarily interpolating the left and right parallax pixels, it is possible to obtain high resolution left parallax images and high resolution right parallax images that exceed the sampling limit of each parallax pixel.

A problem to be aware of here is that if the high resolution left parallax image and the high resolution right parallax image obtained by parallax modulation form an unfocused region subject image that has shifted from the focus position, then even though the high frequency resolution of the 2D intermediate image is reflected, the high frequency component above the resolution limit in the original low resolution left parallax image and low resolution right parallax image appear as low frequency Moire fringes. On the other hand, in the 2D intermediate images, this Moire component does not appear even in the unfocused region. In other words, a stable high resolution can be achieved in the 2D intermediate images.

Therefore, based on these facts, it is possible to conclude the following regarding edge enhancement processing in 3D images. First, edge enhancement processing is not carried out individually for the left parallax image and the right parallax image, but edge enhancement processing is carried out on the 2D image after first generating the high-resolution 2D intermediate image. Then, the 3D image on which the edge enhancement process has been performed is generated by adding parallax modulation. When this image processing procedure is carried out, aliasing and Moire fringes which exceed the sampling limit of the parallax pixels are not enhanced, but it is possible to obtain a high definition natural edge enhanced stereoscopic image.

Figure 7:
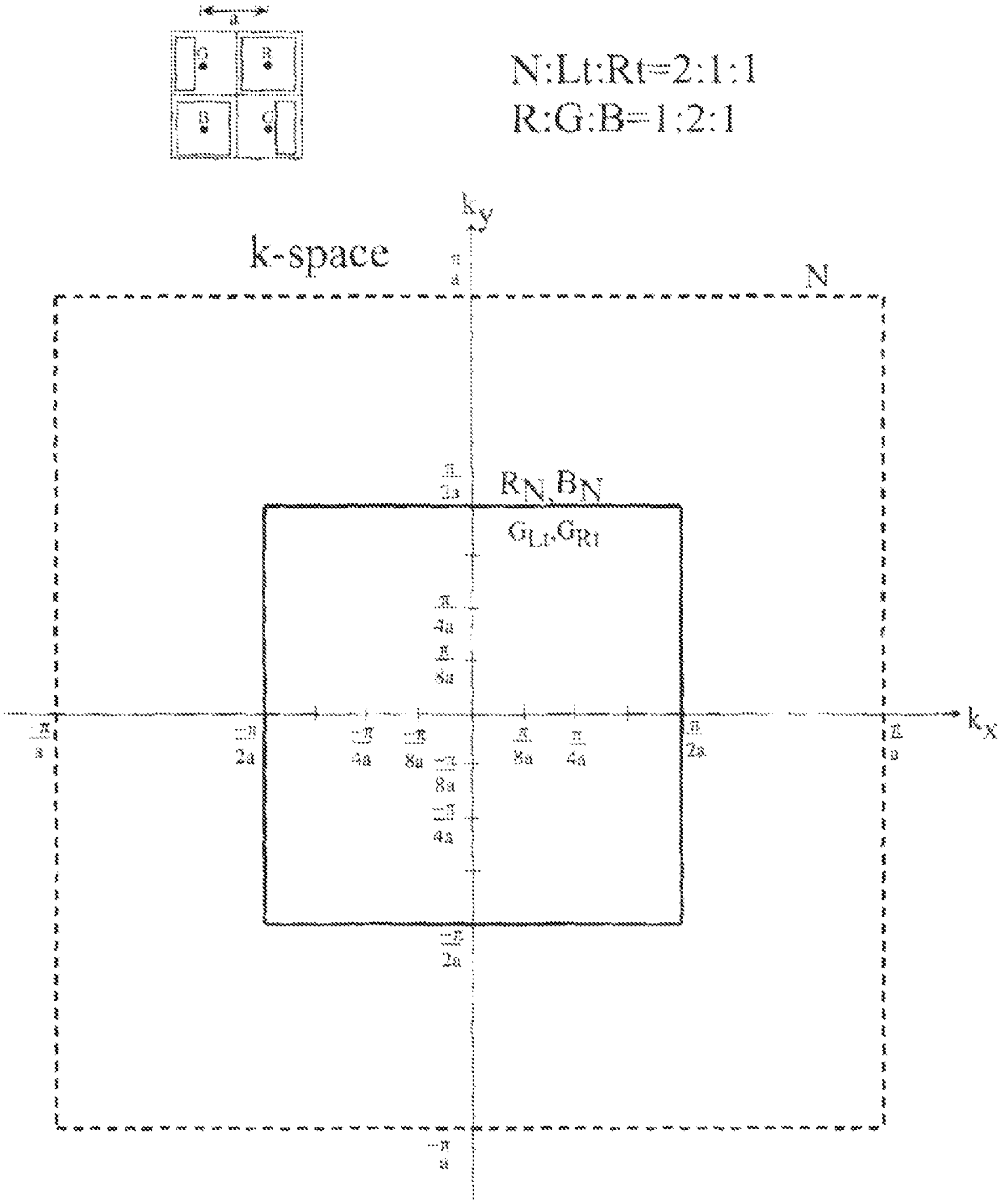
FIG. 7 shows a Bayer type G parallax pixel array and the resolution capability of the array in frequency space.

FIG. 7 shows a Bayer type G parallax pixel array and the resolution of the array in frequency space. In the array shown in FIG. 7, the left parallax pixel (Lt), the right parallax pixel (Rt), and the non-parallax pixel (N) are mixed. The color filter array has a Bayer array structure in which a left aperture parallax pixel is provided on one G pixel, and a right aperture parallax pixel is provided on another G pixel as the aperture mask. In addition, fully open non-parallax pixels are provided for the R pixels and the B pixels. This corresponds to the array described in Embodiment 1 which is described later. Also, FIG. 7 shows a frequency space diagram (k-space diagram) representing the sampling resolution limit corresponding to each parallax and each color component. However, the relationship between the resolution frequency f [No./mm] and the frequency k is $k=2\pi f$.

If a 2D intermediate image as described previously is generated for a monochrome subject (for example, a circular zone plate) in the focus position, resolution is obtained to the Nyquist frequency limit of the outermost side. On the other hand, in the unfocused region, the resolution frequency is basically limited to a rectangular region on the inside.

Figure 8A:
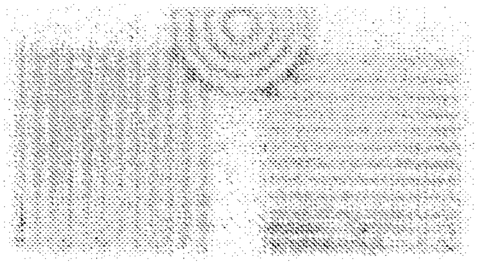
FIGS. 8A, 8B and 8C are explanatory views of Moire fringes in parallax images.
Figure 8B:
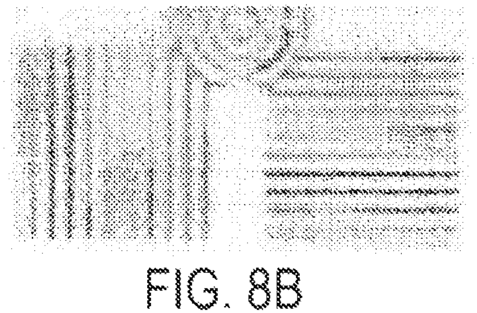
Figure 8C:
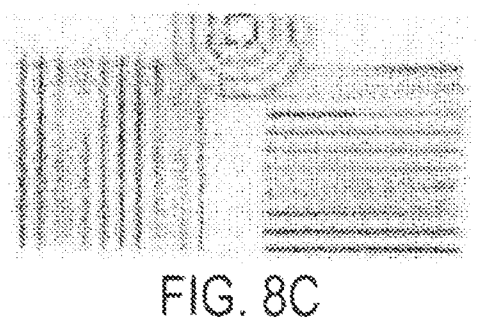

FIGS. 8A to 8C are explanatory views of Moire fringes in parallax images. FIG. 8A shows a non-parallax image, FIG. 8B shows a left parallax image, and FIG. 8C shows a right parallax image. The images shown in FIGS. 8B and 8C are generated by the process described later in Embodiment 1 excluding the edge enhancement process part. In the case that a 3D image is obtained via a 2D intermediate image of a subject that is shifted a little from the focus position described above, as shown in FIGS. 8B and 8C, a Moire component appears on the left and right parallax images associated with the sampling limit of the parallax images. Therefore, if edge enhancement is carried out separately for the left parallax pixel and the right parallax pixel, the Moire component of spurious resolution is emphasized, which harms the image quality. If edge enhancement of the 2D intermediate image is carried out, a high definition 3D edge enhancement process can be carried out that does not enhance the Moire component.

Other arrays can be used as color and parallax arrays with mixed left parallax pixels (Lt), right parallax pixels (Rt), and non-parallax pixels (N). For example, an array with a low density of parallax pixels as described later in Embodiment 2, and an array with a low density of parallax pixels and a monochrome array as described later in Embodiment 3 can be used.

In the following embodiments, as described above, first, high resolution 2D intermediate images are generated, and the generated 2D intermediate image is superimposed on the 3D image to obtain high resolution output images for both 2D and 3D images. The color information of the parallax pixels and the non-parallax pixels are mutually referenced and a way of utilizing this correlation is introduced.

Next noise elimination is described. With a noise elimination filter, the higher the resolution of an image, the higher the accuracy with which a region in which the edge structure must be kept can be determined. As a result, in a region where the edge structure must be kept, it becomes difficult to eliminate information regarding the image structure. Therefore, it is desirable to carry out a noise elimination process on the high resolution 2D intermediate image, the same as for edge enhancement. A commonly known edge-preserving smoothing filter can be used as the filter.

In the case of noise elimination, unlike edge enhancement, a fluctuating noise component appears in both the temporarily interpolated low resolution left parallax image and the right parallax image. In order that noise is not transmitted at the parallax modulation stage, it is desirable that the fluctuating noise component is removed from the low resolution left parallax image and the right parallax image at the stage prior to carrying out parallax modulation.

However, if a sparse parallax pixel array structure is considered such as Embodiment 2 and Embodiment 3, which are described later, the number of non-parallax pixels is largest, and the sparse parallax pixels are present only in intermittent locations. Therefore, the images have the special property that the interpolation values calculated by average interpolation between these points do not include the original high frequency noise component. Therefore, in the case of a sparse parallax pixel array, for a commonly used high sensitivity region of ISO800 or ISO6400, a noise elimination process may be carried out on the intermediate 2D image only. This is described in detail later in Embodiment 4. In a very high sensitivity region of ISO12800 to ISO409600, this fluctuating component is prominent even with sparse parallax pixels. Therefore, it is necessary to remove the fluctuating component.

However, the process to remove the fluctuating component need not be carried out on all the pixels at the actual resolution. After extracting the noise components of a reduced image that has been down sampled to an extent that just one left parallax pixel or right parallax pixel sampled in an image sensor is included in one pixel, the actual resolution may be restored by a variable magnification process and just a subtraction process may be carried out. For example, the multiple resolution noise elimination technology disclosed in Japanese Unexamined Patent Application Publication No. 2006-309749A of the same inventor as the present application can be used. Specifically, a process may be carried out in which multiple resolution conversion is carried out sequentially reducing from high-resolution to low-resolution and at each resolution the noise component is extracted, and these are successively integrated to restore the noise component at the actual resolution, so several stages on the high-resolution side may be omitted. Therefore, for a temporarily interpolated parallax image, all the high resolution side processing, which requires the largest scale of computing in the noise elimination process, may be omitted. Therefore, calculation can be performed that is extremely convenient, in other words, at a high speed in the case of software, and with a small circuit scale in the case of hardware.

<Embodiment 1 >

Bayer Type G parallax Pixel Array, Edge Enhancement

The image processing procedure is generally as follows.

1) Input color and parallax multiplexed mosaic image data

2) Correct the global gain balance of the color parallax mosaic image

3) Generate temporary parallax image

4) Generate color mosaic image with no parallax by performing local brightness distribution correction between the left and right pixels (Local Gain Balance Correction)

5) Generate standard image with no parallax

6) Perform edge enhancement of the standard image with no parallax

7) Generate the actual parallax image

8) Convert to output color space

The following is a description of the procedure.

1) Input color and parallax multiplexed mosaic image data

The single plate format mosaic image with color and parallax multiplexed of FIG. 7: M(x, y)

The gradation is a linear gradation output by A/D conversion. In other words, the pixel values are proportional to the amount of light. This may also be referred to as raw data.

2) Correct the Global Gain Balance of the Color Parallax Mosaic Image

The more the aperture diaphragm is narrowed, the greater not only the difference in the relative distribution between left and right, but also the difference in the average signal level of the whole image produces a problem, for the luminous intensity of the left parallax pixel and the luminous intensity of the right parallax pixel, so at this stage, a gain correction is carried out to adjust the overall brightness. Therefore, using the captured subject image as it is, the average value $\overline{Lt}$ of the pixel value of the left parallax pixels for the whole image and the average value $\overline{Rt}$ of the pixel value of the right parallax pixels for the whole image are calculated. This is based on the assumption that even if there is parallax, the subject image is captured in the same regions of the left and right parallax pixels, so even if a uniform surface has not been captured, it is possible to obtain the necessary signal information for level adjustment from the subject image. Gain correction is carried out to adjust the signal level to the average value as the reference point between left and right. At this stage, two methods can be considered for obtaining the reference point: the arithmetic average and the geometric average.

For convenience, in the mosaic image M(x, y), the signal plane of the left parallax pixel of the G component is taken to be $Lt_{mosaic}(x, y)$, and the signal plane of the right parallax pixel of the G component is taken to be $Rt_{mosaic}(x, y)$.

a) Arithmetic Average

Average value $$\overline{m} = \frac{\overline{Lt} + \overline{Rt}}{2}$$

Gain Value for Left Parallax Pixel $$\overline{g}_{Lt} = \frac{\overline{m}}{\overline{Lt}} = \frac{\overline{Lt} + \overline{Rt}}{2\overline{Lt}}$$

Gain Value for Right Parallax Pixel $$\overline{g}_{Rt} = \frac{\overline{m}}{\overline{Rt}} = \frac{\overline{Lt} + \overline{Rt}}{2\overline{Rt}}$$

Global Gain Correction for Left Parallax Pixel $$Lt'_{mosaic}(x, y) = Lt_{mosaic}(x, y) \cdot \overline{g}_{Lt} = Lt_{mosaic}(x, y) \cdot \frac{\overline{Lt} + \overline{Rt}}{2\overline{L}}$$

Global Gain Correction for Right Parallax Pixel $$Rt'_{mosaic}(x, y) = Rt_{mosaic}(x, y) \cdot \overline{g}_{Rt} = Rt_{mosaic}(x, y) \cdot \frac{\overline{Lt} + \overline{Rt}}{2\overline{Rt}}$$

b) Geometric Average

Average Value $$\overline{m} = \sqrt{\overline{Lt} \cdot \overline{Rt}}$$

Gain Value for Left Parallax Pixel $$\overline{g}_{Lt} = \frac{\overline{m}}{\overline{Lt}} = \frac{\sqrt{\overline{Lt} \cdot \overline{Rt}}}{\overline{Lt}} = \sqrt{\frac{\overline{Rt}}{\overline{Lt}}}$$

Gain Value for Right Parallax Pixel $$\overline{g}_{Rt} = \frac{\overline{m}}{\overline{Lt}} = \frac{\sqrt{\overline{Lt} \cdot \overline{Rt}}}{\overline{Lt}} = \sqrt{\frac{\overline{Rt}}{\overline{Lt}}}$$

Global Gain Correction for Left Parallax Pixel $$Lt'_{mosaic}(x, y) = Lt_{mosaic}(x, y) \cdot \bar{g}_{Lt} = Lt_{mosaic}(x, y) \cdot \sqrt{\frac{\overline{Rt}}{\overline{Lt}}}$$

Global Gain Correction for Right Parallax Pixel $$Rt'_{mosaic}(x, y) = Rt_{mosaic}(x, y) \cdot \bar{g}_{Rt} = Rt_{mosaic}(x, y) \cdot \sqrt{\frac{\overline{Lt}}{\overline{Rt}}}$$

In this embodiment, the arithmetic average is adopted. In this way, the mosaic image that has been corrected with a single gain coefficient for the left parallax pixels and a single gain coefficient for the right parallax pixels is output as M'(x, y). This step can be executed simultaneously with the local gain correction carried out in step 4, so in some cases, it may be omitted.

3) Generate Temporary Parallax Image

A left parallax image and a right parallax image with low spatial frequency resolution capability are generated.

A simple average interpolation within the G color plane in which only the left parallax pixels are gathered is carried out. Using the pixel values of the adjacent pixels, linear interpolation is carried out in accordance with the ratio of distance. Likewise, simple average interpolation within the G color plane in which only the right parallax pixels are gathered is carried out. In other words, from $Lt_{mosaic}(x, y)$, Lt(x, y) is generated, and from $Rt_{mosaic}(x, y)$, Rt(x, y) is generated.

Temporary left parallax image: Lt(x, y)

Temporary right parallax image: Rt(x, y)

When producing the temporary left parallax image Lt(x, y) and the temporary right parallax image Rt(x, y), it may be carried out at high definition introducing directional determination within the signal plane.

4) Generate Color Mosaic Image with No Parallax by Performing Brightness Distribution Correction Between the Left and Right Pixels (Local Gain Balance Correction)

Next, the brightness of the left parallax pixels within the screen and the right parallax pixels within the screen are adjusted by carrying out local gain correction on pixel units, by the same concept as the global gain correction carried out in step 1. In this way, a new Bayer plane is produced with adjusted gain. This is equivalent to replacing with average values to create a Bayer plane with the parallax eliminated. This is written as $M_N(x, y)$.

In this case also, there are two methods of setting the target values to be taken as the reference points for each pixel, the method of selecting the arithmetic average, and the method of selecting the geometric average.

a) Arithmetic Average

Average Value of Each Pixel $$m(x, y) = \frac{Lt(x, y) + Rt(x, y)}{2}$$

Gain Value of Each Pixel for Left Parallax Pixels $$g_{Lt}(x, y) = \frac{m(x, y)}{Lt(x, y)} = \frac{Lt(x, y) + Rt(x, y)}{2Lt(x, y)}$$

Gain Value of Each Pixel for Right Parallax Pixels $$g_{Rt}(x, y) = \frac{m(x, y)}{Rt(x, y)} = \frac{Lt(x, y) + Rt(x, y)}{2Rt(x, y)}$$

Local Gain Correction for Each Pixel for Left Parallax Pixels $$Lt(x,y)\cdot g_{Lt}(x,y)=m(x,y)$$

Local Gain Correction for Each Pixel for Right Parallax Pixels $$Rt(x,y)\cdot g_{Rt}(x,y)=m(x,y)$$

b) Geometric Average

Average Value of Each Pixel $$m(x,y)=\sqrt{Lt(x,y)\cdot Rt(x,y)}$$

Gain Value of Each Pixel for Left Parallax Pixels $$g_{Lt}(x, y) = \frac{m(x, y)}{Lt(x, y)} == \sqrt{\frac{Rt(x, y)}{Lt(x, y)}}$$

Gain Value of Each Pixel for Right Parallax Pixels $$g_{Rt}(x, y) = \frac{m(x, y)}{Rt(x, y)} = \sqrt{\frac{Lt(x, y)}{Rt(x, y)}}$$

Local Gain Correction for Each Pixel for Left Parallax Pixels $$Lt(x,y)\cdot g_{Lt}(x,y)=m(x,y)$$

Local Gain Correction for Each Pixel for Right Parallax Pixels $$Rt(x,y)\cdot g_{Rt}(x,y)=m(x,y)$$

The process of applying the local gain correction to each pixel may be just substituting the average value for each pixel actually initially obtained. What this means is that the local gain correction is a modulation process for eliminating parallax. In this embodiment, the arithmetic average is adopted. In this way, the no-parallax Bayer plane image $M_N(x, y)$ is output by converting the Bayer plane data in such a manner that the average value between the left and right viewpoint images is used as the no-parallax pixel value of the new G pixel position.

5) Generate Standard Image with No Parallax

From this Bayer plane $M_N(x, y)$ with the brightness balance of the G components made uniform and the parallax eliminated in this way, using conventional color interpolation technology, it is possible to generate color images with no parallax having a resolution up to the Nyquist frequency corresponding to the number of pixels of a sensor, as an intermediate image. For example, the interpolation algorithm disclosed in US Patent Application Publication 2010/021853, of the same inventor as the present application is an example of the best commonly known Bayer interpolation technology. In this technology, the best high-performance demosaic technology is introduced comprehensively using technology for image dissection of the vertical and horizontal Nyquist frequency to improve the direction determination resolution capability (U.S. Pat. No. 6,836,572) of the same inventors as the present application, technology for improving the resolution capability of oblique directions when calculating interpolation values (U.S. Pat. No. 7,236,628), technology to counter adaptive spurious colors using a color determination method and technology to increase the resolution capability of direction determination (U.S. Pat. No. 7,565,007), technology to counter adaptive spurious colors using a color gradient determination method (U.S. Pat. No. 7,391,903), and technology to increase the resolution capability of directional determination.

In the following, these are not all described, but just the parts to increase the vertical and horizontal Nyquist resolution and the inclined resolution of the G component which is responsible for brightness, and the part that uses color difference interpolation with the objective of increasing the resolution capability of the R and B components are described.

5-1) Change to Gamma Space by Gradation Conversion

Interpolation values are predicted in gamma space (image processing space) for interpolation by gradation conversion to realize a more uniform noise space, with the objective of carrying out the high resolution Bayer interpolation as described above. This method is introduced in U.S. Pat. No. 7,957,588 of the same inventor as the present application.

The input signal is denoted by x and the output signal is denoted by y, the gradation of the input signal and the gradation of the output signal are both defined in a range [0, 1]. A gradation curve (gamma curve) is defined with input output properties passing through (x, y)=(0, 0) and (1, 1). If the maximum value of the actually input gradation X is Xmax, and the maximum value of the output gradation Y is Ymax, then x=X/Xmax, and y=Y/Ymax, and gradation conversion is carried out by $$Y = Y_{max} \cdot f\left(\frac{X}{X_{max}}\right)$$

where the gradation property y=f(x) is $$y = \frac{\sqrt{x+\varepsilon} - \sqrt{\varepsilon}}{\sqrt{1+\varepsilon} - \sqrt{\varepsilon}}$$

The positive offset value s is set to a larger value, the higher the sensitivity of the image-capturing conditions in which the dark current noise component increases.

5-2) Color Interpolation Process

Regarding the color interpolation process, just the simple process disclosed in U.S. Pat. No. 7,957,588 (WO2006/006373) of the same inventor as the present application is transcribed once again. However, the explanation is carried out using the symbols [i, j] for (x, y). Also, the G component on the $M_N$ plane after gradation conversion is denoted by G and the R and B components are denoted by Z.

In step S4, the CPU carries out the interpolation process as follows. Here, the pixel having the color information of the R component is referred to as the R pixel, the pixel having the color information of the B component is referred to as the B pixel, and the pixel having the color information of the G component is referred to as the G pixel, the signal value of the R component corresponding to the pixel indicated by the pixel position [i, j] in the interpolation process is represented as R[i, j], the signal value of the G component is represented as G[i, j], and the signal value of the B component is represented as B[i, j].

(Direction Determination)

For pixels that are not G pixels indicated by the pixel position [i, j](R pixels or B pixels), the CPU calculates the vertical direction degree of similarity CvN[i, j] and the horizontal direction degree of similarity ChN[i, j] from the following equations (3) and (4).

[Formula A]

$$Cv[i,j]=\{|G[i,j-1]-G[i,j+1]|+(|G[i,j-1]-Z[i,j]|+|G[i,j+1]-Z[i,j]|)/2\}/2 \quad (3)$$

$$Ch[i,j]=\{|G[i-1,j]-G[i+1,j]|+(|G[i-1,j]-Z[i,j]|+|G[i+1,j]-Z[i,j]|)/2\}/2 \quad (4)$$

where Z[i, j] is the signal value of the R component or the B component indicated by the pixel position [i, j]. The first term is the degree of similarity between the same color representing the degree of similarity between the same color of 2 pixel interval, and the second term is the degree of similarity between different colors representing the degree of similarity between different colors of adjacent pixel intervals. The degree of similarity between different colors has the capacity to resolve the vertical and horizontal Nyquist frequency.

In equations (3) and (4), the absolute value of the first term detects the general direction by comparing G color components. The absolute values of the second term and the third term of the above equations (3) and (4) detect the detailed similarity that cannot be detected with the first term. The CPU calculates for each coordinates the degree of similarity in the vertical direction and the degree of similarity in the horizontal direction obtained from the above equations (3) and (4), and determines the direction of the similarity from equation (5) based on the vertical and horizontal degrees of similarity at the target coordinates [i, j].

[Formula B]

$$\left.\begin{array}{lll} \text{if } |Cv[i,j]-Ch[i,j]| \le Th & HV[i,j]=0 \\ \text{else if } Cv[i,j] < Ch[i,j] & HV[i,j]=1 \\ \text{else} & HV[i,j]=-1 \end{array}\right\} \quad (5)$$

However, Th is a determination threshold value used for the purpose of avoiding erroneous determination due to noise included in the signal value, and varies in accordance with the ISO sensitivity described above. HV[i, j] represents the direction of the similarity for the pixel position [i, j], and when HV[i, j]=0, the vertical and horizontal directions are similar, when HV[i, j]=1, the vertical direction is similar, and when HV[i. j]=−1, the horizontal direction is similar.

(G Interpolation)

Based on the determined similarity direction, the CPU interpolates the G component using the unevenness information of the R component or the B component. In other words, it is possible to obtain information whether or not interpolation should be to an external dividing point which cannot be predicted using internal dividing point interpolation of the surrounding G components only by looking at the information on the other color components at the interpolation target position and the same color component information at nearby positions, and determining whether or not the image structure is convex upwards or convex downwards. In other words, the information on the high frequency component obtained by sampling the other color components is superimposed onto the interpolation target color component. G color supplementation is calculated in the case of vertical direction similarity from the equations (6) and (9) for the position [i, j] of the center of the R pixel indicated in FIG. 4 of WO2006/006373, for example, and in the case of horizontal direction similarity is calculated from equations (7) and (10). The pixel position in the case of G color interpolation for the position of the B pixel is shown in FIG. 5 of WO2006/006373.

[Formula C]

$$\text{When } HV[i,j]=1\; G[i,j]=Gv[i,j] \tag{6}$$

$$\text{When } HV[i,j]=-1\; G[i,j]=Gh[i,j] \tag{7}$$

$$\text{When } HV[i,j]=0\; G[i,j]=(Gv[i,j]+Gh[i,j])/ \tag{8}$$

$$Gv[i,j]=(G[i,j-1]+G[i,j+1])/2+(2\times Z[i,j]-Z[i,j-2]-Z[i,j+2])/4 \tag{9}$$

$$Gh[i,j]=(G[i-1,j]+G[i+1,j])/2+(2\times Z[i,j]-Z[i-2,j]-Z[i+2,j])/4 \tag{10}$$

Where, Z[i, j] is the signal value of the R component or the B component indicated by the pixel position [i, j]. Adding the second order differential correction term due to the other color components of the second term to the average value of the color component of the interpolation target of the first term has the action of increasing the spatial resolution capability in the inclined directions.

The first term in equation (9) represents the average value calculated from the signal values G[i, j−1] and G[i, j+1] of the G components aligned vertically with respect to the pixel position [i, j]. The second term in equation (9) represents the amount of change calculated from the signal values R[i, j], R[i, j−2], and R[i, j+2] of the R components aligned vertically. By adding the amount of change in the signal value of the R component to the average value of the signal value of the G component, the interpolation values G[i, j] of the G component can be obtained. This type of interpolation can also be predicted in the case of other than the internally dividing points of the G component, so for convenience, it is referred to as extrapolation interpolation.

Equation (10) above carries out extrapolation interpolation in the horizontal direction using the signal values of the pixels aligned horizontally with respect to the pixel position [i, j], in the same way as the extrapolation interpolation in the vertical direction as described above. If the similarity directions are classified as both the vertical and horizontal directions, the CPU calculates the G color interpolation values from the above equations (9) and (10), and takes the average of the two calculated G color interpolation values as the G color interpolation value.

(R Interpolation)

R color interpolation is calculated from the equations (11) to (13) for pixel positions [i+1, j], [i, j+1], [i+1, j+1] other than the position [i, j] of the R pixel shown in FIG. 6 of WO2006/006373, for example. At this time, the unevenness information of the G component signal values (FIG. 7 of WO2006/006373) corresponding to all the pixel positions obtained by G interpolation as described above is used.

[Formula D]

$$R[i+1,j]=(R[i,j]+R[i+2,j])/2+(2\times G[i+1,j]-G[i,j]-G[i+2,j])/2 \tag{11}$$

$$R[i,j+1]=(R[i,j]+R[i,j+2])/2+(2\times G[i,j+1]-G[i,j]-G[i,j+2])/2 \tag{12}$$

$$R[i+1,j+1]=(R[i,j]+R[i+2,j]+R[i,j+2]+R[i+2,j+2])/4+(2\times G[i+1,j+1]-G[i,j]-G[i+2,j]-G[i,j+2]-G[i+2,j+2])/4 \tag{13}$$

The first term in the above equations (11) to (13) represents the average value calculated from the R component signal values adjacent to the coordinates of the target of the R component interpolation, and the second term in the above equations (11) to (13) represents the amount of variation calculated from the G component signal values of the coordinates of the target of the R component interpolation and the adjacent coordinates. In other words, the R component interpolation value is obtained by adding the amount of variation of the signal value of the G component to the average value of the R component signal value, in the same way as for the extrapolation interpolation carried out for the G interpolation. This is equivalent to the method of generating the color difference Cr=R−G at the R position, and carrying out average interpolation within the color difference plane.

(B Interpolation)

B component interpolation is carried out by the same interpolation process as for the R component. For instance, pixel positions [i+1, j], [i, j+1], [i+1, j+1] other than the position [i, j] of the B pixel indicated in FIG. 8 of WO2006/006373 are calculated using equations (14) to (16). At this time, the unevenness information of the G component signal values (FIG. 9 of WO2006/006373) corresponding to all of the pixel positions obtained in the G interpolation as described above is used.

[Formula E]

$$B[i+1,j]=(B[i,j]+B[i+2,j])/2+(2\times G[i+1,j]-G[i,j]-G[i+2,j])/2 \tag{14}$$

$$B[i,j+1]=(B[i,j]+B[i,j+2])/2+(2\times G[i,j+1]-G[i,j]-G[i,j+2])/2 \tag{15}$$

$$B[i+1,j+1]=(B[i,j]+B[i+2,j]+B[i,j+2]+B[i+2,j+2])/4+(2\times G[i+1,j+1]-G[i,j]-G[i+2,j]-G[i,j+2]-G[i+2,j+2])/4 \tag{16}$$

In accordance with the above equations (14) to (16), the B component interpolation value is obtained by adding the amount of variation of the G component signal value to the average value of the B component signal value. This is equivalent to the method of generating the color difference Cb=B−G at the B position, and carrying out average interpolation within the color difference plane. The sampling frequency of the R component and the B component is low compared with the G component, so the high frequency component of the G component signal value is reflected using the color difference R-G, and the color difference B−G. Therefore, interpolation of this type of chromatic component is referred to for convenience as color difference interpolation.

6) Perform Edge Enhancement of the Standard Image with No Parallax 6-1) Color Space Conversion Process The RGB color images with no parallax obtained by the Bayer interpolation in step 5 are represented as $R_N\Gamma(x, y)$, $G_N\Gamma(x, y)$, and $B_N\Gamma(x, y)$. These are the RGB data representing the gradation in the interpolation gamma space. These RGB data are converted into the color coordinate system YCbCr which represents brightness and color differences.

$$Y(x,y)=0.2990R_N\Gamma(x,y)+0.5870G_N\Gamma(x,y)+0.1140B_N\Gamma(x,y)$$

$$Cb(x,y)=-0.1684R_N\Gamma(x,y)-0.3316G_N\Gamma(x,y)+0.5000B_N\Gamma(x,y)$$

$$Cr(x,y)=0.5000R_N\Gamma(x,y)-0.4187G_N\Gamma(x,y)-0.0813B_N\Gamma(x,y)$$

6-2) Edge Enhancement Process

An edge enhancement process is carried out with respect to the brightness Y plane.

$$Y'(x,y)=Y(x,y)+k*\Delta Y(x,y)$$

Here, Δ represents a Laplacian filter representing second-order differentiation. The constant k is a parameter for adjusting the extent of edge enhancement. For example, the following filter coefficients can be considered as the Laplacian filter, but this is not a limitation.

$$\Delta = \frac{1}{144}\cdot\begin{matrix} -1 & -3 & -4 & -3 & -1 \\ -3 & -10 & -15 & -10 & -3 \\ -4 & -15 & 144 & -15 & -4 \\ -3 & -10 & -15 & -10 & -3 \\ -1 & -3 & -4 & -3 & -1 \end{matrix}$$

6-3) Inverse Color Space Conversion Process

Using the edge enhanced brightness component Y'(x, y) and the unchanged color difference component Cb(x, y), Cr(x, y), the RGB space is restored from the YCbCr space. All that is necessary is to multiply by the inverse matrix of step 6-1). The definition is the same as that adopted for JPEG, so its description is omitted here.

6-4) Transformation to the Original Linear Gradation Space by Inverse Gradation Conversion The inverse gradation conversion of step 5-1 is carried out on each of the RGB color planes for which Bayer interpolation and edge enhancement processing has been carried out, to restore the linear relation RGB data.

$$X = X_{max}\cdot f^{-1}\left(\frac{Y}{Y_{max}}\right)$$

The RGB color images with no parallax obtained in this way are represented as $R_N(x, y)$, $G_N(x, y)$, and $B_N(x, y)$. These are the RGB data represented by linear gradation.

7) Generate the Actual Parallax Image

Using the low resolution capability temporary left parallax image Lt(x, y) generated in step 3, and the color image with no parallax and high resolution capability generated as an intermediate process in step 5 $R_N(x, y)$, $G_N(x, y)$, $B_N(x, y)$, the actually output high resolution capability color images with left parallax $R_N(x, y)$, $G_N(x, y)$, and $B_N(x, y)$ are generated. Likewise, using the temporary right parallax image with low resolution capability generated in step 3 Rt(x, y), and the color image with no parallax and high-resolution capability generated as an intermediate process in step 5 $R_N(x, y)$, $G_N(x, y)$, $B_N(x, y)$, the actually output right parallax color images with high-resolution capability $R_{Rt}(x, y)$, $G_{Rt}(x, y)$, $B_{R1}(x, y)$ are generated. This achieves displacement processing by superimposing the parallax component of the temporary parallax images, so it can be referred to as parallax modulation.

Two methods can be considered for the method of parallax modulation: the method using the arithmetic average as the reference point; and the method using the geometric average as a reference point. Both methods are capable of obtaining the parallax modulation effect, but the method using the arithmetic mean as the reference point may be adopted when the aperture mask of the non-parallax pixel of the image sensor is fully open, and the method of using the geometric average as the reference point may be adopted when the aperture mask of the non-parallax pixel is half open, the same as the pixel with parallax. Therefore, in this embodiment, the method of using the arithmetic average as a reference point is used.

a) Parallax Modulation Using the Arithmetic Average as a Reference Point

Left Parallax Modulation $$R_{Lt}(x, y) = R_N(x, y)\frac{2Lt(x, y)}{Lt(x, y) + Rt(x, y)}$$

$$G_{Lt}(x, y) = G_N(x, y)\frac{2Lt(x, y)}{Lt(x, y) + Rt(x, y)}$$

$$B_{Lt}(x, y) = B_N(x, y)\frac{2Lt(x, y)}{Lt(x, y) + Rt(x, y)}$$

Right Parallax Modulation $$R_{Rt}(x, y) = R_N(x, y)\frac{2Rt(x, y)}{Lt(x, y) + Rt(x, y)}$$

$$G_{Rt}(x, y) = G_N(x, y)\frac{2Rt(x, y)}{Lt(x, y) + Rt(x, y)}$$

$$B_{Rt}(x, y) = B_N(x, y)\frac{2Rt(x, y)}{Lt(x, y) + Rt(x, y)}$$

b) Parallax Modulation Using the Geometric Average as a Reference Point

Left Parallax Modulation $$R_{Lt}(x, y) = R_N(x, y)\frac{Lt(x, y)}{\sqrt{Lt(x, y)\cdot Rt(x, y)}} = R_N(x, y)\sqrt{\frac{Lt(x, y)}{Rt(x, y)}}$$

$$G_{Lt}(x, y) = G_N(x, y)\frac{Lt(x, y)}{\sqrt{Lt(x, y)\cdot Rt(x, y)}} = G_N(x, y)\sqrt{\frac{Lt(x, y)}{Rt(x, y)}}$$

$$B_{Lt}(x, y) = B_N(x, y)\frac{Lt(x, y)}{\sqrt{Lt(x, y)\cdot Rt(x, y)}} = B_N(x, y)\sqrt{\frac{Lt(x, y)}{Rt(x, y)}}$$

Right Parallax Modulation $$R_{Rt}(x, y) = R_N(x, y)\frac{Rt(x, y)}{\sqrt{Lt(x, y)\cdot Rt(x, y)}} = R_N(x, y)\sqrt{\frac{Rt(x, y)}{Lt(x, y)}}$$

$$G_{Rt}(x, y) = G_N(x, y)\frac{Rt(x, y)}{\sqrt{Lt(x, y)\cdot Rt(x, y)}} = G_N(x, y)\sqrt{\frac{Rt(x, y)}{Lt(x, y)}}$$

$$B_{Rt}(x, y) = B_N(x, y)\frac{Rt(x, y)}{\sqrt{Lt(x, y)\cdot Rt(x, y)}} = B_N(x, y)\sqrt{\frac{Rt(x, y)}{Lt(x, y)}}$$

In this way, it can be seen that modulation is carried out by multiplying terms that are in an exact inverse proportional relationship between the parallax modulation calculation equation defined in step 7 and the parallax elimination calculation equation for correcting brightness unevenness between left and right (local gain balance correction) defined in step 4. Therefore, in step 7, modulation acts on the direction of adding parallax, and in step 4, modulation acts on the direction of eliminating parallax.

8) Convert to Output Color Space

Each of the high-resolution intermediate color images with no parallax $R_N(x, y)$, $G_N(x, y)$, $B_N(x, y)$, the high resolution left parallax color images $R_{Lt}(x, y)$, $G_{Lt}(x, y)$, $B_{Lt}(x, y)$, and the high resolution right parallax color images $R_{Rt}(x, y)$, $G_{Rt}(x, y)$, $B_{Rt}(x, y)$ obtained in this way are converted into the standard sRGB color space from the camera RGB with sensor spectral properties by color matrix conversion and gamma conversion to output the images as output color space images. As a result of the above, edge enhanced high definition 2D images and 3D images are generated.

<Additional Description of Embodiment 1>

Figure 11:
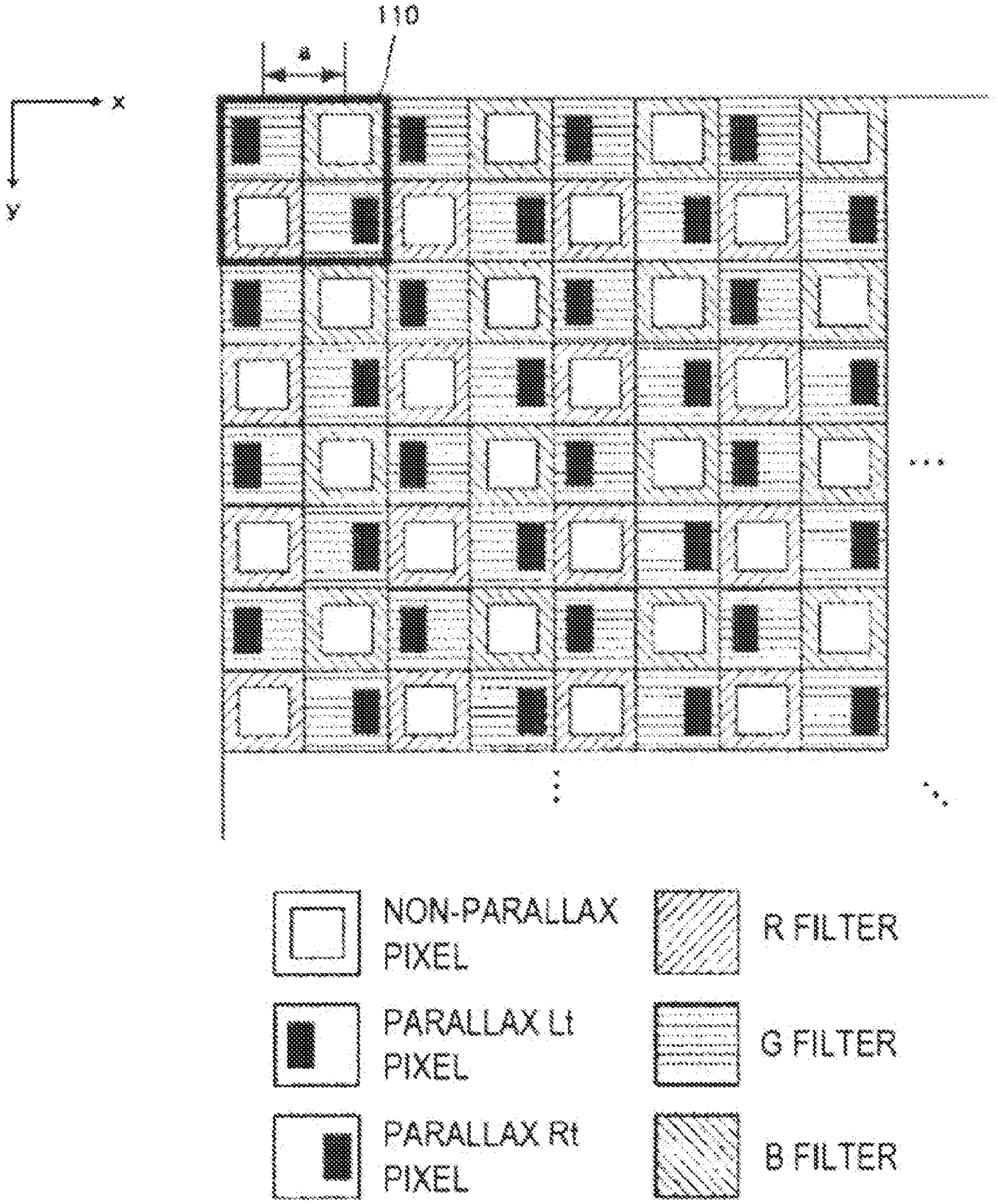
FIG. 11 shows an example of the variation of a repeating pattern 110 in the case that there are two types of parallax pixels.

FIG. 11 shows an example of a repeating pattern 110 in the case that there are two types of parallax pixels. The coordinate system of the digital camera 10 has been defined as the X axis, the Y axis, and the Z axis, in the image sensor 100, the right direction is defined as the X axis, and the downward direction is defined as the Y axis, with reference to the left most and uppermost pixel. In the example shown on the drawing, the four pixels are adopted as the repeating pattern 110, the same as for the Bayer array. This repeating pattern 110 is arranged periodically top to bottom and left to right in the effective pixel area of the image sensor 100. In other words, the image sensor 100 uses the repeating pattern 110 indicated by the thick line in the drawing as a primitive lattice. The R pixel and the B pixel are non-parallax pixels, the Gb pixel is allocated as a parallax L pixel, and the Gr pixel is allocated as a parallax R pixel. In this case, when the subject is in the focus position, the aperture portion 104 is defined so that the parallax Lt pixel and the parallax Rt pixel included in the same repeating pattern 110 receive the light flux irradiated from the same micro region. Also, in this example, as described for FIG. 6A, the non-parallax pixel has an aperture portion that is fully open, and the parallax Lt pixel and the parallax Rt pixel have an aperture portion that is half open. The pixel pitch is taken to be "a".

In the example shown on the drawing, the Gb pixel and the Gr pixel which are green pixels with high luminosity factor are used as parallax pixels, so parallax images with high contrast can be expected to be obtained. Also, the Gb pixel and the Gr pixel which are the same green pixels are used as parallax pixels, so a conversion calculation to an output with no parallax can be easily carried out from these two outputs, so the R pixel and the B pixel which are non-parallax pixels can be output, and it is possible to generate high image quality 2D image data.

FIG. 7 (bottom part) shows the resolution capability regarding the spatial frequency of images captured by the image sensor that adopts the repeating pattern 110 shown in FIG. 11. In FIG. 7 (bottom part), the resolution capability for the spatial frequency is represented by k-space of the frequency k represented by $k=2\pi f$. However, f represents frequency. The frequency resolution region is described by the first Brillouin zone representing a unit cell (Wigner-Seitz cell) of the reciprocal lattice space.

If the pixel pitch is taken to be "a" as discussed above, and if the color filter and the aperture mask are not arranged, the captured images have a resolution capability in the range of the Nyquist frequency enclosed by the dotted line $k_x=[-\pi/a, +\pi/a]$, $ky=[-\pi/a, +\pi/a]$. In other words, the range enclosed by the dotted line is the limiting resolution frequency of the image. However, in this embodiment, the color filter and the aperture mask are arranged superimposed on a single sensor surface. The information that can be taken on a single sensor surface is constant, so the amount of information is reduced by dividing the function. For example, by forming a parallax pixel with the aperture mask, the relative number of non-parallax pixels is reduced, so the amount of information that can be obtained by the non-parallax pixels is reduced. Similarly for the color filter, by just dividing into the three R, G, and B, the individual amounts of information are reduced.

Therefore, focusing on a specific color image in a specific aperture mask, the limiting resolution frequency of the image does not reach the original Nyquist frequency. Specifically, as shown in the drawings, for example, the left side view point G component image $G_{Lt}$ has only the resolution capability of the region which is half the original Nyquist frequency with respect to both directions on the $k_x$ axis and the $k_y$ axis, or the range $k_x=[-\pi/(2a), +\pi/(2a)]$, $k_y=[-\pi(2a), +\pi/(2a)]$. Likewise for the right view point G component image $G_{Rt}$, the intermediate view point R component image with no parallax $R_N$, and the intermediate view point B component image with no parallax $B_N$.

Therefore, if the left side view point RGB color image and the right side view point RGB color image are generated as they are, the resolution capability of these images will be the range $k_x=[\pi/(2a), -\pi/(2a)]$, $k_y=[-\pi(2a), +\pi/(2a)]$. In other words, these images do not have the resolution capability in the range of the original Nyquist frequency $k_x=[-\pi/a, +\pi/a]$, $k_y=[-\pi/a, +\pi/a]$.

In this embodiment, the image processor 205 performs a process to increase the resolution in order to compensate for the reduced amount of information due to dividing the functions. Specifically, the parallax pixels $G_{Lt}$ pixels and $G_{Rt}$ pixels are replaced with virtual non-parallax pixels $G_N$, to generate a Bayer array of non-parallax pixels only. As a result, using existing Bayer interpolation technology, it is possible to generate color images having a resolution capability in the range of the original Nyquist frequency $k_x=[-\pi/a, +\pi/a]$, $k_y=[-\pi/a, +\pi/a]$ as intermediate images with no parallax. In addition, by thereafter superimposing in frequency space the left view point image having only small resolution and the intermediate image with no parallax, ultimately it is possible to generate the left side view point color image having resolution capability in the range of the original Nyquist frequency. Likewise for the right side view point color image.

Each of the pixels in the pixel array shown in FIG. 11 is characterized by various combinations of parallax pixels and non-parallax pixels focused on the aperture portion 104, and R pixels, G pixels, and B pixels focused on the color filter 102. Therefore, if the output of the image sensor 100 is brought into coincidence with this pixel array and enumerated as it is, image data representing a specific image will not be obtained. In other words, only if the pixel output of the image sensor 100 is divided into pixel groups each having the same characteristics and brought together, image data representing a single image in accordance with these characteristics is formed. For example, if the output of a parallax pixel is brought together with its type of aperture portion, a plurality of pieces of parallax image data can be obtained each having a parallax. The image data for each pixel group having the same characteristics that are separated and brought together is referred to as plane data.

The interpolation processing unit 231 of the image processor 205 receives mosaic image data $M_{mosaic}(x, y)$ which is raw original image data enumerating the output values in the order of the pixel array of the image sensor 100. Here, a mosaic image refers to an image in which each pixel is lacking information on at least one of R, G, and B, and the data forming a mosaic image is referred to as mosaic image data. However, even if each pixel is lacking information on at least one of R, G, and B, if it cannot be treated as the image, for example, if the image data is composed of pixel values of pixels with a single color, it cannot be treated as a mosaic image. Each output value is a linear gradation value proportional to the amount of light received by each of the photoelectric converting elements of the image sensor 100.

In this embodiment, the interpolation processing unit 231 of the image processor 205 carries out gain correction in order to coordinate the overall brightness between left and right at this stage. This is because the more the aperture diaphragm is narrowed, the greater the difference produced not only in the relative distribution between left and right, but also in the average signal level of the overall image, for the luminous intensity of the light incident on the left parallax pixel and the luminous intensity of the light incident on the right parallax pixel. In this embodiment, the gain correction to coordinate the overall brightness between left and right is referred to as the global gain correction.

Figure 12:
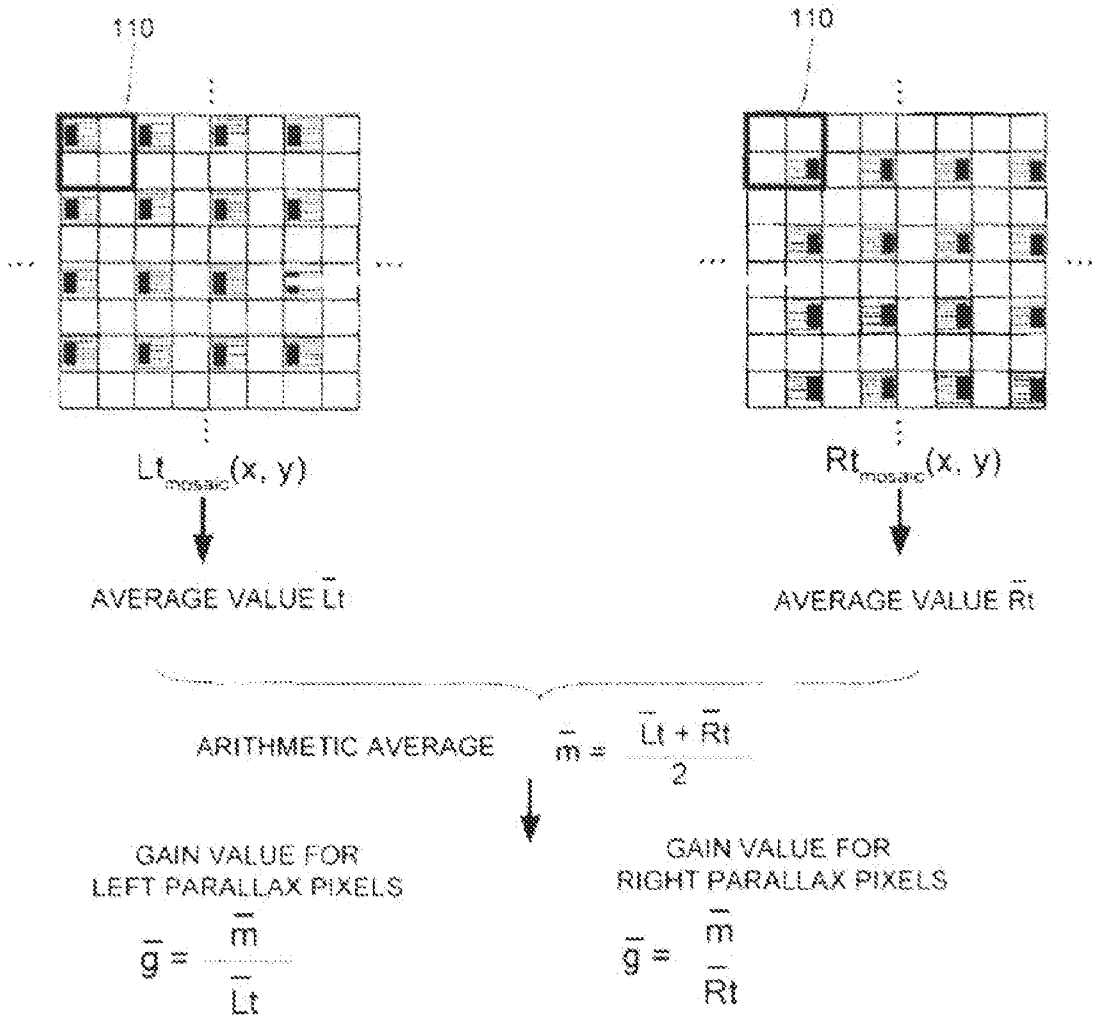
FIG. 12 describes the calculation of the gain value.

FIG. 12 describes the calculation of the gain value. For convenience, in the mosaic image data $M_{mosaic}(x, y)$, the G component left parallax pixel mosaic image data is represented as $Lt_{mosaic}(x, y)$, the G component right parallax pixel mosaic image data is represented as $Rt_{mosaic}(x, y)$, and in FIG. 12, only to the left and right parallax pixels are extracted and shown. However, in the drawing, the types of pixels in accordance with the example of FIG. 11 are shown for ease of understanding, but actually the output values are arranged in accordance with each pixel.

Figure 13:
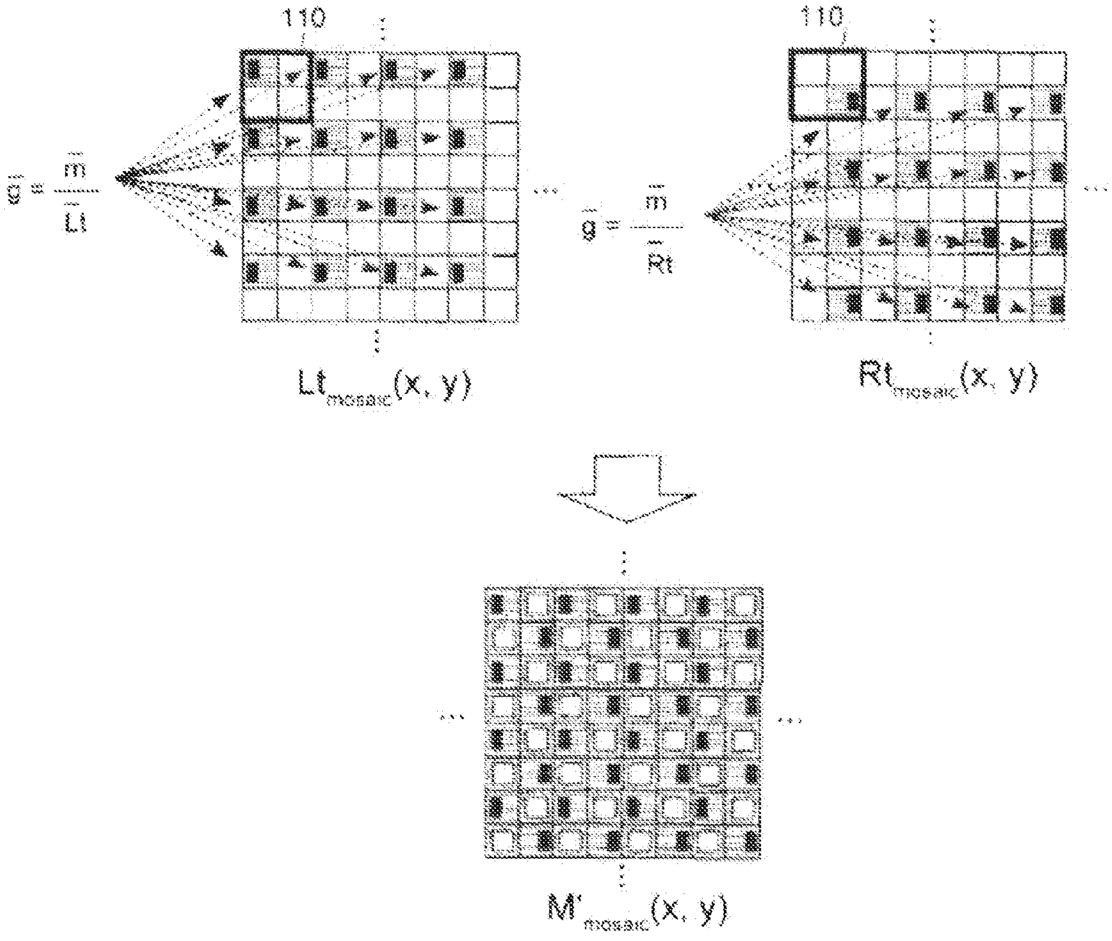
FIG. 13 describes the gain correction.

FIG. 13 describes the gain correction. When the interpolation processing unit 231 of the image processor 205 calculates the gain values for the left and right parallax pixels, gain correction is carried out using the calculated gain value for each pixel of the $Lt_{mosaic}(x, y)$ and the $Rt_{mosaic}(x, y)$. Specifically, the gain correction is applied to the left parallax pixel in accordance with the following (Formula 1), and the gain correction is applied to the right parallax pixel in accordance with (Formula 2). For convenience, in the mosaic image data $M'_{mosaic}(x, y)$, the G component left parallax pixel mosaic image data is represented as $Lt'_{mosaic}(x, y)$, and the G component right parallax pixel mosaic image data is represented as $Rt'_{mosaic}(x, y)$.

$$Lt'_{mosaic}(x, y) = Lt_{mosaic}(x, y) \cdot \bar{g}_{Lt} = Lt_{mosaic}(x, y) \cdot \frac{\overline{Lt} + \overline{Rt}}{2\overline{Lt}} \quad \text{[Formula 1]}$$

$$Rt'_{mosaic}(x, y) = Rt_{mosaic}(x, y) \cdot \bar{g}_{Rt} = Rt_{mosaic}(x, y) \cdot \frac{\overline{Lt} + \overline{Rt}}{2\overline{Rt}} \quad \text{[Formula 2]}$$

In this way, as shown in the drawing, the interpolation processing unit 231 of the image processor 205 can generate the mosaic image data $M'_{mosaic}(x, y)$ in which the left parallax pixels and the right parallax pixels within the $M_{mosaic}(x, y)$ have been corrected each with a single gain coefficient. Next, the interpolation processing unit 231 of the image processor 205 generates a left parallax image and a right parallax image with low spatial frequency resolution, as temporary parallax images.

Figure 14:
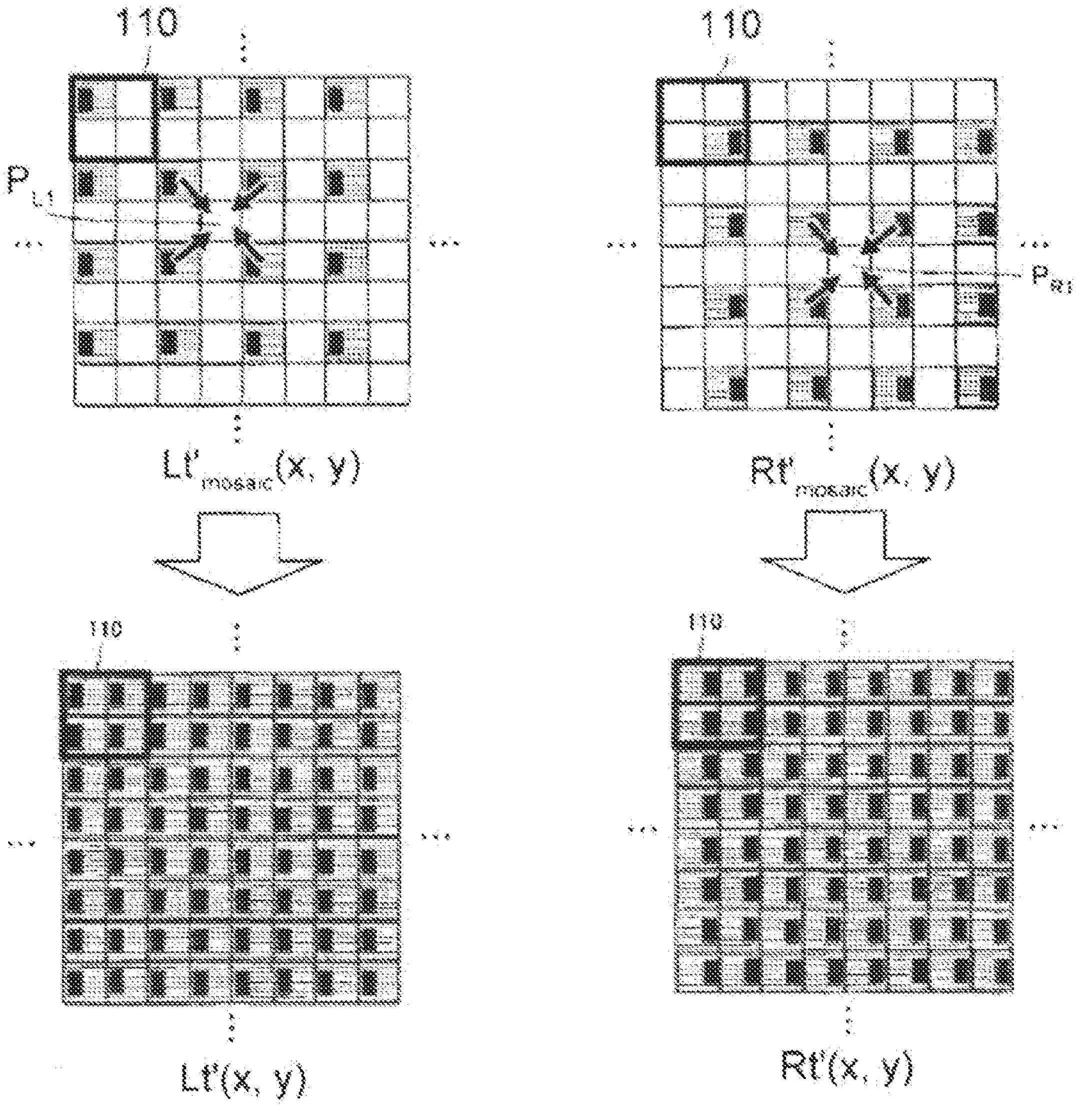
FIG. 14 describes the generation of temporary parallax images.

FIG. 14 describes the generation of the temporary parallax images. The interpolation processing unit 231 of the image processor 205 first separates the mosaic image data $M'_{mosaic}(x, y)$ into a plurality of plane data. At this time, there are output values in each of the plane data only at pixel positions where there are output values in the raw original image data. Therefore, the interpolation processing unit 231 of the image processor 205 carries out interpolation processing based on each of the plane data, to generate plane data in which the empty lattices are filled.

In FIG. 14, the left side of the top shows the plane data $Lt'_{mosaic}(x, y)$ in which the left parallax pixels only have been extracted from the mosaic image data $M'_{mosaic}(x, y)$, and the right side shows the plane data $Rt'_{mosaic}(x, y)$ in which only the right parallax pixels have been extracted from the mosaic image data $M'_{mosaic}(x, y)$. In each of the drawings, the types of pixels in accordance with the example of FIG. 11 are shown for ease of understanding, but actually the output values are arranged in accordance with each pixel.

When generating the low spatial frequency resolution left parallax image data Lt'(x, y), the interpolation processing unit 231 of the image processor 205 calculates in an interpolation process the pixel values of the empty lattices using the pixel values of the nearby left parallax pixels. For example, the pixel value of the empty lattice $P_{L1}$ is calculated by calculating the average of the pixel values of the adjacent four left parallax pixels in the diagonal directions. By carrying out the interpolation process by calculating the average of the pixel values of the nearby left parallax pixels for all of the empty lattices, the interpolation processing unit 231 of the image processor 205 generates the plane data Lt'(x, y) in which the empty lattices are filled, as shown in the bottom left of FIG. 14. The interpolation processing unit 231 of the image processor 205 may carry out additional interpolation processing using the pixel values calculated in the interpolation process, and may carry out interpolation processing using only the output values that exist at the stage of the raw original image data.

Likewise, when generating the low spatial frequency resolution right parallax image data Rt'(x, y), the interpolation processing unit 231 of the image processor 205 calculates in the interpolation process the pixel values of the empty lattices using the pixel values of the nearby right parallax pixels. For example, the pixel value of the empty lattice $P_{R1}$ is calculated by calculating the average of the pixel values of the adjacent four right parallax pixels in the diagonal directions. By carrying out the interpolation process by calculating the average of the pixel values of the nearby right parallax pixels for all of the empty lattices, the interpolation processing unit 231 of the image processor 205 generates the plane data Rt'(x, y) in which the empty lattices are filled, as shown in the bottom right of FIG. 14.

Next, the standard image data generating unit 232 of the image processor 205 carries out gain correction for each pixel of Lt'(x, y) using their respective calculated gain values, and likewise carries out gain correction for each pixel of Rt'(x, y) using their respective calculated gain values. In this way, the brightness of the left parallax pixels and the right parallax pixels in the same pixel position are adjusted. In this embodiment, gain correction carried out in this way using the gain values calculated in pixel units is referred to as local gain correction, in contrast to the global gain correction as described above.

Figure 15:
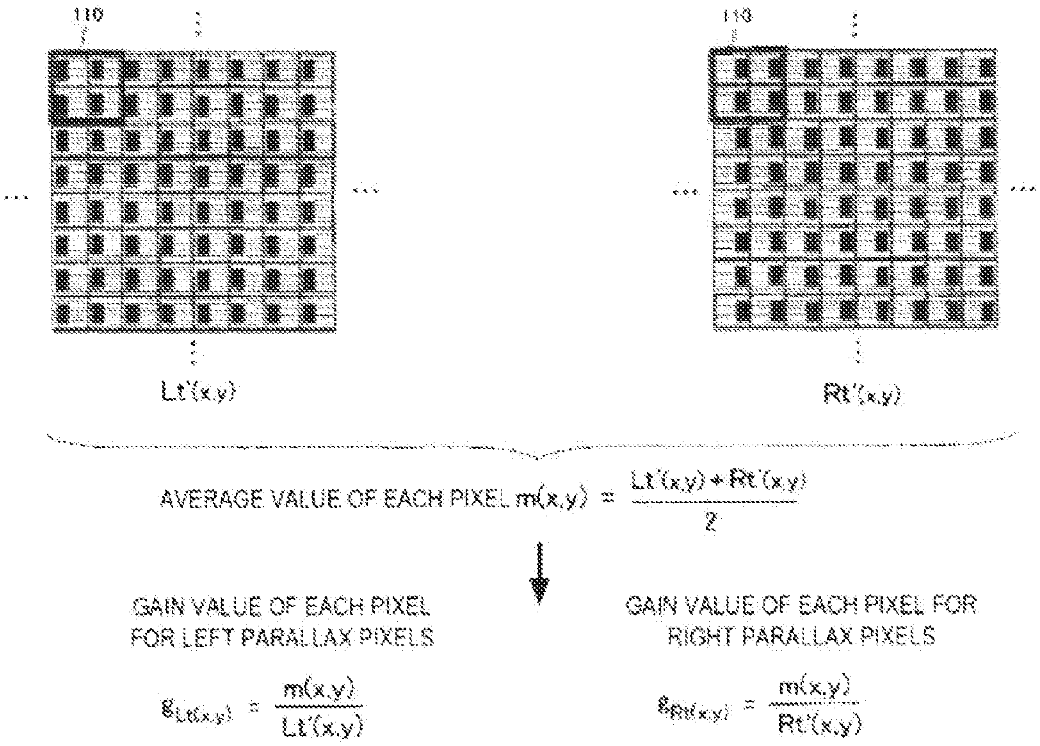
FIG. 15 describes the calculation of the gain value.

FIG. 15 describes the calculation of the gain value. As shown in the drawing, the standard image data generating unit 232 of the image processor 205 calculates the average value of each pixel from Lt'(x, y) and Rt'(x, y). In carrying out the local gain correction, in this case, also two methods can be considered for calculating the average value: the arithmetic average and the geometric average. Here, the arithmetic average is adopted in order that the width of blurring of the subject image in the G component non-parallax pixels from which the parallax has been eliminated is matched with the width of blurring of the subject image of the non-parallax pixels. In this case, specifically, the standard image data generating unit 232 of the image processor 205 calculates the average value from the following (Formula 3).

$$m(x, y) = \frac{Lt'(x, y) + Rt'(x, y)}{2} \quad \text{[Formula 3]}$$

Figure 16:
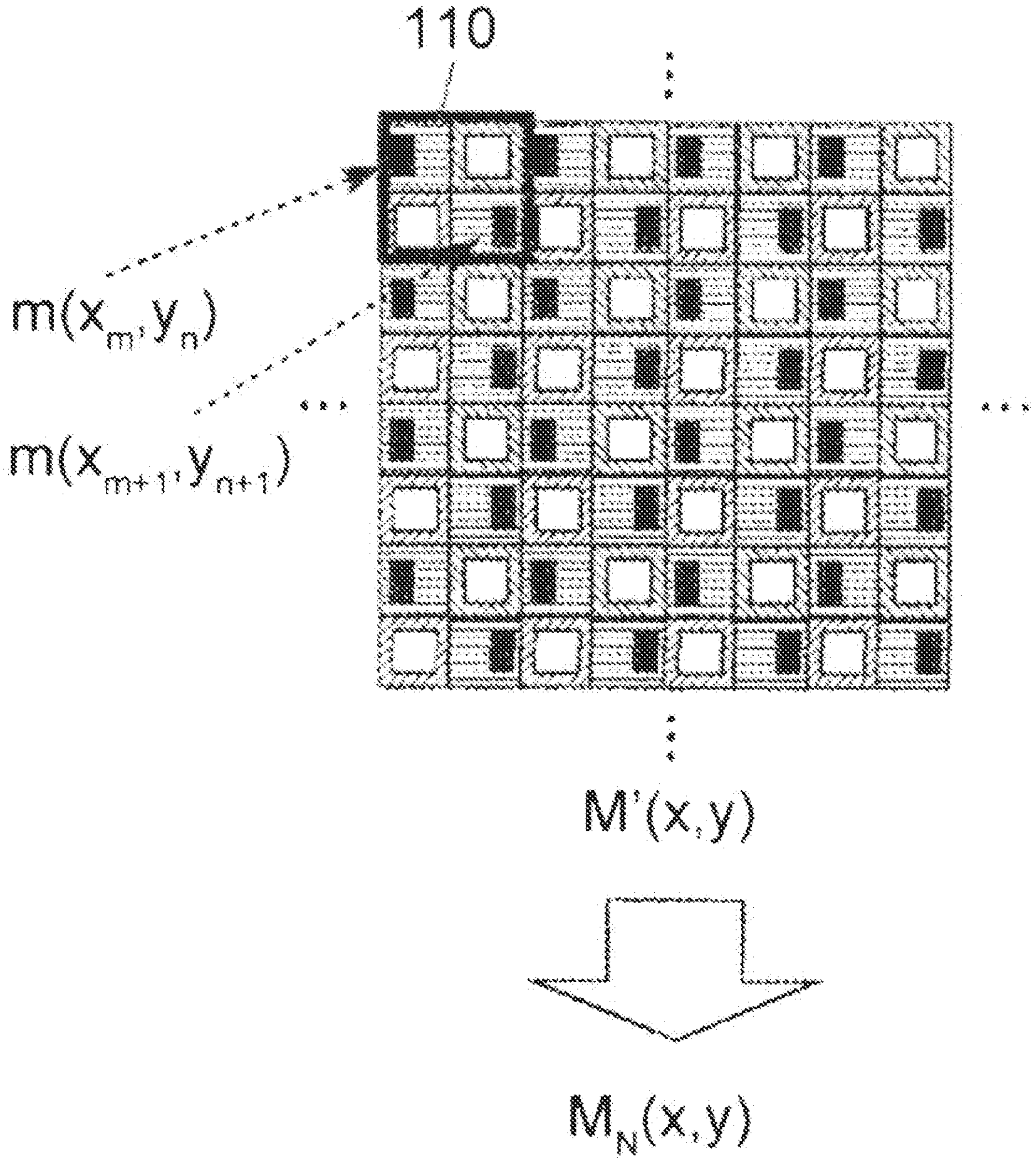
FIG. 16 describes the local gain correction.

FIG. 16 describes the local gain correction. As described above, average values are obtained in the process of carrying out local gain correction for each pixel. Therefore, as shown in the drawing, the standard image data generating unit 232 of the image processor 205 can carry out the local gain correction by just replacing each of the pixel values of the left and right parallax pixels of the repeating pattern 110 with the $m(x_m, y_n)$, and $m(x_{m+1}, y_{n+1})$ calculated from (Formula 3). What this means is that the local gain correction is a modulation process for eliminating parallax. As a result, it is possible to obtain a Bayer array in which the pixel values of the parallax Gb pixels and the parallax Gr pixels are replaced with pixel values of non-parallax G pixels.

The standard image data generating unit 232 of the image processor 205 generates the $M_N(x, y)$ by replacing all the pixel values of the left and right parallax pixels with the corresponding average values calculated from (Formula 3). The local gain correction does not have to be carried out on all the pixels of Lt'(x, y) and Rt'(x, y), and it may be carried out on the pixels corresponding to the positions of the left parallax pixels and the right parallax pixels in the Bayer array.

Next, using existing color interpolation technology, the standard image data generating unit 232 of the image processor 205 generates color image data with no parallax having resolution capability to the Nyquist frequency of each pixel from the $M_N(x, y)$ as the intermediate image data.

Figure 17:
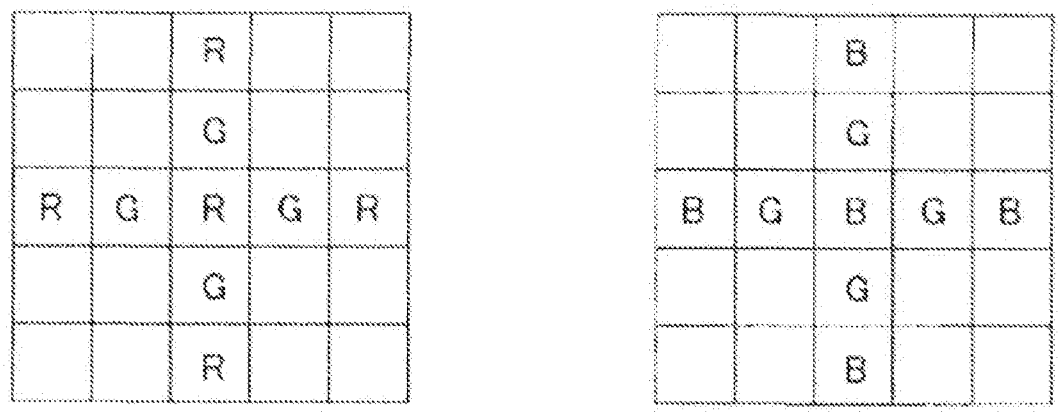
FIG. 17 describes interpolation of the G component.

FIG. 17 describes interpolation of the G component. G color interpolation is calculated for the center R pixel position [i, j] shown on the left of FIG. 17, with reference to the pixels in the drawing. The pixel positions in the case of G color interpolation for the positions of the B pixels are shown in the right of FIG. 17.

In this embodiment, the filter processing unit 233 of the image processor 205 carries out edge enhancement processing on the intermediate image data. Using the five plane data Lt'(x, y), Rt'(x, y), $R_N(x, y)$, $G_N(x, y)$, and $B_N(x, y)$, the parallax image data generating unit 234 of the image processor 205 generates the left side view point color image data and right side view point color image data. Specifically, the parallax image data generating unit 234 of the image processor 205 generates left and right color image data by superimposing the parallax components of the temporary parallax images on the images with no parallax. This generating process is referred to as the parallax modulation process.

The left side view point color image data is configured from the three color parallax plane data: the red plane data $R_{Lt}(x, y)$, the green plane data $G_{Lt}(x, y)$, and the blue plane data $B_{Lt}(x, y)$, corresponding to the left side view point. Likewise, the right side view point color image data is configured from the three color parallax plane data: the red plane data $R_{Rt}(x, y)$, green plane data $G_{Rt}(x, y)$, and blue plane data $B_{Rt}(x, y)$, corresponding to the right side view point.

Figure 18:
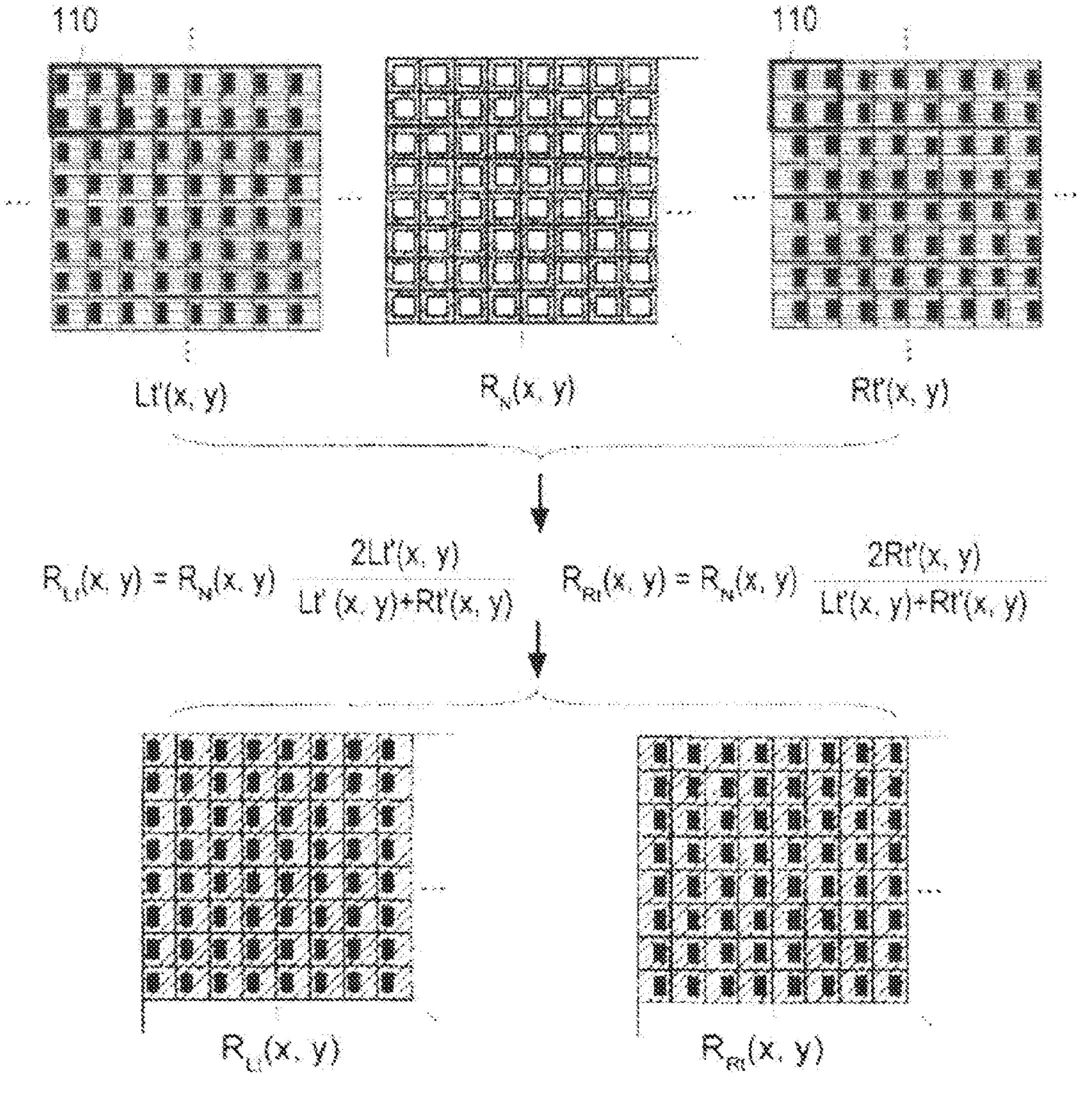
FIG. 18 describes the process of generating color parallax plane data.

FIG. 18 describes the process of generating color parallax plane data. In particular, it shows the process of generating the red parallax plane data $R_{Lt}(x, y)$ and $R_{Rt}(x, y)$ from among the color parallax plane data.

As described above, according to the digital camera 10 of this embodiment, by carrying out edge enhancement on high resolution 2D intermediate images with no parallax, it is possible to carry out the edge enhancement with the high frequency components of the parallax image actually resolved as high frequency resolution, without enhancing the Moire component (aliasing) in the stereoscopic image. In addition, by removing noise from the high resolution 2D intermediate images with no parallax, a noise elimination effect with high edge preserving performance can be obtained. It is possible to reduce the affect of Moire fringes associated with the density of sampling of parallax pixels, so it is possible to avoid the defect that a significant inconsistency such as a mismatch between the same subject image appears between a plurality of parallax images.

<Embodiment 2 >

Bayer Type Sparse RGB Parallax Pixel Array, Edge Enhancement

Figure 9:
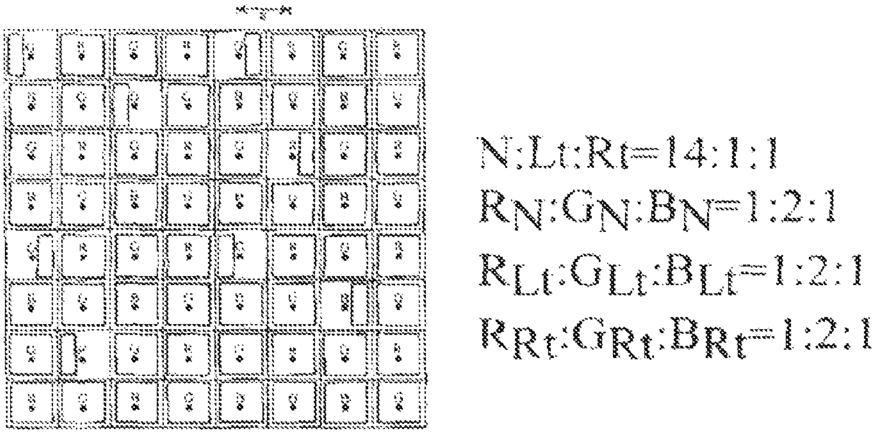
FIG. 9 shows a pixel array and the resolution capability of the array in frequency space.
Figure 9:
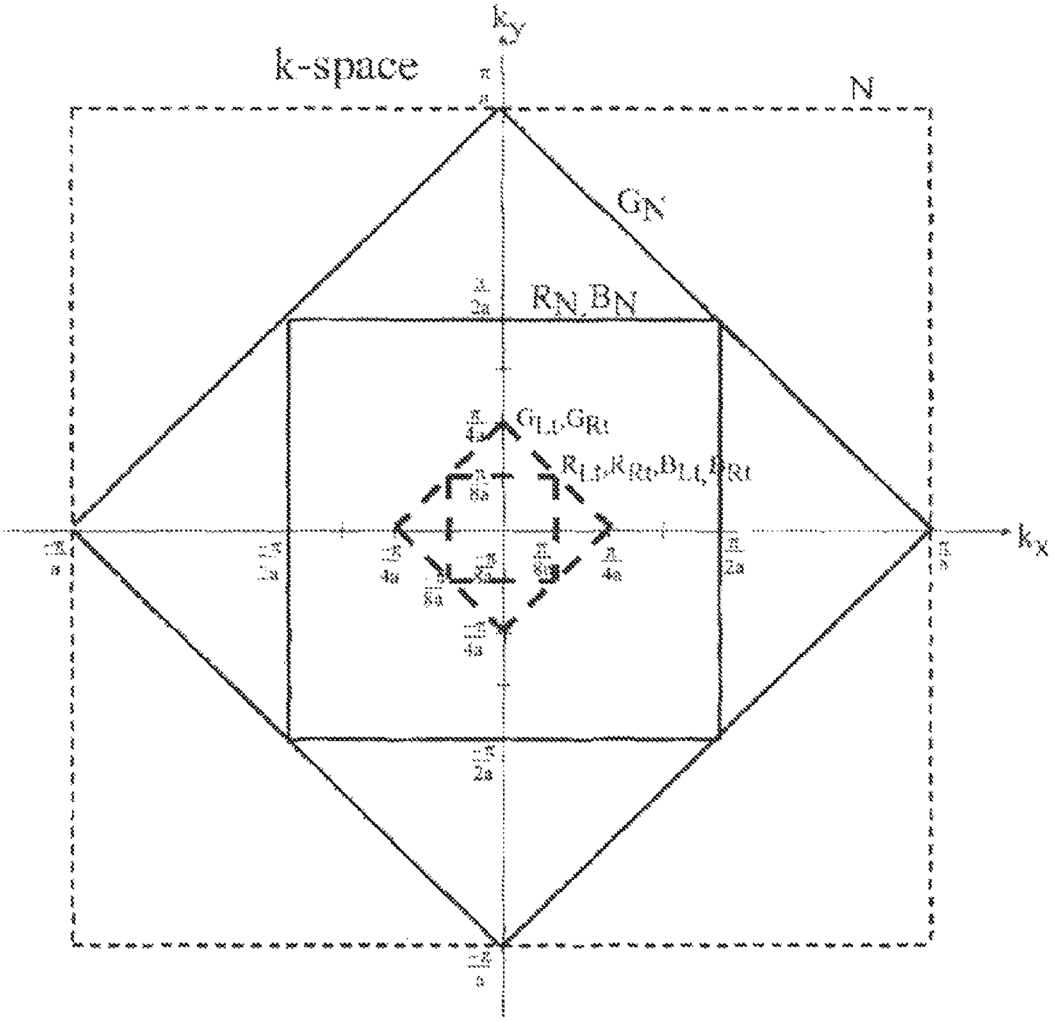

The top level of FIG. 9 shows an example using periodically arranged image sensors, as a primitive lattice. The frequency resolution region of the reciprocal lattice space also shows the combinations of each color and each parallax. This array is an image sensor having a structure with the properties that parallax is only produced in the blurred subject region of a single pupil divided system, the density of the parallax pixels is in a sparse arrangement, and the remaining pixels are allocated to non-parallax pixels as much as possible. Both the non-parallax pixels and the pixels with parallax have a Bayer array as the basic structure in which color filters are arranged for both the left parallax pixels and the right parallax pixels in the proportion R:G:B=1:2:1. In other words, the emphasis is more on the resolution capability of the intermediate images with no parallax that capture the original signal than in Embodiment 1, and it is possible to obtain a high resolution stereoscopic image by superimposing the high frequency component on the left parallax image and the right parallax image by parallax modulation. Therefore, this is a color and parallax array having the capability to provide high resolution 2D images and 3D images also in the unfocused region.

The image processing procedures are the same as Embodiment 1. The following is a description of the procedure.

1) Input Color and Parallax Multiplexed Mosaic Image Data

The single plate type mosaic image with color and parallax multiplexed of FIG. 9: M(x, y)

The gradation is a linear gradation output by A/D conversion.

2) Correct the Global Gain Balance of the Color Parallax Mosaic Image

Using the captured subject image as it is, the average value $\overline{N}$ of the pixel values of the non-parallax pixels of the whole image, the average value $\overline{Lt}$ of the pixel values of the left parallax pixels for the whole image, and the average value $\overline{Rt}$ of the pixel values of the right parallax pixels for the whole image are calculated. Unlike Embodiment 1, there are three signal levels. First, gain correction is carried out to adjust the signal level to the average value as the reference point between left and right. At this stage, two methods can be considered for obtaining the reference point: the arithmetic average and the geometric average. Then, the geometric average of the left and right averaged signal levels and the signal levels of the non-parallax pixels is taken, and gain correction is carried out on the average level to adjust the signal levels. This procedure is carried out for each of the RGB color components. The respective corresponding average values are rewritten as $\overline{R}_N, \overline{R}_{Lt}, \overline{R}_{Rt}$, $\overline{G}_N, \overline{G}_{Lt}, \overline{G}_{Rt}$, $\overline{B}_N, \overline{B}_{Lt}, \overline{B}_{Rt}$, For convenience, in the mosaic image M (x, y), the signal plane of the R component non-parallax pixels is represented as $R_{N\_mosaic}$(x, y), the signal plane of the R component left parallax pixels is represented as $R_{Lt\_mosaic}$(x, y), the signal plane of the R component right parallax pixels is represented as $R_{Rr\_mosaic}$(x, y), the signal plane of the G component non-parallax pixels is represented as $G_{N\_mosaic}$(x, y), the signal plane of the G component left parallax pixels is represented as $G_{Lt\_mosaic}$(x, y), the signal plane of the G component of the right parallax pixels is represented as $G_{Rt\_mosaic}$(x, y), the signal plane of the B component non-parallax pixels is represented as $B_{N\_mosaic}$(x, y), the signal plane of the B component left parallax pixels is represented as $B_{Lt\_mosaic}$(x, y), and the signal plane of the B component right parallax pixels is represented as $B_{Rt\_mosaic}$(x, y).

a) Arithmetic Average Between Left and Right

Average value $$\overline{m}_R = \sqrt{\overline{R}_N \cdot \frac{\overline{R}_{Lt} + \overline{R}_{Rt}}{2}}$$

$$\overline{m}_G = \sqrt{\overline{G}_N \cdot \frac{\overline{G}_{Lt} + \overline{G}_{Rt}}{2}}$$

$$\overline{m}_B = \sqrt{\overline{B}_N \cdot \frac{\overline{B}_{Lt} + \overline{B}_{Rt}}{2}}$$

Gain Value for Non-Parallax Pixels $$\overline{g}_{R_N} = \frac{\overline{m}_R}{\overline{R}_N} = \sqrt{\frac{\overline{R}_{Lt} + \overline{R}_{Rt}}{2\overline{R}_N}}$$

$$\overline{g}_{G_N} = \frac{\overline{m}_G}{\overline{G}_N} = \sqrt{\frac{\overline{G}_{Lt} + \overline{G}_{Rt}}{2\overline{G}_N}}$$

$$\overline{g}_{B_N} = \frac{\overline{m}_B}{\overline{B}_N} = \sqrt{\frac{\overline{B}_{Lt} + \overline{B}_{Rt}}{2\overline{B}_N}}$$

Gain Value for Left Parallax Pixel $$\overline{g}_{R_{Lt}} = \frac{\overline{m}_R}{\overline{R}_{Lt}} = \sqrt{\frac{\overline{R}_N}{\overline{R}_{Lt}} \cdot \frac{\overline{R}_{Lt} + \overline{R}_{Rt}}{2\overline{R}_{Lt}}}$$

$$\overline{g}_{G_{Lt}} = \frac{\overline{m}_G}{\overline{G}_{Lt}} = \sqrt{\frac{\overline{G}_N}{\overline{G}_{Lt}} \cdot \frac{\overline{G}_{Lt} + \overline{G}_{Rt}}{2\overline{G}_{Lt}}}$$

$$\overline{g}_{B_{Lt}} = \frac{\overline{m}_B}{\overline{B}_{Lt}} = \sqrt{\frac{\overline{B}_N}{\overline{B}_{Lt}} \cdot \frac{\overline{B}_{Lt} + \overline{B}_{Rt}}{2\overline{B}_{Lt}}}$$

Gain Value for Right Parallax Pixel $$\overline{g}_{R_{Rt}} = \frac{\overline{m}_R}{\overline{R}_{Rt}} = \sqrt{\frac{\overline{R}_N}{\overline{R}_{Rt}} \cdot \frac{\overline{R}_{Lt} + \overline{R}_{Rt}}{2\overline{R}_{Rt}}}$$

$$\overline{g}_{G_{Rt}} = \frac{\overline{m}_G}{\overline{G}_{Rt}} = \sqrt{\frac{\overline{G}_N}{\overline{G}_{Rt}} \cdot \frac{\overline{G}_{Lt} + \overline{G}_{Rt}}{2\overline{G}_{Rt}}}$$

$$\overline{g}_{B_{Rt}} = \frac{\overline{m}_B}{\overline{B}_{Rt}} = \sqrt{\frac{\overline{B}_N}{\overline{B}_{Rt}} \cdot \frac{\overline{B}_{Lt} + \overline{B}_{Rt}}{2\overline{B}_{Rt}}}$$

Global Gain Correction for Non-Parallax Pixels $$R'_{N\_mosaic}(x, y) = R_{N\_mosaic}(x, y) \cdot \overline{g}_{R_N} = R_{N\_mosaic}(x, y) \cdot \sqrt{\frac{\overline{R}_{Lt} + \overline{R}_{Rt}}{2\overline{R}_N}}$$

$$G'_{N\_mosaic}(x, y) = G_{N\_mosaic}(x, y) \cdot \overline{g}_{G_N} = G_{N\_mosaic}(x, y) \cdot \sqrt{\frac{\overline{G}_{Lt} + \overline{G}_{Rt}}{2\overline{G}_N}}$$

$$B'_{N\_mosaic}(x, y) = B_{N\_mosaic}(x, y) \cdot \overline{g}_{B_N} = B_{N\_mosaic}(x, y) \cdot \sqrt{\frac{\overline{B}_{Lt} + \overline{B}_{Rt}}{2\overline{B}_N}}$$

Global Gain Correction for Left Parallax Pixel $$R'_{Lt\_mosaic}(x, y) = R_{Lt\_mosaic}(x, y) \cdot \overline{g}_{R_{Lt}} = R_{Lt\_mosaic}(x, y) \cdot \sqrt{\frac{\overline{R}_N}{\overline{R}_{Lt}} \cdot \frac{\overline{R}_{Lt} + \overline{R}_{Rt}}{2\overline{R}_{Lt}}}$$

$$G'_{Lt\_mosaic}(x, y) = G_{Lt\_mosaic}(x, y) \cdot \overline{g}_{G_{Lt}} = G_{Lt\_mosaic}(x, y) \cdot \sqrt{\frac{\overline{G}_N}{\overline{G}_{Lt}} \cdot \frac{\overline{G}_{Lt} + \overline{G}_{Rt}}{2\overline{G}_{Lt}}}$$

$$B'_{Lt\_mosaic}(x, y) = B_{Lt\_mosaic}(x, y) \cdot \overline{g}_{B_{Lt}} = B_{Lt\_mosaic}(x, y) \cdot \sqrt{\frac{\overline{B}_N}{\overline{B}_{Lt}} \cdot \frac{\overline{B}_{Lt} + \overline{B}_{Rt}}{2\overline{B}_{Lt}}}$$

Global Gain Correction for Right Parallax Pixel $$R'_{Rt\_mosaic}(x, y) = R_{Rt\_mosaic}(x, y) \cdot \overline{g}_{R_{Rt}} = R_{Rt\_mosaic}(x, y) \cdot \sqrt{\frac{\overline{R}_N}{\overline{R}_{Rt}} \cdot \frac{\overline{R}_{Lt} + \overline{R}_{Rt}}{2\overline{R}_{Rt}}}$$

$$G'_{Rt\_mosaic}(x, y) = G_{Rt\_mosaic}(x, y) \cdot \overline{g}_{G_{Rt}} = G_{Rt\_mosaic}(x, y) \cdot \sqrt{\frac{\overline{G}_N}{\overline{G}_{Rt}} \cdot \frac{\overline{G}_{Lt} + \overline{G}_{Rt}}{2\overline{G}_{Rt}}}$$

$$B'_{Rt\_mosaic}(x, y) = B_{Rt\_mosaic}(x, y) \cdot \overline{g}_{B_{Rt}} = B_{Rt\_mosaic}(x, y) \cdot \sqrt{\frac{\overline{B}_N}{\overline{B}_{Rt}} \cdot \frac{\overline{B}_{Lt} + \overline{B}_{Rt}}{2\overline{B}_{Rt}}}$$

b) Geometric Average Between Left and Right Average Value $$\bar{m}_R=\sqrt{\bar{R}_N\cdot\sqrt{\bar{R}_{Lt}\cdot\bar{R}_{Rt}}}$$

$$\bar{m}_G=\sqrt{\bar{G}_N\cdot\sqrt{\bar{G}_{Lt}\cdot\bar{G}_{Rt}}}$$

$$\bar{m}_B=\sqrt{\bar{B}_N\cdot\sqrt{\bar{B}_{Lt}\cdot\bar{B}_{Rt}}}$$

Gain Value for Non-Parallax Pixels $$\bar{g}_{R_N}=\frac{\bar{m}_R}{\bar{R}_N}=\sqrt{\frac{\sqrt{\bar{R}_{Lt}\cdot\bar{R}_{Rt}}}{\bar{R}_N}}$$

$$\bar{g}_{G_N}=\frac{\bar{m}_G}{\bar{G}_N}=\sqrt{\frac{\sqrt{\bar{G}_{Lt}\cdot\bar{G}_{Rt}}}{\bar{G}_N}}$$

$$\bar{g}_{B_N}=\frac{\bar{m}_B}{\bar{B}_N}=\sqrt{\frac{\sqrt{\bar{B}_{Lt}\cdot\bar{B}_{Rt}}}{\bar{B}_N}}$$

Gain Value for Left Parallax Pixel $$\bar{g}_{R_{Lt}}=\frac{\bar{m}_R}{\bar{R}_{Lt}}=\sqrt{\frac{\bar{R}_N}{\bar{R}_{Lt}}\cdot\sqrt{\frac{\bar{R}_{Rt}}{\bar{R}_{Lt}}}}$$

$$\bar{g}_{G_{Lt}}=\frac{\bar{m}_G}{\bar{G}_{Lt}}=\sqrt{\frac{\bar{G}_N}{\bar{G}_{Lt}}\cdot\sqrt{\frac{\bar{G}_{Rt}}{\bar{G}_{Lt}}}}$$

$$\bar{g}_{B_{Lt}}=\frac{\bar{m}_B}{\bar{B}_{Lt}}=\sqrt{\frac{\bar{B}_N}{\bar{B}_{Lt}}\cdot\sqrt{\frac{\bar{B}_{Rt}}{\bar{B}_{Lt}}}}$$

Gain Value for Right Parallax Pixel $$\bar{g}_{R_{Rt}}=\frac{\bar{m}_R}{\bar{R}_{Rt}}=\sqrt{\frac{\bar{R}_N}{\bar{R}_{Rt}}\cdot\sqrt{\frac{\bar{R}_{Lt}}{\bar{R}_{Rt}}}}$$

$$\bar{g}_{G_{Rt}}=\frac{\bar{m}_G}{\bar{G}_{Rt}}=\sqrt{\frac{\bar{G}_N}{\bar{G}_{Rt}}\cdot\sqrt{\frac{\bar{G}_{Lt}}{\bar{G}_{Rt}}}}$$

$$\bar{g}_{B_{Rt}}=\frac{\bar{m}_B}{\bar{B}_{Rt}}=\sqrt{\frac{\bar{B}_N}{\bar{B}_{Rt}}\cdot\sqrt{\frac{\bar{B}_{Lt}}{\bar{B}_{Rt}}}}$$

Global Gain Correction for Non-Parallax Pixels $$R'_{N\_mosaic}(x,y)=R_{N\_mosaic}(x,y)\cdot\bar{g}_{R_N}=R_{N\_mosaic}(x,y)\cdot\sqrt{\frac{\sqrt{\bar{R}_{Lt}+\bar{R}_{Rt}}}{\bar{R}_N}}$$

$$G'_{N\_mosaic}(x,y)=G_{N\_mosaic}(x,y)\cdot\bar{g}_{G_N}=G_{N\_mosaic}(x,y)\cdot\sqrt{\frac{\sqrt{\bar{G}_{Lt}+\bar{G}_{Rt}}}{\bar{G}_N}}$$

$$B'_{N\_mosaic}(x,y)=B_{N\_mosaic}(x,y)\cdot\bar{g}_{B_N}=B_{N\_mosaic}(x,y)\cdot\sqrt{\frac{\sqrt{\bar{B}_{Lt}+\bar{B}_{Rt}}}{\bar{B}_N}}$$

Global Gain Correction for Left Parallax Pixel $$R'_{Lt\_mosaic}(x,y)=R_{Lt\_mosaic}(x,y)\cdot\bar{g}_{R_{Lt}}=R_{Lt\_mosaic}(x,y)\cdot\sqrt{\frac{\bar{R}_N}{\bar{R}_{Lt}}\cdot\sqrt{\frac{\bar{R}_{Rt}}{\bar{R}_{Lt}}}}$$

$$G'_{Lt\_mosaic}(x,y)=G_{Lt\_mosaic}(x,y)\cdot\bar{g}_{G_{Lt}}=G_{Lt\_mosaic}(x,y)\cdot\sqrt{\frac{\bar{G}_N}{\bar{G}_{Lt}}\cdot\sqrt{\frac{\bar{G}_{Rt}}{\bar{G}_{Lt}}}}$$

$$B'_{Lt\_mosaic}(x,y)=B_{Lt\_mosaic}(x,y)\cdot\bar{g}_{B_{Lt}}=B_{Lt\_mosaic}(x,y)\cdot\sqrt{\frac{\bar{B}_N}{\bar{B}_{Lt}}\cdot\sqrt{\frac{\bar{B}_{Rt}}{\bar{B}_{Lt}}}}$$

Global Gain Correction for Right Parallax Pixel $$R'_{Rt\_mosaic}(x,y)=R_{Rt\_mosaic}(x,y)\cdot\bar{g}_{R_{Rt}}=R_{Rt\_mosaic}(x,y)\cdot\sqrt{\frac{\bar{R}_N}{\bar{R}_{Rt}}\cdot\sqrt{\frac{\bar{R}_{Lt}}{\bar{R}_{Rt}}}}$$

$$G'_{Rt\_mosaic}(x,y)=G_{Rt\_mosaic}(x,y)\cdot\bar{g}_{G_{Rt}}=G_{Rt\_mosaic}(x,y)\cdot\sqrt{\frac{\bar{G}_N}{\bar{G}_{Rt}}\cdot\sqrt{\frac{\bar{G}_{Lt}}{\bar{G}_{Rt}}}}$$

$$B'_{Rt\_mosaic}(x,y)=B_{Rt\_mosaic}(x,y)\cdot\bar{g}_{B_{Rt}}=B_{Rt\_mosaic}(x,y)\cdot\sqrt{\frac{\bar{B}_N}{\bar{B}_{Rt}}\cdot\sqrt{\frac{\bar{B}_{Lt}}{\bar{B}_{Rt}}}}$$

The arithmetic average method is adopted when all the non-parallax pixels have a fully open mask. The geometric average method is adopted when all the non-parallax pixels have a half open mask. Therefore, in this embodiment, the arithmetic average method is adopted. In this way, the mosaic image M'(x, y) that has been corrected with a single gain coefficient for the non-parallax pixels, a single gain coefficient for the left parallax pixels, and a single gain coefficient for the right parallax pixels is output.

3) Generate Temporary Parallax Image

A temporary left parallax image and a temporary right parallax image with low spatial frequency resolution capability are generated. A simple average interpolation within the G color plane in which only the left parallax pixels are gathered is carried out. Using the pixel values of the adjacent pixels, linear interpolation is carried out in accordance with the ratio of distance. Likewise, simple average interpolation within the G color plane in which only the right parallax pixels are gathered is carried out. Likewise, simple average interpolation within the G color plane in which only the non-parallax pixels are gathered is carried out. A similar process is carried out for each of R, G, and B. In other words, from $R_{Lt\_mosaic}(x, y)$, $R_{Lt}(x, y)$ is generated, from $R_{Rt\_mosaic}$ (x, $R_{Rt}(x, y)$ is generated, from $R_{N\_mosaic}(x, y)$, $R_N(x, y)$ is generated, from $G_{Lt\_mosaic}(x, y)$, $G_{Lt}(x, y)$ is generated, from $G_{Rt\_mosaic}(x, y)$, $G_{Rt}(x, y)$ is generated, from $G_{N\_mosaic}(x, y)$, $G_N(x, y)$ is generated, from $B_{Lt\_mosaic}(x, y)$, $B_{Lt}(x, y)$ is generated, from $B_{Rt\_mosaic}(x, y)$, $B_{Rt}(x, y)$ is generated, and from $B_{N\_mosaic}(x, y)$, $B_N(x, y)$ is generated.

Temporary R component image with no parallax: $R_N(x, y)$

Temporary G component image with no parallax: $G_N(x, y)$

Temporary B component image with no parallax: $B_N(x, y)$

Temporary R component left parallax image: $R_{Lt}(x, y)$

Temporary G component left parallax image: $G_{Lt}(x, y)$

Temporary B component left parallax image: $B_{Lt}(x, y)$

Temporary R component right parallax image: $R_{Rt}(x, y)$

Temporary G component right parallax image: $G_{Rt}(x, y)$

Temporary B component right parallax image: $B_{Rt}(x, y)$

Note that when producing the temporary images with no parallax $R_N(x, y)$, $G_N(x, y)$, and $B_N(x, y)$, it may be carried out at high definition introducing directional determination within the signal planes.

4) Generate Color Mosaic Image with No Parallax by Performing Brightness Distribution Correction Between the Left and Right Pixels (Local Gain Balance Correction)

Next, first, the brightness of the left parallax pixels within the screen and the right parallax pixels within the screen are adjusted by carrying out local gain correction in pixel units, by the same concept as the global gain correction carried out in step 1. As a result of this operation, the left and right parallax is eliminated. In addition, the brightness is further adjusted between the signal plane for which the left and right average has been taken and the image-capturing signal plane of the non-parallax pixels. In this way, a new Bayer plane is produced with adjusted gain for all the pixels. This is equivalent to replacing with average values, to create a Bayer plane with the parallax eliminated. This is written as $M_N(x, y)$.

In this case also, there are two methods of setting the target values to be taken as the reference points for each pixel, of eliminating the parallax between left and right: the method of selecting the arithmetic average, and the method of selecting the geometric average. When all the non-parallax pixels have a fully open mask area, it is necessary to select the arithmetic average method with the objective of matching the blurring width of the subject image with the parallax eliminated between left and right and the fully open blurring width. On the other hand, when all the non-parallax pixels have a half open mask area, it is necessary to select the geometric average method with the objective of matching the blurring width of the subject image with the parallax eliminated between left and right and the half open blurring width.

In addition, to produce the average between the signal plane on which the parallax between left and right has been eliminated and the image-capturing signal plane of the non-parallax pixels, it is necessary to keep this blurring width as both subject images have the same blurring width. Therefore, in both these cases, it is necessary to take the geometric average. At this time, the geometric average is taken, taking into consideration the ratio of density of non-parallax pixels and parallax pixels in the image sensor array. In other words, the ratio of the non-parallax pixels (N), the left parallax pixels (Lt), and the right parallax pixels (Rt) used in Embodiment 2 is N:L:R=14:1:1, in other words, N:(L+R)=7:1, so the non-parallax pixels are given a weighting of power of 7/8, and the parallax pixels are given a weighting of power of 1/8, giving an allocation that emphasizes the higher density non-parallax pixels. In other words, the standard image data generating unit 232 applies a weighting in accordance with the numbers of non-parallax pixels, left parallax pixels, and right parallax pixels. The following are the specific equations used.

a) Arithmetic Average Between Left and Right

Average Value of Each Pixel $$m_R(x, y) = [R_N(x, y)]^{\frac{7}{8}} \cdot \left[\frac{R_{Lt}(x, y) + R_{Rt}(x, y)}{2}\right]^{\frac{1}{8}}$$

$$m_G(x, y) = [G_N(x, y)]^{\frac{7}{8}} \cdot \left[\frac{G_{Lt}(x, y) + G_{Rt}(x, y)}{2}\right]^{\frac{1}{8}}$$

$$m_B(x, y) = [B_N(x, y)]^{\frac{7}{8}} \cdot \left[\frac{B_{Lt}(x, y) + B_{Rt}(x, y)}{2}\right]^{\frac{1}{8}}$$

Gain Value for Each Pixel for Non-Parallax Pixels $$g_{R_N}(x, y) = \frac{m_R(x, y)}{R_N(x, y)} = \sqrt[8]{\frac{R_{Lt}(x, y) + R_{Rt}(x, y)}{2R_N(x, y)}}$$

$$g_{G_N}(x, y) = \frac{m_G(x, y)}{G_N(x, y)} = \sqrt[8]{\frac{G_{Lt}(x, y) + G_{Rt}(x, y)}{2G_N(x, y)}}$$

$$g_{B_N}(x, y) = \frac{m_B(x, y)}{B_N(x, y)} = \sqrt[8]{\frac{B_{Lt}(x, y) + B_{Rt}(x, y)}{2B_N(x, y)}}$$

Gain Value of Each Pixel for Left Parallax Pixels $$g_{R_{Lt}}(x, y) = \frac{m_R(x, y)}{R_{Lt}(x, y)} = \left[\frac{R_N(x, y)}{R_{Lt}(x, y)}\right]^{\frac{7}{8}} \cdot \left[\frac{R_{Lt}(x, y) + R_{Rt}(x, y)}{2R_{Lt}(x, y)}\right]^{\frac{1}{8}}$$

$$g_{G_{Lt}}(x, y) = \frac{m_G(x, y)}{G_{Lt}(x, y)} = \left[\frac{G_N(x, y)}{G_{Lt}(x, y)}\right]^{\frac{7}{8}} \cdot \left[\frac{G_{Lt}(x, y) + G_{Rt}(x, y)}{2G_{Lt}(x, y)}\right]^{\frac{1}{8}}$$

$$g_{B_{Lt}}(x, y) = \frac{m_B(x, y)}{B_{Lt}(x, y)} = \left[\frac{B_N(x, y)}{B_{Lt}(x, y)}\right]^{\frac{7}{8}} \cdot \left[\frac{B_{Lt}(x, y) + B_{Rt}(x, y)}{2B_{Lt}(x, y)}\right]^{\frac{1}{8}}$$

Gain Value of Each Pixel for Right Parallax Pixels $$g_{R_{Rt}}(x, y) = \frac{m_R(x, y)}{R_{Rt}(x, y)} = \left[\frac{R_N(x, y)}{R_{Rt}(x, y)}\right]^{\frac{7}{8}} \cdot \left[\frac{R_{Lt}(x, y) + R_{Rt}(x, y)}{2R_{Rt}(x, y)}\right]^{\frac{1}{8}}$$

$$g_{G_{Rt}}(x, y) = \frac{m_G(x, y)}{G_{Rt}(x, y)} = \left[\frac{G_N(x, y)}{G_{Rt}(x, y)}\right]^{\frac{7}{8}} \cdot \left[\frac{G_{Lt}(x, y) + G_{Rt}(x, y)}{2G_{Rt}(x, y)}\right]^{\frac{1}{8}}$$

-continued $$g_{B_{Rt}}(x,y)=\frac{m_B(x,y)}{B_{Rt}(x,y)}=\left[\frac{B_N(x,y)}{B_{Rt}(x,y)}\right]^{\frac{7}{8}}\cdot\left[\frac{B_{Lt}(x,y)+B_{Rt}(x,y)}{2B_{Rt}(x,y)}\right]^{\frac{1}{8}}$$

Local Gain Correction for Each Pixel for Non-Parallax Pixels $$R_N(x,y)\cdot g_{R_N}(x,y)=m_R(x,y)$$

$$G_N(x,y)\cdot g_{G_N}(x,y)=m_G(x,y)$$

$$B_N(x,y)\cdot g_{B_N}(x,y)=m_B(x,y)$$

Local Gain Correction for Each Pixel for Left Parallax Pixels $$R_{Lt}(x,y)\cdot g_{R_{Lt}}(x,y)=m_R(x,y)$$

$$G_{Lt}(x,y)\cdot g_{G_{Lt}}(x,y)=m_G(x,y)$$

$$B_{Lt}(x,y)\cdot g_{B_{Lt}}(x,y)=m_B(x,y)$$

Local Gain Correction for Each Pixel for Right Parallax Pixels $$R_{Rt}(x,y)\cdot g_{R_{Rt}}(x,y)=m_R(x,y)$$

$$G_{Rt}(x,y)\cdot g_{G_{Rt}}(x,y)=m_G(x,y)$$

$$B_{Rt}(x,y)\cdot g_{B_{Rt}}(x,y)=m_B(x,y)$$

b) Geometric Average Between Left and Right Average Value of Each Pixel $$m_R(x,y)=[R_N(x,y)]^{\frac{7}{8}}\cdot\left[\sqrt{R_{Lt}(x,y)\cdot R_{Rt}(x,y)}\right]^{\frac{1}{8}}$$

$$m_G(x,y)=[G_N(x,y)]^{\frac{7}{8}}\cdot\left[\sqrt{G_{Lt}(x,y)\cdot G_{Rt}(x,y)}\right]^{\frac{1}{8}}$$

$$m_B(x,y)=[B_N(x,y)]^{\frac{7}{8}}\cdot\left[\sqrt{B_{Lt}(x,y)\cdot B_{Rt}(x,y)}\right]^{\frac{1}{8}}$$

Gain Value for Each Pixel for Non-Parallax Pixels $$g_{R_N}(x,y)=\frac{m_R(x,y)}{R_N(x,y)}=\sqrt[8]{\frac{\sqrt{R_{Lt}(x,y)\cdot R_{Rt}(x,y)}}{R_N(x,y)}}$$

$$g_{G_N}(x,y)=\frac{m_G(x,y)}{G_N(x,y)}=\sqrt[8]{\frac{\sqrt{G_{Lt}(x,y)\cdot G_{Rt}(x,y)}}{G_N(x,y)}}$$

$$g_{B_N}(x,y)=\frac{m_B(x,y)}{B_N(x,y)}=\sqrt[8]{\frac{\sqrt{B_{Lt}(x,y)\cdot B_{Rt}(x,y)}}{B_N(x,y)}}$$

Gain Value of Each Pixel for Left Parallax Pixels $$g_{R_{Lt}}(x,y)=\frac{m_R(x,y)}{R_{Lt}(x,y)}=\left[\frac{R_N(x,y)}{R_{Lt}(x,y)}\right]^{\frac{7}{8}}\cdot\left[\sqrt{\frac{R_{Rt}(x,y)}{R_{Lt}(x,y)}}\right]^{\frac{1}{8}}$$

$$g_{G_{Lt}}(x,y)=\frac{m_G(x,y)}{G_{Lt}(x,y)}=\left[\frac{G_N(x,y)}{G_{Lt}(x,y)}\right]^{\frac{7}{8}}\cdot\left[\sqrt{\frac{G_{Rt}(x,y)}{G_{Lt}(x,y)}}\right]^{\frac{1}{8}}$$

$$g_{B_{Lt}}(x,y)=\frac{m_B(x,y)}{B_{Lt}(x,y)}=\left[\frac{B_N(x,y)}{B_{Lt}(x,y)}\right]^{\frac{7}{8}}\cdot\left[\sqrt{\frac{B_{Rt}(x,y)}{B_{Lt}(x,y)}}\right]^{\frac{1}{8}}$$

Gain Value of Each Pixel for Right Parallax Pixels $$g_{R_{Rt}}(x,y)=\frac{m_R(x,y)}{R_{Rt}(x,y)}=\left[\frac{R_N(x,y)}{R_{Rt}(x,y)}\right]^{\frac{7}{8}}\cdot\left[\sqrt{\frac{R_{Lt}(x,y)}{R_{Rt}(x,y)}}\right]^{\frac{1}{8}}$$

$$g_{G_{Rt}}(x,y)=\frac{m_G(x,y)}{G_{Rt}(x,y)}=\left[\frac{G_N(x,y)}{G_{Rt}(x,y)}\right]^{\frac{7}{8}}\cdot\left[\sqrt{\frac{G_{Lt}(x,y)}{G_{Rt}(x,y)}}\right]^{\frac{1}{8}}$$

$$g_{B_{Rt}}(x,y)=\frac{m_B(x,y)}{B_{Rt}(x,y)}=\left[\frac{B_N(x,y)}{B_{Rt}(x,y)}\right]^{\frac{7}{8}}\cdot\left[\sqrt{\frac{B_{Lt}(x,y)}{B_{Rt}(x,y)}}\right]^{\frac{1}{8}}$$

Local Gain Correction for Each Pixel for Non-Parallax Pixels $$R_N(x,y)\cdot g_{R_N}(x,y)=m_R(x,y)$$

$$G_N(x,y)\cdot g_{G_N}(x,y)=m_G(x,y)$$

$$B_N(x,y)\cdot g_{B_N}(x,y)=m_B(x,y)$$

Local Gain Correction for Each Pixel for Left Parallax Pixels $$R_{Lt}(x,y)\cdot g_{R_{Lt}}(x,y)=m_R(x,y)$$

$$G_{Lt}(x,y)\cdot g_{G_{Lt}}(x,y)=m_G(x,y)$$

$$B_{Lt}(x,y)\cdot g_{B_{Lt}}(x,y)=m_B(x,y)$$

Local Gain Correction for Each Pixel for Right Parallax Pixels $$R_{Rt}(x,y)\cdot g_{R_{Rt}}(x,y)=m_R(x,y)$$

$$G_{Rt}(x,y)\cdot g_{G_{Rt}}(x,y)=m_G(x,y)$$

$$B_{Rt}(x,y)\cdot g_{B_{Rt}}(x,y)=m_B(x,y)$$

In this way, a Bayer plane image $M_N(x, y)$ having no parallax is output by rewriting the Bayer plane data in such a manner that the average values between the left view point image and the right view point image is calculated and then averaged with the value of the standard view point image with no parallax as new non-parallax pixel values.

5) Generate Standard Image with No Parallax

This is the same as Embodiment 1.

6) Perform Edge Enhancement of the Standard Image with No Parallax

This is the same as Embodiment 1.

7) Generate the Actual Parallax Image

Using the temporary left parallax color images with low resolution capability $R_{Lt}(x, y)$, $G_{Lt}(x, y)$, and $B_{Lt}(x, y)$ generated in step 3, and the color images with high resolution and no parallax $R_N(x, y)$, $G_N(x, y)$, and $B_N(x, y)$ generated in step 5 as an intermediate process, the actually output high resolution left parallax color images $R'_{Lt}(x, y)$, $G'_{Lt}(x, y)$, and $B'_{Lt}(x, y)$ are generated. Likewise, using the low resolution right parallax color images $R_{Rt}(x, y)$, $G_{Rt}(x, y)$, and $B_{Rt}(x, y)$ generated in step 3, and the high resolution color images with no parallax $R_N(x, y)$, $G_N(x, y)$, and $B_N(x, y)$ generated in step 5 as an intermediate process, the actually output high resolution right parallax color images $R'_{Rt}(x, y)$, $G'_{Rt}(x, y)$, and $B'_{Rt}(x, y)$ are generated.

Two methods can be considered for the method of parallax modulation: the method using the arithmetic average as the reference point, and the method using the geometric average as a reference point. Both methods are capable of obtaining the parallax modulation effect, but the method using the arithmetic average as the reference point is adopted when the aperture mask of the non-parallax pixels of the image sensor are fully open, and the method of using the geometric average as the reference point is adopted when the aperture mask of the non-parallax pixels are half open pixels, the same as the pixels with parallax. Therefore, in this embodiment, the method of using the arithmetic average as a reference point is used.

When carrying out parallax demodulation, the geometric average is taken, taking into consideration the RGB density ratio between each of the parallax pixels in the image sensor array. In other words, between the left parallax pixels, R:G:B=1:2:1, and between the right parallax pixels, also R:G:B=1:2:1, so a weighting of power of ¼ is applied to the parallax modulation of the R component, a weighting of power of ½ is applied to the parallax modulation of the G component, and a weighting of power of ¼ is applied to the parallax modulation of the B component, giving an allocation that emphasizes parallax modulation for the G component with the higher density.

a) Parallax Modulation Using the Arithmetic Average as a Reference Point

Left Parallax Modulation $$R'_{Lt}(x,y)=R_N(x,y)\sqrt[4]{\frac{2R_{Lt}(x,y)}{R_{Lt}(x,y)+R_{Rt}(x,y)}}\sqrt{\frac{2G_{Lt}(x,y)}{G_{Lt}(x,y)+G_{Rt}(x,y)}}\sqrt[4]{\frac{2B_{Lt}(x,y)}{B_{Lt}(x,y)+B_{Rt}(x,y)}}$$

$$G'_{Lt}(x,y)=G_N(x,y)\sqrt[4]{\frac{2R_{Lt}(x,y)}{R_{Lt}(x,y)+R_{Rt}(x,y)}}\sqrt{\frac{2G_{Lt}(x,y)}{G_{Lt}(x,y)+G_{Rt}(x,y)}}\sqrt[4]{\frac{2B_{Lt}(x,y)}{B_{Lt}(x,y)+B_{Rt}(x,y)}}$$

$$B'_{Lt}(x,y)=B_N(x,y)\sqrt[4]{\frac{2R_{Lt}(x,y)}{R_{Lt}(x,y)+R_{Rt}(x,y)}}\sqrt{\frac{2G_{Lt}(x,y)}{G_{Lt}(x,y)+G_{Rt}(x,y)}}\sqrt[4]{\frac{2B_{Lt}(x,y)}{B_{Lt}(x,y)+B_{Rt}(x,y)}}$$

Right Parallax Modulation $$R'_{Rt}(x,y)=R_N(x,y)\sqrt[4]{\frac{2R_{Rt}(x,y)}{R_{Lt}(x,y)+R_{Rt}(x,y)}}\sqrt{\frac{2G_{Rt}(x,y)}{G_{Lt}(x,y)+G_{Rt}(x,y)}}\sqrt[4]{\frac{2B_{Rt}(x,y)}{B_{Lt}(x,y)+B_{Rt}(x,y)}}$$

$$G'_{Rt}(x,y)=G_N(x,y)\sqrt[4]{\frac{2R_{Rt}(x,y)}{R_{Lt}(x,y)+R_{Rt}(x,y)}}\sqrt{\frac{2G_{Rt}(x,y)}{G_{Lt}(x,y)+G_{Rt}(x,y)}}\sqrt[4]{\frac{2B_{Rt}(x,y)}{B_{Lt}(x,y)+B_{Rt}(x,y)}}$$

$$B'_{Rt}(x,y)=B_N(x,y)\sqrt[4]{\frac{2R_{Rt}(x,y)}{R_{Lt}(x,y)+R_{Rt}(x,y)}}\sqrt{\frac{2G_{Rt}(x,y)}{G_{Lt}(x,y)+G_{Rt}(x,y)}}\sqrt[4]{\frac{2B_{Rt}(x,y)}{B_{Lt}(x,y)+B_{Rt}(x,y)}}$$

b) Parallax Modulation Using the Geometric Average as a Reference Point

Left Parallax Modulation $$R'_{Lt}(x,y)=R_N(x,y)\sqrt[4]{\frac{R_{Lt}(x,y)}{\sqrt{R_{Lt}(x,y)\cdot R_{Rt}(x,y)}}}\sqrt{\frac{G_{Lt}(x,y)}{\sqrt{G_{Lt}(x,y)\cdot G_{Rt}(x,y)}}}\sqrt[4]{\frac{B_{Lt}(x,y)}{\sqrt{B_{Lt}(x,y)\cdot B_{Rt}(x,y)}}}$$

$$G'_{Lt}(x,y)=G_N(x,y)\sqrt[4]{\frac{R_{Lt}(x,y)}{\sqrt{R_{Lt}(x,y)\cdot R_{Rt}(x,y)}}}\sqrt{\frac{G_{Lt}(x,y)}{\sqrt{G_{Lt}(x,y)\cdot G_{Rt}(x,y)}}}\sqrt[4]{\frac{B_{Lt}(x,y)}{\sqrt{B_{Lt}(x,y)\cdot B_{Rt}(x,y)}}}$$

$$B'_{Lt}(x,y)=B_N(x,y)\sqrt[4]{\frac{R_{Lt}(x,y)}{\sqrt{R_{Lt}(x,y)\cdot R_{Rt}(x,y)}}}\sqrt{\frac{G_{Lt}(x,y)}{\sqrt{G_{Lt}(x,y)\cdot G_{Rt}(x,y)}}}\sqrt[4]{\frac{B_{Lt}(x,y)}{\sqrt{B_{Lt}(x,y)\cdot B_{Rt}(x,y)}}}$$

Right Parallax Modulation $$R'_{Rt}(x,y)=R_N(x,y)\sqrt[4]{\frac{R_{Rt}(x,y)}{\sqrt{R_{Lt}(x,y)\cdot R_{Rt}(x,y)}}}\sqrt{\frac{G_{Rt}(x,y)}{\sqrt{G_{Lt}(x,y)\cdot G_{Rt}(x,y)}}}\sqrt[4]{\frac{B_{Rt}(x,y)}{\sqrt{B_{Lt}(x,y)\cdot B_{Rt}(x,y)}}}$$

$$G'_{Rt}(x,y)=G_N(x,y)\sqrt[4]{\frac{R_{Rt}(x,y)}{\sqrt{R_{Lt}(x,y)\cdot R_{Rt}(x,y)}}}\sqrt{\frac{G_{Rt}(x,y)}{\sqrt{G_{Lt}(x,y)\cdot G_{Rt}(x,y)}}}\sqrt[4]{\frac{B_{Rt}(x,y)}{\sqrt{B_{Lt}(x,y)\cdot B_{Rt}(x,y)}}}$$

-continued $$B'_{Rt}(x,y)=B_N(x,y)\sqrt[4]{\frac{R_{Rt}(x,y)}{\sqrt{R_{Lt}(x,y)\cdot R_{Rt}(x,y)}}}\sqrt{\frac{G_{Rt}(x,y)}{\sqrt{G_{Lt}(x,y)\cdot G_{Rt}(x,y)}}}\sqrt[4]{\frac{B_{Rt}(x,y)}{\sqrt{B_{Lt}(x,y)\cdot B_{Rt}(x,y)}}}$$

Rewriting the Above Equations Gives

Left Parallax Modulation $$R'_{Lt}(x,y)=R_N(x,y)\sqrt[4]{\sqrt{\frac{R_{Lt}(x,y)}{R_{Rt}(x,y)}}}\sqrt{\sqrt{\frac{G_{Lt}(x,y)}{G_{Rt}(x,y)}}}\sqrt[4]{\sqrt{\frac{B_{Lt}(x,y)}{B_{Rt}(x,y)}}}$$

$$G'_{Lt}(x,y)=G_N(x,y)\sqrt[4]{\sqrt{\frac{R_{Lt}(x,y)}{R_{Rt}(x,y)}}}\sqrt{\sqrt{\frac{G_{Lt}(x,y)}{G_{Rt}(x,y)}}}\sqrt[4]{\sqrt{\frac{B_{Lt}(x,y)}{B_{Rt}(x,y)}}}$$

$$B'_{Lt}(x,y)=B_N(x,y)\sqrt[4]{\sqrt{\frac{R_{Lt}(x,y)}{R_{Rt}(x,y)}}}\sqrt{\sqrt{\frac{G_{Lt}(x,y)}{G_{Rt}(x,y)}}}\sqrt[4]{\sqrt{\frac{B_{Lt}(x,y)}{B_{Rt}(x,y)}}}$$

Right Parallax Modulation $$R'_{Rt}(x,y)=R_N(x,y)\sqrt[4]{\sqrt{\frac{R_{Rt}(x,y)}{R_{Lt}(x,y)}}}\sqrt{\sqrt{\frac{G_{Rt}(x,y)}{G_{Lt}(x,y)}}}\sqrt[4]{\sqrt{\frac{B_{Rt}(x,y)}{B_{Lt}(x,y)}}}$$

$$G'_{Rt}(x,y)=G_N(x,y)\sqrt[4]{\sqrt{\frac{R_{Rt}(x,y)}{R_{Lt}(x,y)}}}\sqrt{\sqrt{\frac{G_{Rt}(x,y)}{G_{Lt}(x,y)}}}\sqrt[4]{\sqrt{\frac{B_{Rt}(x,y)}{B_{Lt}(x,y)}}}$$

$$B'_{Rt}(x,y)=B_N(x,y)\sqrt[4]{\sqrt{\frac{R_{Rt}(x,y)}{R_{Lt}(x,y)}}}\sqrt{\sqrt{\frac{G_{Rt}(x,y)}{G_{Lt}(x,y)}}}\sqrt[4]{\sqrt{\frac{B_{Rt}(x,y)}{B_{Lt}(x,y)}}}$$

8) Convert to Output Color Space

This is the same as Embodiment 1.

<Embodiment 3 >

Monochrome Sparse Parallax Pixel Array, Edge Enhancement

Figure 10:
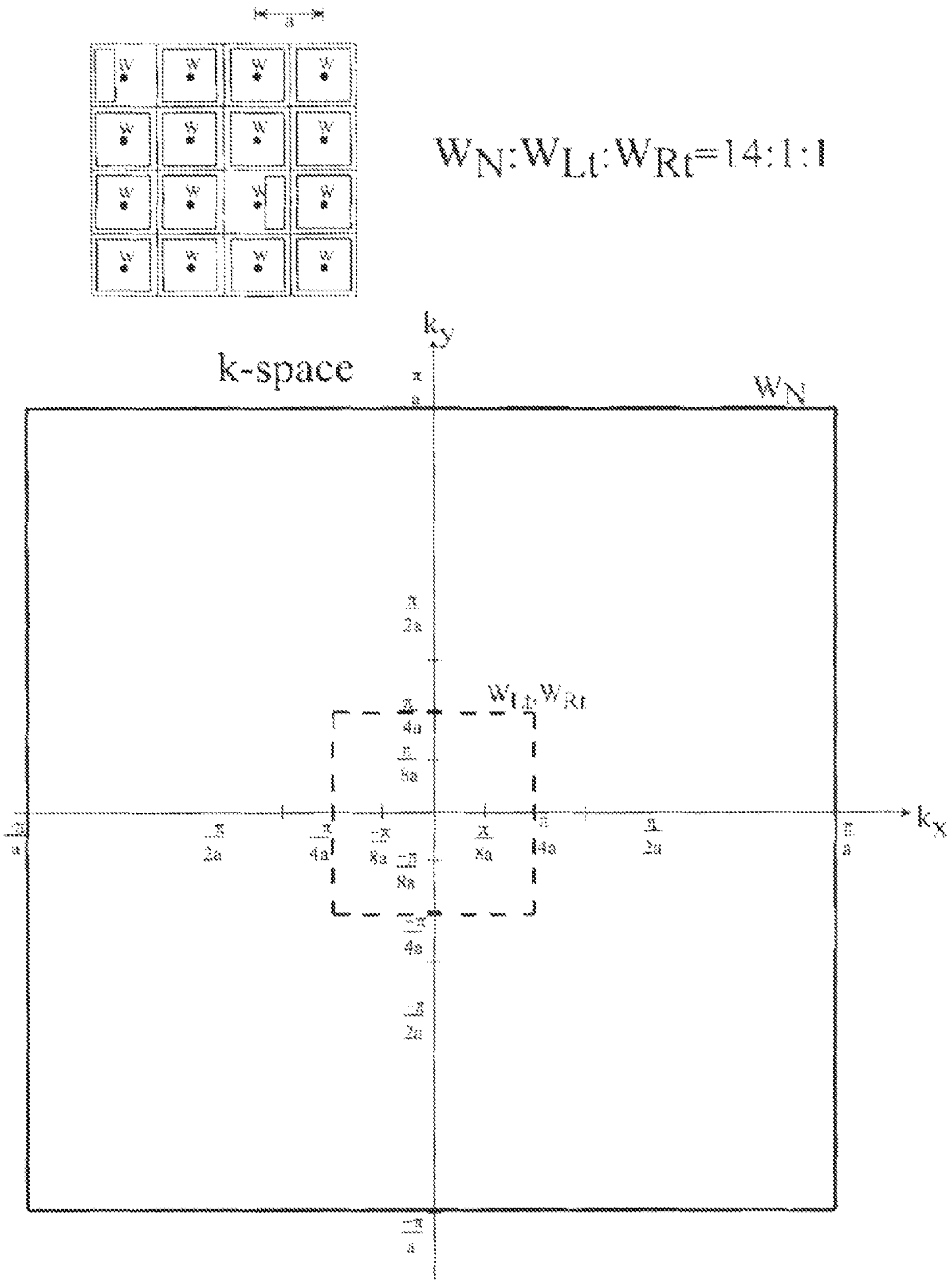
FIG. 10 shows a pixel array and the resolution capability of the array in frequency space.

The array diagram in the top level of FIG. 10 shows an example using periodically arranged image sensors as a primitive lattice. The frequency resolution region of the reciprocal lattice space for the combinations of each parallax is also shown. This array is a monochrome image sensor having a structure in which the density of the parallax pixels is in a sparse arrangement, and the remaining pixels are allocated to non-parallax pixels as much as possible, with the properties that parallax is only produced in the blurred subject region of a single pupil divided system.

The image processing procedure is generally as follows.

1) Input parallax multiplexed mosaic image data

2) Correct the global gain balance of the parallax mosaic image

3) Generate temporary parallax image

4) Generate standard images with no parallax by performing local brightness distribution correction (local gain balance correction)

5) Generate standard image with no parallax

6) Perform edge enhancement of the standard image with no parallax

7) Generate the actual parallax image

8) Convert to output space

1) Input Parallax Multiplexed Mosaic Image Data

The single plate type monochrome mosaic image with parallax multiplexed of FIG. 6A: M(x, y)

The gradation is a linear gradation output by A/D conversion.

2) Correct the Global Gain Balance of the Parallax Mosaic Image

Using the captured subject image as it is, the average value N of the pixel values of the non-parallax pixels of the whole image, the average value Lt of the pixel value of the left parallax pixels for the whole image, and the average value Rt of the pixel value of the right parallax pixels for the whole image are calculated. There are three signal levels, the same as for Embodiment 2. First, gain correction is carried out to adjust the signal level to the average value as the reference point between left and right. At this time, two methods can be considered for obtaining the reference point: the arithmetic average and the geometric average. Then, the arithmetic average of the left and right averaged signal levels and the signal levels of the non-parallax pixels is taken, and gain correction is carried to adjust the signal levels to the average value.

For convenience, in the mosaic image M (x, y), the signal plane of the non-parallax pixels is represented by $N_{mosaic}$ ((x, Y), the signal plane of the left parallax pixels is represented by $L_{tmosaic}$(x, y), the signal plane of the right parallax pixels is represented by $R_{tmosaic}$(x, a) Arithmetic Average Between Left and Right Average Value $$\overline{m}=\sqrt{\overline{N}\cdot\frac{\overline{Lt}+\overline{Rt}}{2}}$$

Gain Value for Non-Parallax Pixels $$\overline{g}_N=\frac{\overline{m}}{\overline{N}}=\sqrt{\frac{\overline{Lt}+\overline{Rt}}{2\overline{N}}}$$

Gain Value for Left Parallax Pixels $$\overline{g}_{Lt}=\frac{\overline{m}}{\overline{Lt}}=\sqrt{\frac{\overline{N}}{\overline{Lt}}\cdot\frac{\overline{Lt}+\overline{Rt}}{2\overline{Lt}}}$$

Gain Value for Right Parallax Pixels $$\overline{g}_{Rt}=\frac{\overline{m}}{\overline{Rt}}=\sqrt{\frac{\overline{N}}{\overline{Rt}}\cdot\frac{\overline{Lt}+\overline{Rt}}{2\overline{Rt}}}$$

Global Gain Correction of Non-Parallax Pixels $$N'_{mosaic}(x, y) = N_{mosaic}(x, y) \cdot \overline{g}_N = N_{mosaic}(x, y) \cdot \sqrt{\frac{\overline{Lt} + \overline{Rt}}{2\overline{N}}}$$

Global Gain Correction for Left Parallax Pixels $$Lt'_{mosaic}(x, y) = Lt_{mosaic}(x, y) \cdot \overline{g}_{Lt} = Lt_{mosaic}(x, y) \cdot \sqrt{\frac{\overline{N}}{\overline{Lt}} \cdot \frac{\overline{Lt} + \overline{Rt}}{2\overline{Lt}}}$$

Global Gain Correction for Right Parallax Pixels $$Rt'_{mosaic}(x, y) = Rt_{mosaic}(x, y) \cdot \overline{g}_{Rt} = Rt_{mosaic}(x, y) \cdot \sqrt{\frac{\overline{N}}{\overline{Rt}} \cdot \frac{\overline{Lt} + \overline{Rt}}{2\overline{Rt}}}$$

b) Geometric Average Between Left and Right Average Value $$\overline{m} = \sqrt{\overline{N} \cdot \sqrt{\overline{Lt} \cdot \overline{Rt}}}$$

Gain Value of Non-Parallax Pixels $$\overline{g}_N = \frac{\overline{m}}{\overline{N}} = \sqrt{\frac{\sqrt{\overline{Lt} \cdot \overline{Rt}}}{\overline{N}}}$$

Gain Value for Left Parallax Pixels $$\overline{g}_{Lt} = \frac{\overline{m}}{\overline{Lt}} = \sqrt{\frac{\overline{N}}{\overline{Lt}} \cdot \sqrt{\frac{\overline{Rt}}{\overline{Lt}}}}$$

Gain Value for Right Parallax Pixels $$\overline{g}_{Rt} = \frac{\overline{m}}{\overline{Rt}} = \sqrt{\frac{\overline{N}}{\overline{Rt}} \cdot \sqrt{\frac{\overline{Lt}}{\overline{Rt}}}}$$

Global Gain Correction of Non-Parallax Pixels $$N'_{mosaic}(x, y) = N_{mosaic}(x, y) \cdot \overline{g}_N = N_{mosaic}(x, y) \cdot \sqrt{\frac{\sqrt{\overline{Lt} \cdot \overline{Rt}}}{\overline{N}}}$$

Global Gain Correction for Left Parallax Pixels $$Lt'_{mosaic}(x, y) = Lt_{mosaic}(x, y) \cdot \overline{g}_{Lt} = Lt_{mosaic}(x, y) \cdot \sqrt{\frac{\overline{N}}{\overline{Lt}} \cdot \sqrt{\frac{\overline{Rt}}{\overline{Lt}}}}$$

Global Gain Correction for Right Parallax Pixels $$Rt'_{mosaic}(x, y) = Rt_{mosaic}(x, y) \cdot \overline{g}_{Rt} = Rt_{mosaic}(x, y) \cdot \sqrt{\frac{\overline{N}}{\overline{Rt}} \cdot \sqrt{\frac{\overline{Lt}}{\overline{Rt}}}}$$

The arithmetic average method is adopted when all the non-parallax pixels have a fully open mask. The geometric average method is adopted when all the non-parallax pixels have a half open mask. Therefore, in this embodiment, the arithmetic average method is adopted. In this way, the mosaic image M'(x, y) in which the non-parallax pixels are corrected with a single gain coefficient, the left parallax pixels are corrected with a single gain coefficient, and the right parallax pixels are corrected with a single gain coefficient is output.

3) Generate Temporary Parallax Image

A temporary left parallax image and a temporary right parallax image with low spatial frequency resolution capability are generated. A simple average interpolation within the signal plane in which only the left parallax pixels are gathered is carried out. Using the pixel values of the adjacent pixels, linear interpolation is carried out in accordance with the ratio of distance. Likewise, simple average interpolation within the signal plane in which only the right parallax pixels are gathered is carried out. Likewise, simple average interpolation within the signal plane in which only the non-parallax pixels are gathered is carried out. In other words, from $Lt_{mosaic}(x, y)$, Lt(x, y) is generated, from $Rt_{mosaic}(x, y)$, Rt(x, y) is generated, and from $N_{mosaic}(x, y)$, N(x, y) is generated.

Temporary image with no parallax: N(x, y)

Temporary left parallax image: Lt(x, y)

Temporary right parallax image: Rt(x, y)

Note that when producing the temporary images with no parallax N(x, y), it may be carried out at high definition introducing directional determination within the signal planes.

4) Generate Standard Images with No Parallax by Performing Brightness Distribution Correction Between the Left and Right Pixels (Local Gain Balance Correction)

Next, first, the brightness of the left parallax pixels within the screen and the right parallax pixels within the screen are adjusted by carrying out local gain correction in pixel units, by the same concept as the global gain correction carried out in step 1. As a result of this operation, the left and right parallax is eliminated. In addition, the brightness is further adjusted between the signal plane for which the left and right average has been taken and the image-capturing signal plane of the non-parallax pixels. In this way, a new standard image plane with no parallax is produced with adjusted gain for all the pixels. This is equivalent to replacing with average values, to create an intermediate image plane with the parallax eliminated. This is written as N(x, At this time, also, the geometric average is taken, taking into consideration the ratio of density of non-parallax pixels and parallax pixels in the image sensor array. In other words, the ratio of the non-parallax pixels (N), the left parallax pixels (Lt), and the rights parallax pixels (Rt) used in Embodiment 3 is N:L:R=14:1:1, in other words, N: (L+R)=7:1, so the parallax pixels are given a weighting of power of 7/8, and the non-parallax pixels are given a weighting of power of 1/8, giving an allocation that emphasizes the higher density non-parallax pixels.

a) Arithmetic Average Between Left and Right

Average Value of Each Pixel $$m(x, y) = [N(x, y)]^{\frac{7}{8}} \cdot \left[\frac{Lt(x, y) + Rt(x, y)}{2}\right]^{\frac{1}{8}}$$

Gain Value of Each Pixel for Non-Parallax Pixels $$g_N(x, y) = \frac{m(x, y)}{N(x, y)} = \sqrt[8]{\frac{Lt(x, y) + Rt(x, y)}{2N(x, y)}}$$

Gain Value of Each Pixel for Left Parallax Pixels $$g_{Lt}(x, y) = \frac{m(x, y)}{Lt(x, y)} = \left[\frac{N(x, y)}{Lt(x, y)}\right]^{\frac{7}{8}} \cdot \left[\frac{Lt(x, y) + Rt(x, y)}{2Lt(x, y)}\right]^{\frac{1}{8}}$$

Gain Value of Each Pixel for Right Parallax Pixels $$g_{Rt}(x, y) = \frac{m(x, y)}{Rt(x, y)} = \left[\frac{N(x, y)}{Rt(x, y)}\right]^{\frac{7}{8}} \cdot \left[\frac{Lt(x, y) + Rt(x, y)}{2Rt(x, y)}\right]^{\frac{1}{8}}$$

Local Gain Correction for Each Pixel for Non-Parallax Pixels $$N(x,y) \cdot g_N(x,y) = m(x,y)$$

Local Gain Correction for Each Pixel for Left Parallax Pixels $$Lt(x,y) \cdot g_{Lt}(x,y) = m(x,y)$$

Local Gain Correction for Each Pixel for Right Parallax Pixels $$Rt(x,y) \cdot g_{Rt}(x,y) = m(x,y)$$

b) Geometric Average Between Left and Right

Average Value of Each Pixel $$m(x, y) = [N(x, y)]^{\frac{7}{8}} \cdot \left[\sqrt{Lt(x, y) \cdot Rt(x, y)}\right]^{\frac{1}{8}}$$

Gain Value of Each Pixel for Non-Parallax Pixels $$g_n(x, y) = \frac{m(x, y)}{N(x, y)} = \sqrt[8]{\frac{\sqrt{Ly(x, y) \cdot Rt(x, y)}}{N(x, y)}}$$

Gain Value of Each Pixel for Left Parallax Pixels $$g_{Lt}(x, y) = \frac{m(x, y)}{Lt(x, y)} = \left[\frac{N(x, y)}{Lt(x, y)}\right]^{\frac{7}{8}} \cdot \left[\sqrt{\frac{Rt(x, y)}{Lt(x, y)}}\right]^{\frac{1}{8}}$$

Gain Value of Each Pixel for Right Parallax Pixels $$g_{Rt}(x, y) = \frac{m(x, y)}{Rt(x, y)} = \left[\frac{N(x, y)}{Rt(x, y)}\right]^{\frac{7}{8}} \cdot \left[\sqrt{\frac{Lt(x, y)}{Rt(x, y)}}\right]^{\frac{1}{8}}$$

Local Gain Correction for Each Pixel for Non-Parallax Pixels $$N(x,y) \cdot g_N(x,y) = m(x,y)$$

Local Gain Correction for Each Pixel for Left Parallax Pixels $$Lt(x,y) \cdot g_{Lt}(x,y) = m(x,y)$$

Local Gain Correction for Each Pixel for Right Parallax Pixels $$Rt(x,y) \cdot g_{Rt}(x,y) = m(x,y)$$

In this way, a monochrome plane image N(x, y) having no parallax is output by rewriting the monochrome plane data in such a manner that the average values between the left view point image and the right view point image is calculated and then averaged with the value of the standard view point image with no parallax as new non-parallax pixel values.

5) Generate Standard Image with No Parallax

This is the same as Embodiment 1.

6) Perform Edge Enhancement of the Standard Image with No Parallax

The calculation may be carried out by just replacing the symbol Y in step 6-2) of Embodiment 1 with the symbol N. Namely, $$N'(x,y) = N(x,y) + k * \Delta N(x,y)$$

Note that in the following the symbol N' is replaced with the symbol N.

7) Generate the Actual Parallax Image

Using the low resolution capability temporary left parallax image Lt(x, y) generated in step 3, and the monochrome image N(x, y) with no parallax and high resolution capability generated as an intermediate process in step 5, the actually output high resolution capability monochrome image Lt'(x, y) is generated. Likewise, using the temporary right parallax image Rt(x, y) with low resolution capability generated in step 3, and the monochrome image N(x, y) with no parallax and high resolution capability generated as an intermediate process in step 5, the actually output right parallax color image with high resolution capability Rt'(x, y) is generated.

Two methods can be considered for the method of parallax modulation: the method using the arithmetic average as the reference point, and the method using the geometric average as the reference point. Both methods are capable of obtaining the parallax modulation effect, but the method using the arithmetic mean as the reference point is adopted when the aperture mask of the non-parallax pixels of the image sensor are fully open, and the method of using the geometric average as the reference point is adopted when the aperture mask of the non-parallax pixels are half open, the same as the pixels with parallax. Therefore, in this embodiment, the method of using the arithmetic average as a reference point is used.

a) Parallax Modulation Using the Arithmetic Average as a Reference Point

Left Parallax Modulation $$Lt'(x, y) = N(x, y) \frac{2Lt(x, y)}{Lt(x, y) + Rt(x, y)}$$

Right Parallax Modulation $$Rt'(x, y) = N(x, y) \frac{2Rt(x, y)}{Lt(x, y) + Rt(x, y)}$$

b) Parallax Modulation Using the Geometric Average as a Reference Point

Left Parallax Modulation $$Lt'(x, y) = N(x, y) \frac{Lt(x, y)}{\sqrt{Lt(x, y) \cdot Rt(x, y)}} = N(x, y) \sqrt{\frac{Lt(x, y)}{Rt(x, y)}}$$

Right Parallax Modulation $$Rt'(x, y) = N(x, y) \frac{Rt(x, y)}{\sqrt{Lt(x, y) \cdot Rt(x, y)}} = N(x, y) \sqrt{\frac{Rt(x, y)}{Lt(x, y)}}$$

7) Convert to Output Color Space

An appropriate gamma conversion is carried out on each of the high resolution intermediate monochrome image with no parallax N(x, y), the high resolution left parallax monochrome image Lt'(x, y), and the high resolution right parallax monochrome image Rt'(x, y) obtained in this way to output them as images in output space. For each of these 2D, 3D images, images generated with high definition edge enhancement.

<Embodiment 4>

Bayer Type RGB Sparse Parallax Pixel Array, Noise Elimination

The image processing procedure is generally as follows.
1) Input color and parallax multiplexed mosaic image data
2) Correct the global gain balance for the color parallax mosaic image
3) Generate temporary parallax image
4) Generate color mosaic image with no parallax by performing local brightness distribution correction between the left and right pixels (local gain balance correction)
5) Generate standard image with no parallax
6) Perform noise elimination process for the standard image with no parallax
7) Generate the actual parallax image
8) Convert to output color space Here, steps 1) to 5) and steps 7) to 8) are the same as Embodiment 2, so their description is omitted. Here, the process of elimination of noise from the standard image with no parallax is described.

6) Perform Noise Elimination Process for the Standard Image with No Parallax 6-1) Color Space Conversion Process This is the same as Embodiment 1.

6-1) Noise Elimination Process

The noise elimination process is carried out on the brightness Y plane. A commonly known high performance noise elimination process may be used, such as Japanese Unexamined Patent Application Publication No. 2006-309749A of the same inventor as the present application described above. Here, the two parameter product bilateral filter disclosed in WO2006/068025 of the same inventor as the present applicant is described.

$$Y'(x, y) = \frac{\iint_{(x'-x)^2+(y'-y)^2 \leq 2r_{th}^2} Y(x, y) exp\left(-\frac{|V(x', y') - V(x, y)|^2}{\sigma_{th}^2} \cdot \frac{(x'-x)^2+(y'-y)^2}{r_{th}^2}\right) dx' dy'}{\iint_{(x'-x)^2+(y'-y)^2 \leq 2r_{th}^2} exp\left(-\frac{|V(x', y') - V(x, y)|^2}{\sigma_{th}^2} \cdot \frac{(x'-x)^2+(y'-y)^2}{r_{th}^2}\right) dx' dy'}$$

$$Cb'(x, y) = \frac{\iint_{(x'-x)^2+(y'-y)^2 \leq 2r_{th}^2} Cb(x, y) exp\left(-\frac{|V(x', y') - V(x, y)|^2}{\sigma_{th}^2} \cdot \frac{(x'-x)^2+(y'-y)^2}{r_{th}^2}\right) dx' dy'}{\iint_{(x'-x)^2+(y'-y)^2 \leq 2r_{th}^2} exp\left(-\frac{|V(x', y') - V(x, y)|^2}{\sigma_{th}^2} \cdot \frac{(x'-x)^2+(y'-y)^2}{r_{th}^2}\right) dx' dy'}$$

$$Cr'(x, y) = \frac{\iint_{(x'-x)^2+(y'-y)^2 \leq 2r_{th}^2} Cr(x, y) exp\left(-\frac{|V(x', y') - V(x, y)|^2}{\sigma_{th}^2} \cdot \frac{(x'-x)^2+(y'-y)^2}{r_{th}^2}\right) dx' dy'}{\iint_{(x'-x)^2+(y'-y)^2 \leq 2r_{th}^2} exp\left(-\frac{|V(x', y') - V(x, y)|^2}{\sigma_{th}^2} \cdot \frac{(x'-x)^2+(y'-y)^2}{r_{th}^2}\right) dx' dy'}$$

Where, $\sigma_{th}$ is the fluctuation width of the noise. $r_{th}$ is the filter radius, which can be set to an arbitrary size in accordance with the spread width of the noise. The filter processing unit 233 does not have to carry out the filtering process on the left parallax image data and the right parallax image data to remove noise.

6-3) Inverse Color Space Conversion Process

Using the noise eliminated brightness component Y'(x, y) and the color difference components Cb'(x, y), and Cr'(x, y), the RGB space is restored from the YCbCr space 6-4) Transformation to the Original Linear Gradation Space by Inverse Gradation Conversion This is the same as Embodiment 1.

<Note>

If the edge enhancement of Embodiment 2 and the noise elimination of Embodiment 4 are carried out in combination, then the edge enhancement process of step 6 of Embodiment 2 may be carried out after first carrying out the noise elimination process of step 6 of Embodiment 4. Also, if the noise elimination process is carried out on the sparse monochrome parallax pixel array of Embodiment 3, the same procedure as carried out for the brightness component in the noise elimination process described in Embodiment 4 may be carried out on the monochrome plane.

In the descriptions provided above, red, green, and blue were used as the primary colors constituting the colors of the subject image. However, four or more primary colors may be used by adding emerald green or the like. Also, instead of red, green, and blue, a combination of the three complementary primary colors, yellow, magenta, and cyan, can be adopted.

The functions of the interpolation processing unit 231, the standard image data generating unit 232, the filter processing unit 233, and the parallax image data generating unit 234 described above can be realized by executing an image processing program that includes an interpolation processing step, a standard image data acquiring step, a filter processing step, and a parallax image data generating step, on the computer. The interpolation processing step generates left view point temporary left parallax image data and right view point temporary right parallax image data based on the output of the image sensor 100. The standard image data acquiring step generates standard image data with a higher resolution than the temporary left parallax image data and the temporary right parallax image data, using the pixel values of the temporary left parallax image data and the temporary right parallax image data. The filter processing step carries out a filtering process that is at least one of edge adjustment and noise elimination with respect to the standard image data. The parallax image data generating step generates left parallax image data and right parallax image data with a higher resolution than the temporary left parallax image data and the temporary right parallax the image data, using the standard image data resulting from the filtering process, and the temporary left parallax image data and the temporary right parallax image data.

A device such as a personal computer or the like may function as the image processing apparatus. The image processing apparatus may receive image data from a camera or other device. In this case, it undertakes the role of parallax image data acquisition unit, not interpolation processing unit. It undertakes the role of standard image data acquisition unit, not standard image data generation unit. Even when the interpolation generating unit generates its own parallax image data, and the standard image data generating unit generates its own standard image data, the parallax image data and the standard image data generated by them can be said to have been acquired. Also, the standard image data generating unit 232 may generate standard image data that are 2D intermediate images, using the pixel values of the temporary standard image data which is lacking some pixels, in addition to the pixel values of the pixel values of the temporary left parallax image data and the temporary right parallax image data.

In the description above, the filter processing unit 233 carried out an edge enhancement process as the edge adjustment process on the standard image data, but for example, if the image is reduced or the like, an edge suppression process may be performed. Note that images in the description above sometimes includes image data, and sometimes refers to the subject image itself that is developed and visualized in accordance with its format.

In the description above, the parallax image data generating unit 234 generated left parallax image data corresponding to the same view point as the temporary left parallax image data. Likewise, the parallax image data generating unit 234 generated right parallax image data corresponding to the same view point as the temporary right parallax image data. In this case, there is no change in the view point of the left and right parallax pixels, so the amount of parallax in the temporary left parallax image data and the temporary right parallax image data, and the amount of parallax in the ultimately produced high resolution left parallax image data and high resolution right parallax image data are the same. However, by parameterization of the amount of modulation when carrying out the parallax modulation, it is possible to control the amount of parallax. When the amount of parallax changes, the view point of the left parallax image data and the view point of the right parallax image data also change. Therefore, the parallax image data generating unit 234 can also generate left parallax image data with a view point that is different from the view point of the temporary left parallax image data. Likewise, it is possible to generate right parallax image data with a view point that is different from the view point of the temporary right parallax image data. The three-dimensional effect can be varied by the parameter C as shown below.

Left Parallax Modulation $$Lt'(x, y) = N'(x, y)\frac{(1-C)Lt(x, y) + C\cdot Rt(x, y)}{\frac{Lt(x, y) + Rt(x, y)}{2}}$$

Right Parallax Modulation $$Rt'(x, y) = N'(x, y)\frac{(1-C)Rt(x, y) + C\cdot Lt(x, y)}{\frac{Lt(x, y) + Rt(x, y)}{2}}$$

C has a value in the range 0≤C≤0.5, and when C=0, it is the same as shown below.

Left Parallax Modulation $$Lt'(x, y) = N(x, y)\frac{2Lt(x, y)}{Lt(x, y) + Rt(x, y)}$$

Right Parallax Modulation $$Rt'(x, y) = N(x, y)\frac{2Rt(x, y)}{Lt(x, y) + Rt(x, y)}$$

On the other hand, when C=0.5, it is the same as when parallax modulation was not carried out, and the three-dimensional effect is eliminated. When 0<C<0.5, an intermediate three-dimensional effect is produced.

Figure 19:
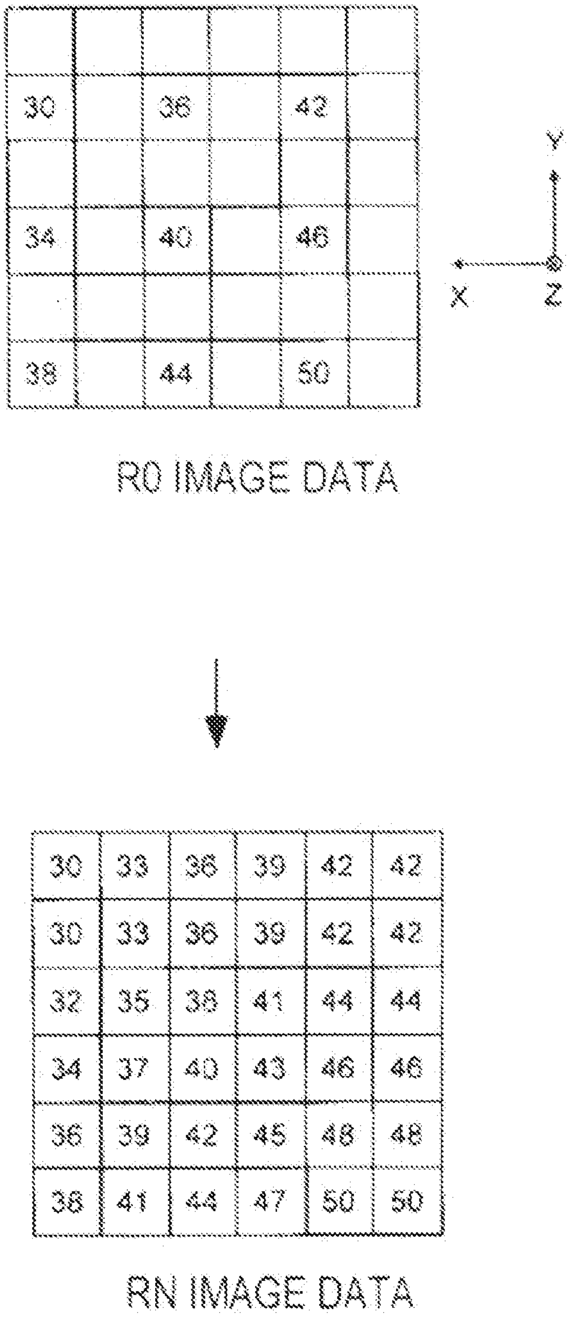
FIG. 19 shows an example of interpolation of the pixel value.

FIG. 19 shows an example of interpolation of the pixel value. The top part of FIG. 19 shows a diagram in which only the pixel values of the R non-parallax pixels in the pixel array shown in FIG. 7 are extracted. As shown in the bottom part of FIG. 19, the pixel values of the pixels having no pixel value are interpolated using the pixel values of the pixels having pixel values in the R0 image data. In other words, the parallax image data generating unit 234 generates 2D intermediate image data by interpolating the missing pixel values using the pixel values of non-parallax pixels. For example, the pixel values of the pixels that are closest vertically, horizontally, or vertically and horizontally having pixel values are averaged to obtain the interpolation pixel value.

This completes the description of the embodiments of the present invention, but the technical scope of the present invention is not limited to the scope of the embodiments as described above. It will be clear to a person with ordinary skill in the art to which the present invention pertains that in the embodiments as described above, various types of modifications or improvements can be added. It is clear from the scope of the claims that these forms in which various modifications or improvements have been added are also included within the technical scope of the present invention. For example, if the image sensor as described above is rotated by 90°, a modified example with vertical parallax will be obtained, and if rotated by 45°, a modified example with inclined parallax will be obtained. Also, left to right parallax can be set in the case that the pixel array is a honeycomb array, not a rectangular lattice.

Note that the sequence of execution of the process of each action, procedure, step, stage, and the like of the apparatus, systems, programs, and methods indicated in the scope of the patent claims, the specification, and the drawings can be executed in any order unless particularly indicated by "prior to", "preceding", or the like, or when the output of the previous process is used in a subsequent process. In the description of the operation flows in the scope of the patent claims, the specification, and the drawings, for convenience, terms such as "first", "next", and the like have been used, but this does not mean that execution in that sequence is essential.

The invention claimed is:

1. An image processing method comprising:

receiving a first image in which a subject image has been taken into mutually different pixels simultaneously through a single optical system in a standard direction view point, a left direction view point, and a right direction view point by using an image sensor, the image sensor comprising a pixel array including a plurality of pixels having one aperture mask per pixel, the plurality of pixels including non-parallax pixels having an aperture mask producing a view point in a standard direction, left parallax pixels having an aperture mask producing parallax in a left direction with respect to the standard direction, and right parallax pixels having an aperture mask producing parallax in a right direction with respect to the standard direction;

for converting the first image into an image from the left direction view point and an image from the right direction view point, the method comprising the steps of:

generating a temporary left parallax image using, for each pixel, a pixel value of the left parallax pixels of the first image; generating a temporary right parallax image using, for each pixel, a pixel value of the right parallax pixels of the first image;

generating a standard view point image using, for each pixel, a pixel value of at least the non-parallax pixels of the first image; generating an edge enhanced standard view point image, by carrying out an edge enhancement process on the standard view point image; and generating a left direction view point image and a right direction view point image based on the edge enhanced standard view point image, the temporary left parallax image, and the temporary right parallax image for each pixel.

2. An image processing method comprising: receiving a first image, in which a subject image has been taken into mutually different pixels simultaneously through a single optical system in a standard direction view point, a left direction view point, and a right direction view point by using an image sensor, the image sensor comprising a pixel array including a plurality of pixels having one aperture mask per pixel, the plurality of pixels including non-parallax pixels having an aperture mask producing a view point in a standard direction, left parallax pixels having an aperture mask producing parallax in a left direction with respect to the standard direction, and right parallax pixels having an aperture mask producing parallax in a right direction with respect to the standard direction;

for converting the first image into an image from the left direction view point and an image from the right direction view point, the method comprising the steps of:

generating a temporary left parallax image using the pixel value of the left parallax pixels of the first image for each pixel; generating a temporary right parallax image using the pixel value of the right parallax pixels of the first image for each pixel;

generating a standard view point image using the pixel values of the non-parallax pixels of the first image for each pixel;

generating a noise eliminated standard view point image, by carrying out a noise elimination process on the standard view point image; and generating a left direction view point image and a right direction view point image based on the noise eliminated standard view point image, the temporary left parallax image, and the temporary right parallax image for each pixel.

3. The image processing method according to claim 1, wherein the step of generating the standard view point image includes generating pixel values of the standard view point image using the pixel values of the left parallax pixels and the pixel values of the right parallax pixels, as well as the pixel values of the non-parallax pixels of the first image.

4. The image processing method according to claim 1, wherein the first image includes a plurality of color components, the step of generating the standard view point image includes generating standard view point images with respect to the plurality of color components, and the step of generating the edge enhanced standard view point image includes carrying out an edge enhancement process on the brightness components of the standard view point image.

5. The image processing method according to claim 2, wherein the first image includes a plurality of color components, the step of generating the standard view point image includes generating standard view point images with respect to the plurality of color components, and the step of generating the noise eliminated standard view point image includes carrying out a noise elimination process on the brightness components and the color difference components of the standard view point image.

6. The image processing method according to claim 2, wherein, in the pixel array, the density of the non-parallax pixels is greater than the density of the combined left parallax pixels and right parallax pixels.

7. An image processing apparatus, comprising:

an image processor including instructions that, when executed, performs operations including acquiring first parallax image data corresponding to a view point being shifted in a first direction with respect to a standard direction, and second parallax image data corresponding to a view point being shifted in a second direction, the second direction being opposite to the first direction with respect to the standard direction;

acquiring standard image data corresponding to the standard direction and having a higher resolution than a spatial frequency resolution of the first parallax image data and that of the second parallax image data;

carrying out a filtering process on the standard image data, the filtering process being at least one of edge adjustment and noise elimination; and generating third parallax image data corresponding to a view point being shifted in the first direction, and fourth parallax image data corresponding to a view point being shifted in the second direction, using the standard image data resulting from the filtering process, the first parallax image data, and the second parallax image data.

8. The image processing apparatus according to claim 7, wherein the standard image data acquiring includes generating the standard image data by acquiring temporary standard image data, the temporary standard image data missing some of the pixel values, and interpolating the missing pixel values using the pixel values of standard pixels corresponding to the standard direction.

9. The image processing apparatus according to claim 7, wherein the standard image data acquiring includes generating the standard image data by interpolating the missing pixel values using the pixel values of the first parallax image data and the second parallax image data.

10. The image processing apparatus according to claim 9, wherein the standard image data acquiring includes performing a weighting in accordance with the number of standard pixels corresponding to the standard image data, the number of first pixels corresponding to the first parallax image data, and the number of second pixels corresponding to the second parallax image data.

11. The image processing apparatus according to claim 7, wherein the standard image data acquiring includes generating the standard image data for each color component of a color filter associated with the respective pixels.

12. The image processing apparatus according to claim 7, wherein the third parallax image data generating includes generating the third parallax image data with a view point that is different from the view point of the first parallax image data, and the fourth parallax image data with a view point that is different from the view point of the second parallax image data.

13. An image-capturing apparatus, comprising: an image sensor that outputs at least one of the first parallax image data and the second parallax image data; and an image processing apparatus described in claim 7.

14. The image-capturing apparatus according to claim 13, wherein the image sensor also outputs the standard image data.

15. The image-capturing apparatus according to claim 14, wherein of pixels corresponding to the standard image data, pixels corresponding to the first parallax image data, and pixels corresponding to the second parallax image data, the image sensor includes more of the pixels corresponding to the standard image data.

16. The image-capturing apparatus according to claim 15, wherein the filtering process carrying out does not include carrying out a noise elimination filtering process on the first parallax image data and the second parallax image data.

17. A non-transitory computer readable medium having an image processing program stored thereon, the image processing program causing a computer to perform procedures of: a parallax image data acquiring step of acquiring first parallax image data corresponding to a view point being shifted in a first direction with respect to a standard direction, and second parallax image data corresponding to a view point being shifted in a second direction, the second direction being opposite to the first direction with respect to the standard direction; a standard image data acquiring step of acquiring standard image data corresponding to the standard direction and having a higher resolution than the spatial frequency resolution of the first parallax image data and that of the second parallax image data; a filter processing step of carrying out a filtering process on the standard image data, the filtering process being at least one of edge adjustment and noise elimination; and a parallax image data generating step of generating third parallax image data corresponding to a view point being shifted in the first direction, and fourth parallax image data corresponding to a view point being shifted in the second direction, using the standard image data resulting from the filtering process, the first parallax image data, and the second parallax image data.

* * * * *